(12) United States Patent
Umezawa

(10) Patent No.: US 7,423,910 B2
(45) Date of Patent: Sep. 9, 2008

(54) SEMICONDUCTOR DEVICE INCLUDING MOS TRANSISTORS HAVING FLOATING GATE AND CONTROL GATE

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 11/436,701

(22) Filed: May 19, 2006

(65) Prior Publication Data
US 2006/0268653 A1   Nov. 30, 2006

(30) Foreign Application Priority Data
May 24, 2005   (JP)   ............... 2005-151080

(51) Int. Cl.
*G11C 11/34* (2006.01)
(52) U.S. Cl. ............... 365/185.23; 365/230.06
(58) Field of Classification Search ............ 365/185.23, 365/230.06
See application file for complete search history.

(56) References Cited

U.S. PATENT DOCUMENTS

| | | | |
|---|---|---|---|
| 5,392,253 A | 2/1995 | Atsumi et al. | |
| 5,513,146 A | 4/1996 | Atsumi et al. | |
| 5,680,349 A | 10/1997 | Atsumi et al. | |
| 5,812,459 A | 9/1998 | Atsumi et al. | |
| 5,880,995 A * | 3/1999 | Kobatake | 365/185.23 |
| 5,901,083 A | 5/1999 | Atsumi et al. | |
| 6,041,014 A | 3/2000 | Atsumi et al. | |
| 6,088,267 A | 7/2000 | Atsumi et al. | |
| 6,144,582 A | 11/2000 | Atsumi et al. | |
| 6,166,987 A | 12/2000 | Atsumi et al. | |
| 6,252,801 B1 | 6/2001 | Atsumi et al. | |
| 6,385,087 B2 | 5/2002 | Atsumi et al. | |
| 6,466,478 B1 * | 10/2002 | Park | 365/185.11 |
| 6,542,406 B2 * | 4/2003 | Byeon et al. | 365/185.13 |
| 6,560,144 B2 | 5/2003 | Atsumi et al. | |
| 6,972,996 B2 * | 12/2005 | Hosono et al. | 365/185.23 |

FOREIGN PATENT DOCUMENTS

JP   2000-49312   2/2000

OTHER PUBLICATIONS

Wei-Hua Liu, et al., "A 2-Transistor Source-select (2TS) Flash EEPROM for 1.8V-Only Applications", Non-Volatile Semiconductor Memory Workshop 4.1, Feb. 1997, pp. 1-3.

* cited by examiner

*Primary Examiner*—Anh Phung
(74) *Attorney, Agent, or Firm*—Oblon, Spivak, McClelland, Maier & Neustadt, P.C.

(57) ABSTRACT

A semiconductor memory device includes memory cells, a memory cell array, word lines, a row decoder, and first and second MOS transistors. The memory cell has a floating gate and a control gate. The word line connects commonly the control gates. The row decoder decodes a row address signal. The first MOS transistor transfers a first voltage to the word line unselected by the row decoder. The first MOS transistor has a drain connected to the word line and a source to which the first voltage is applied. A back gate bias for the first MOS transistor is controlled independently of a potential at the source of the first MOS transistor. The second MOS transistor transfers a second voltage to the word line selected by the row decoder. The second MOS transistor has a drain connected to the word line and a source to which the second potential is applied.

30 Claims, 46 Drawing Sheets

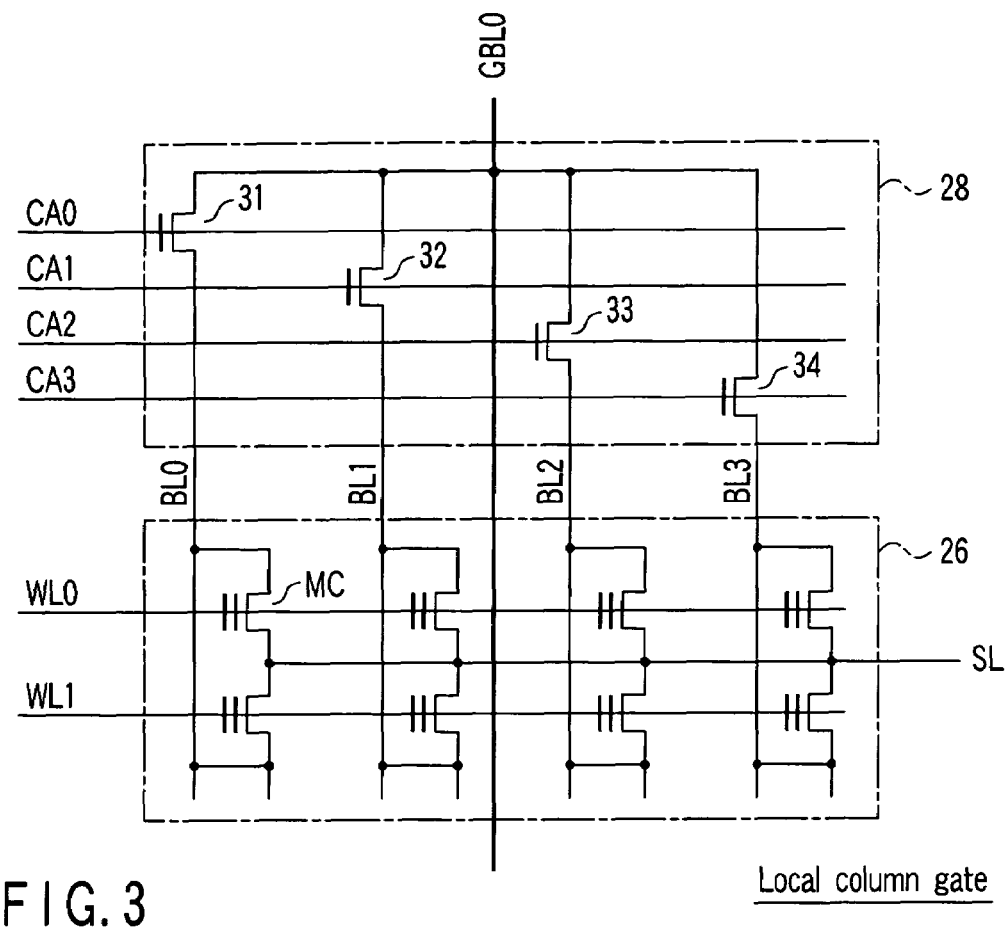
FIG. 3                               Local column gate
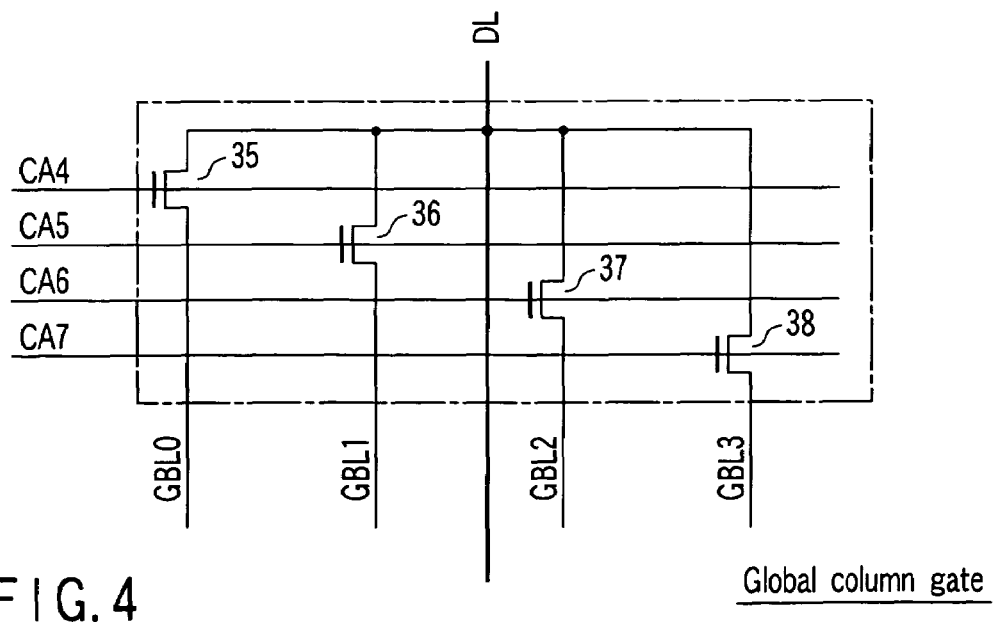
FIG. 4                               Global column gate

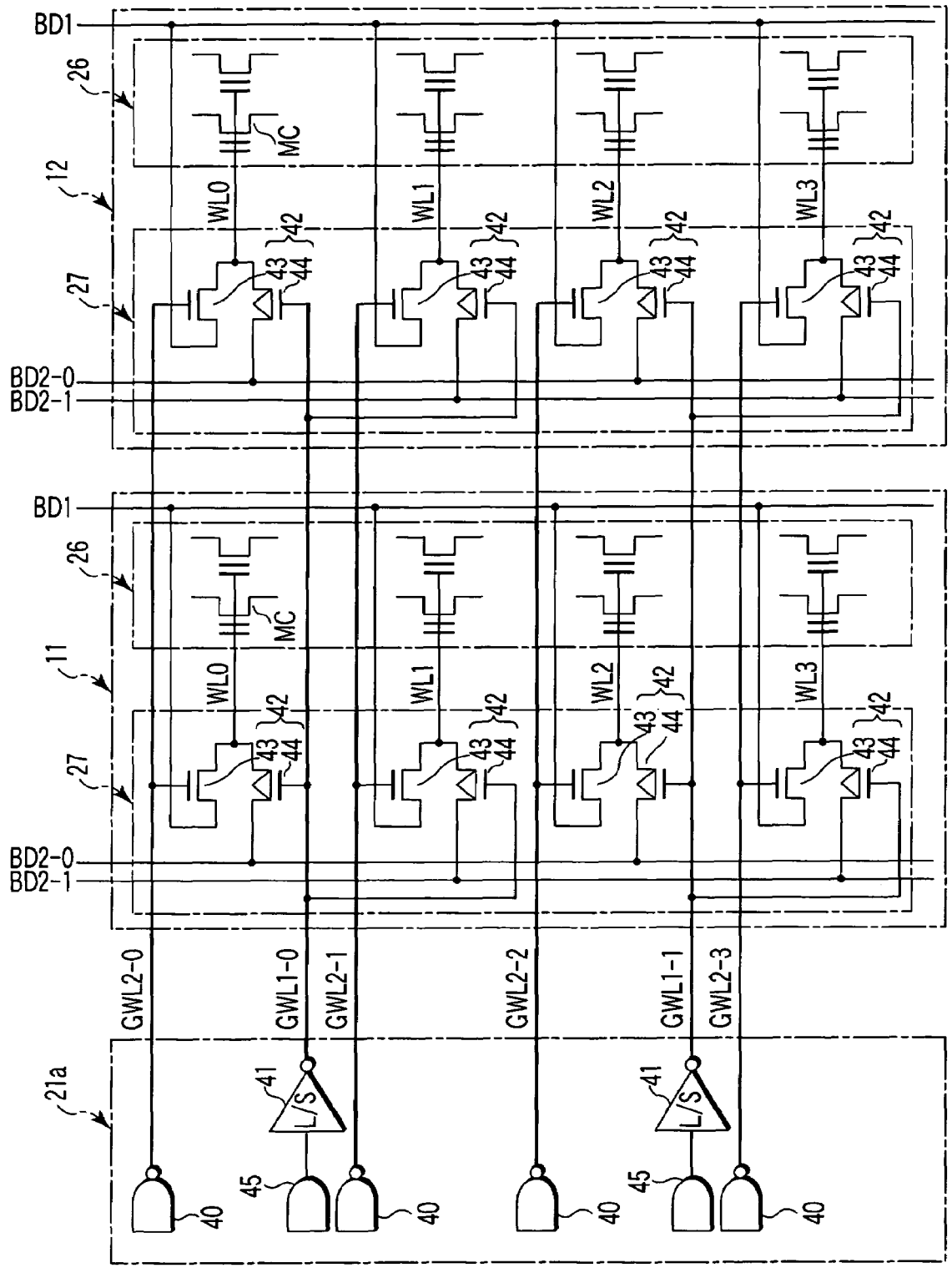
F I G. 5

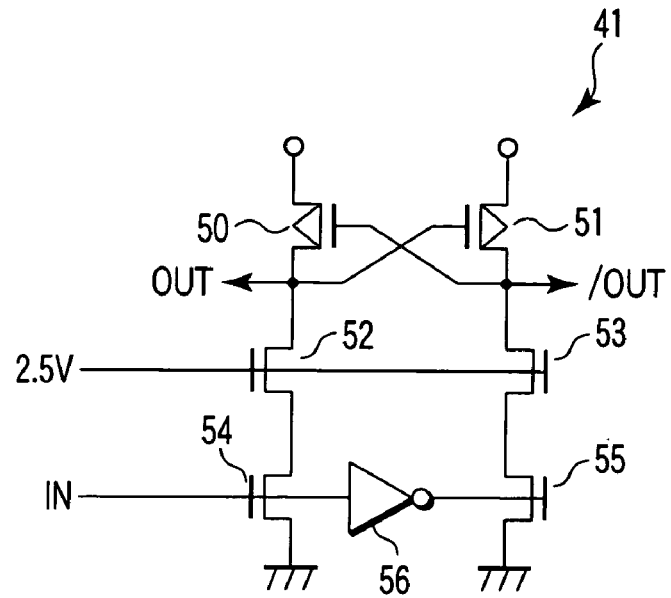
F I G. 6  Level shifter
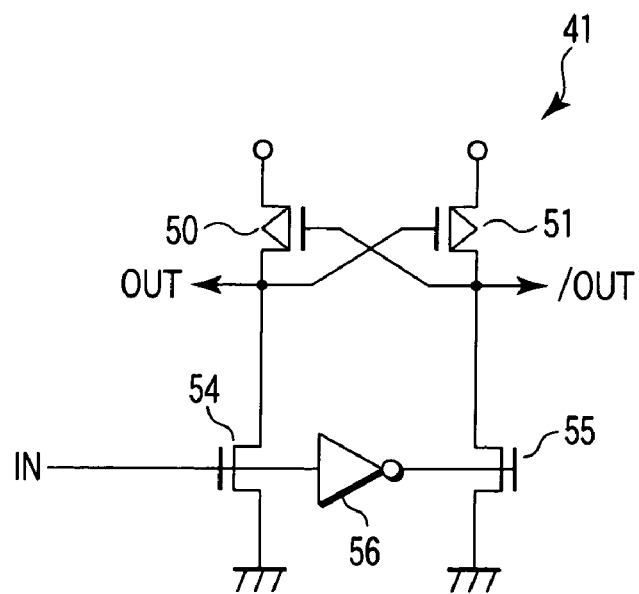
F I G. 7  Level shifter

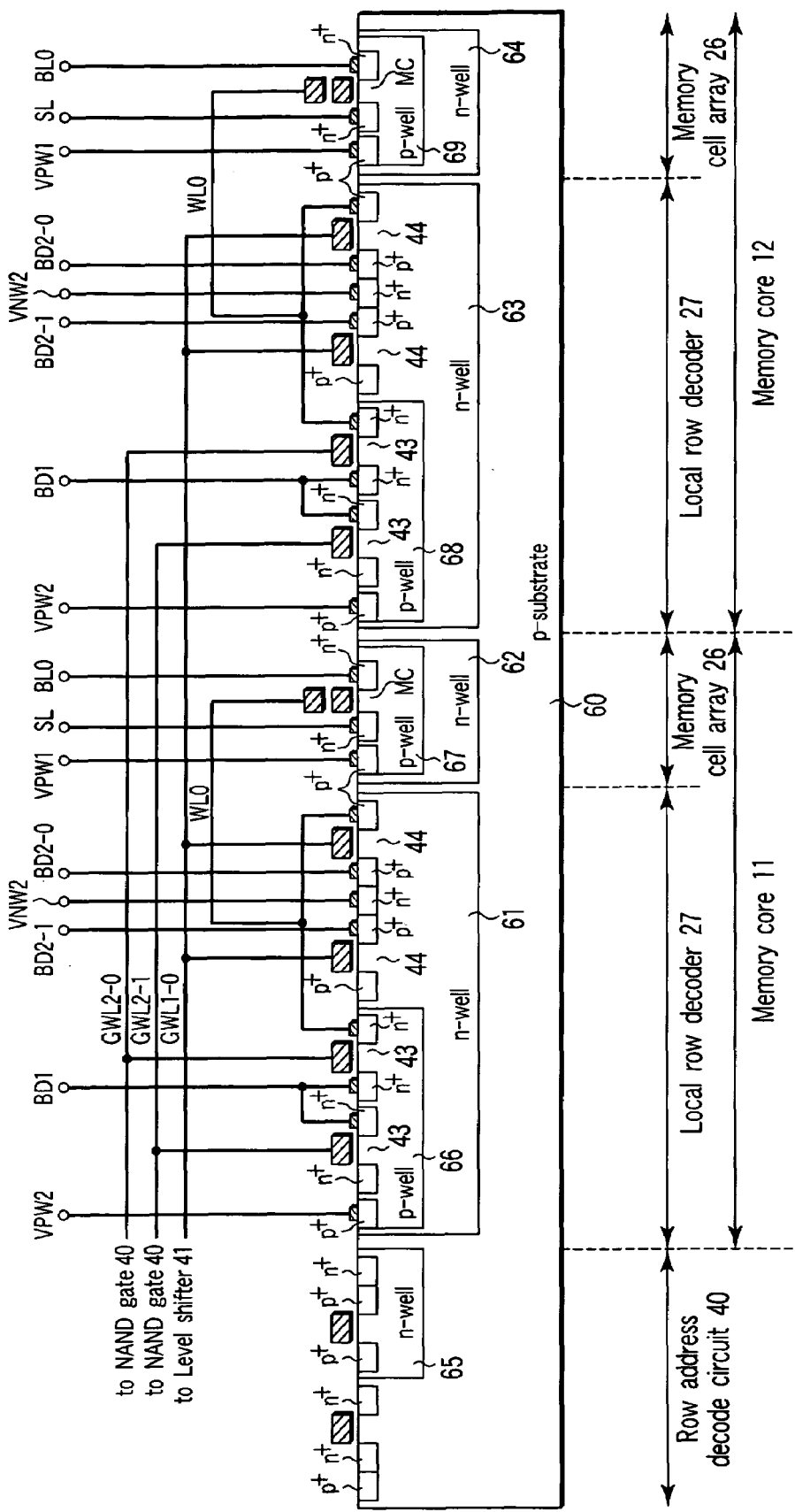
F I G. 8

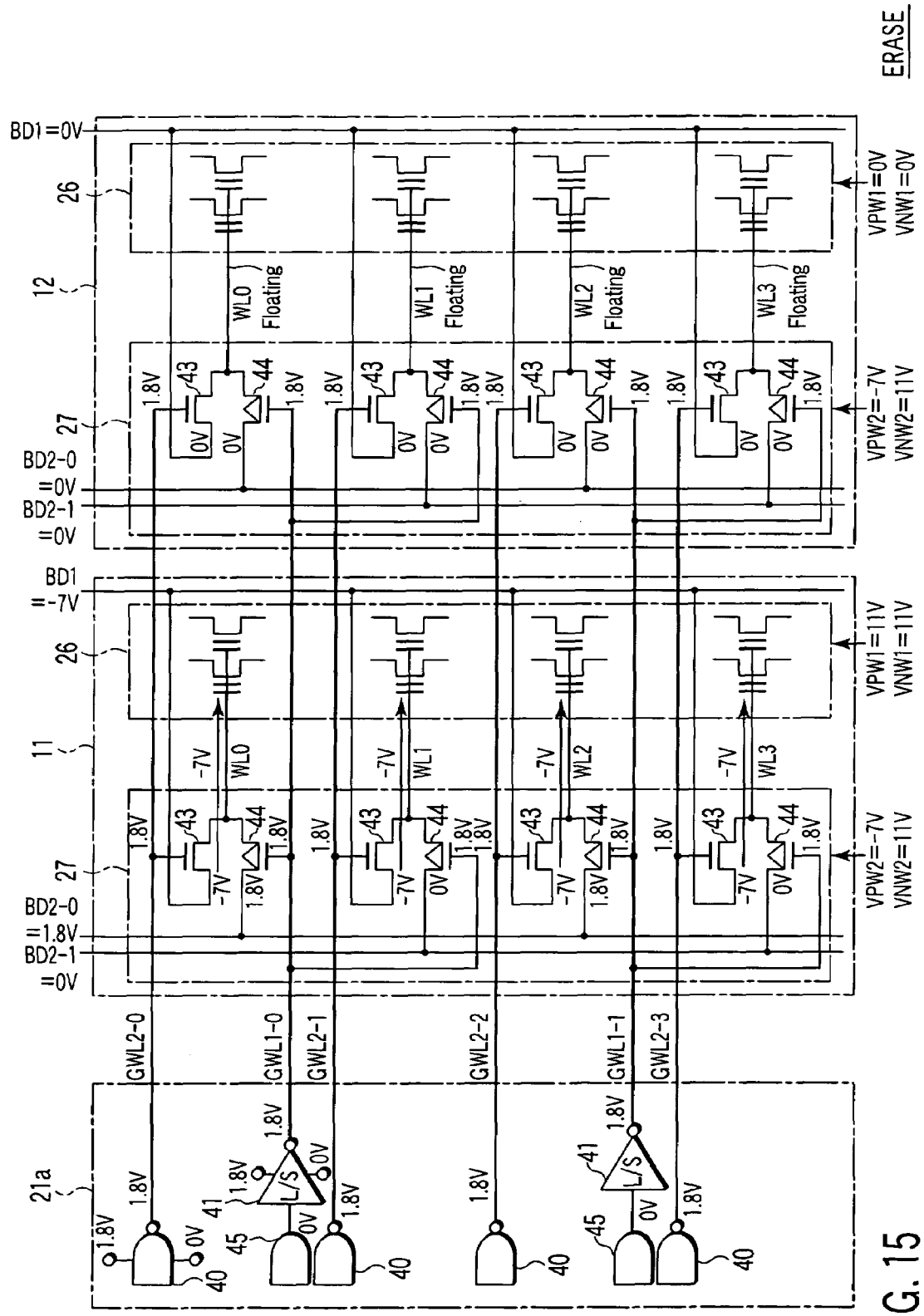
F I G. 15

FIG. 16 ERASE-VERIFY

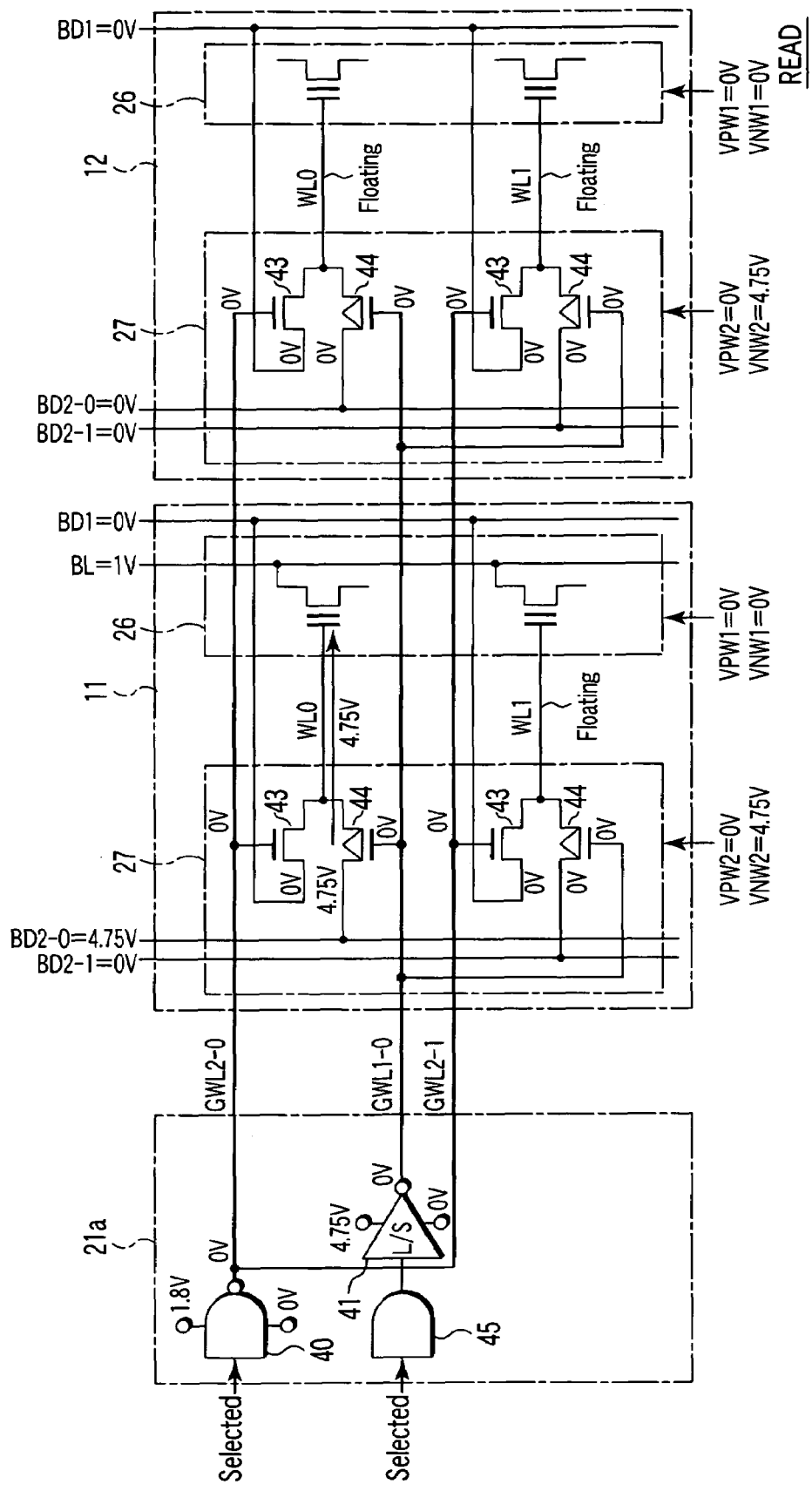
F I G. 17

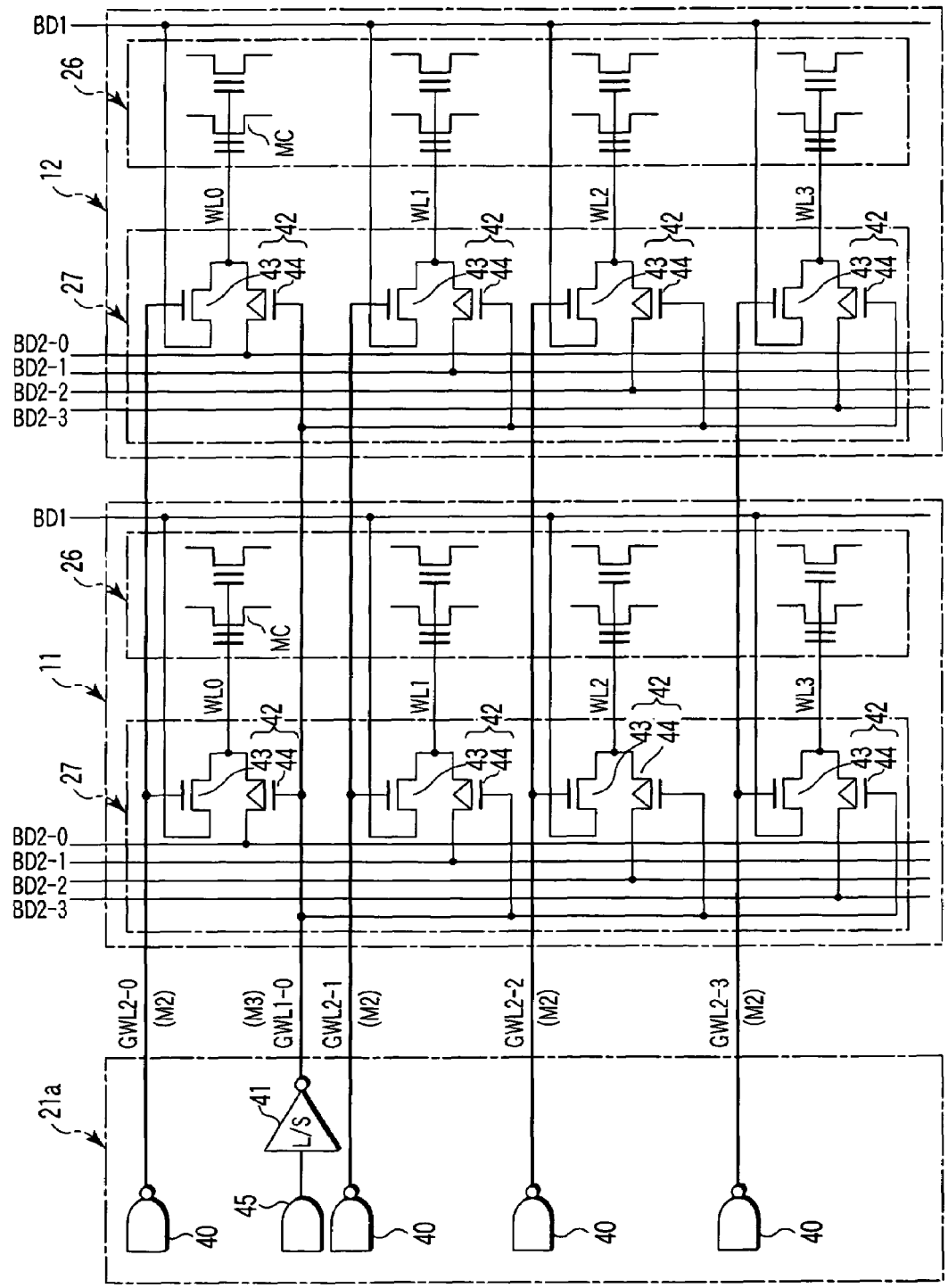
F I G. 18

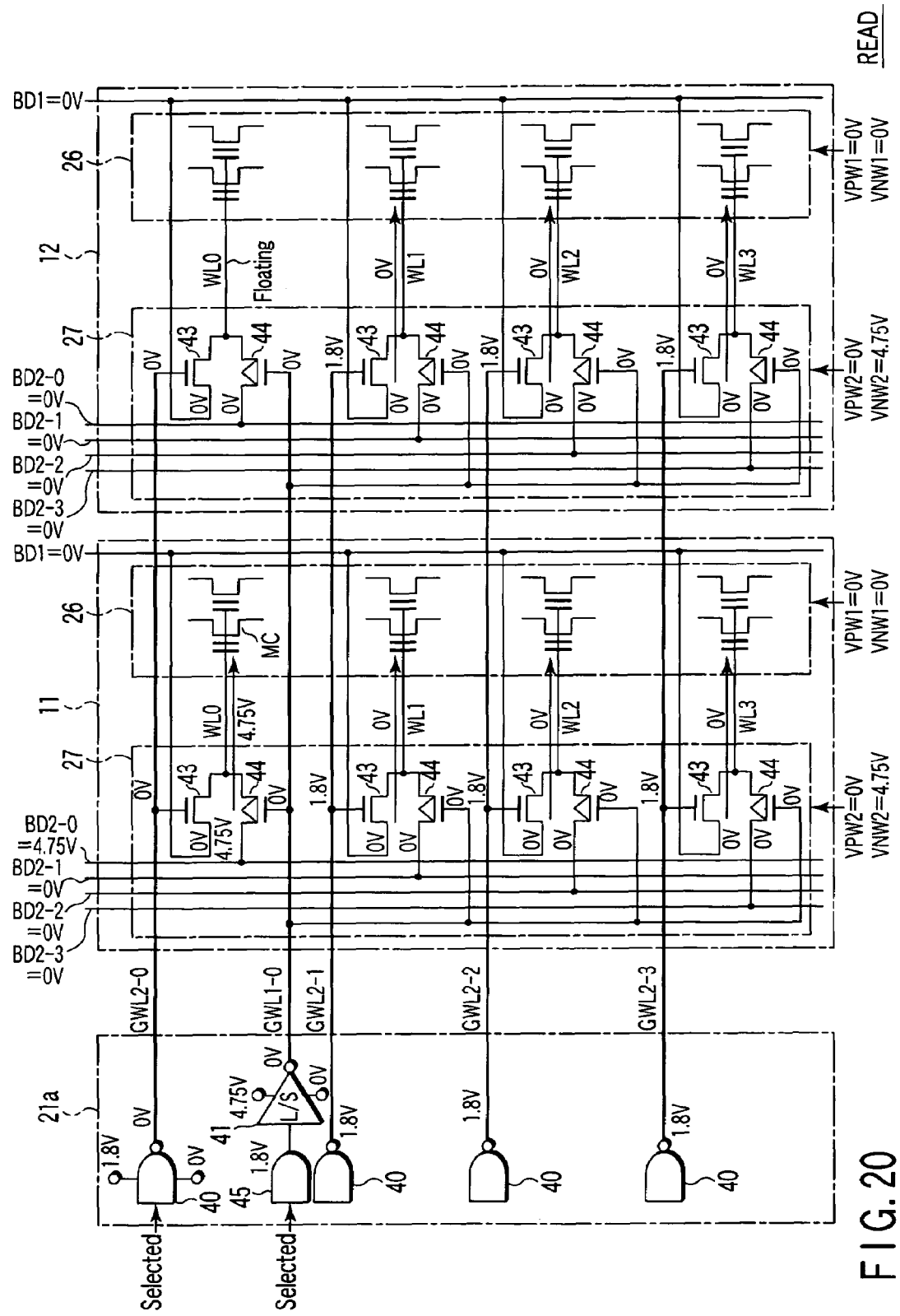
F I G. 20

FIG. 23  ERASE-VERIFY

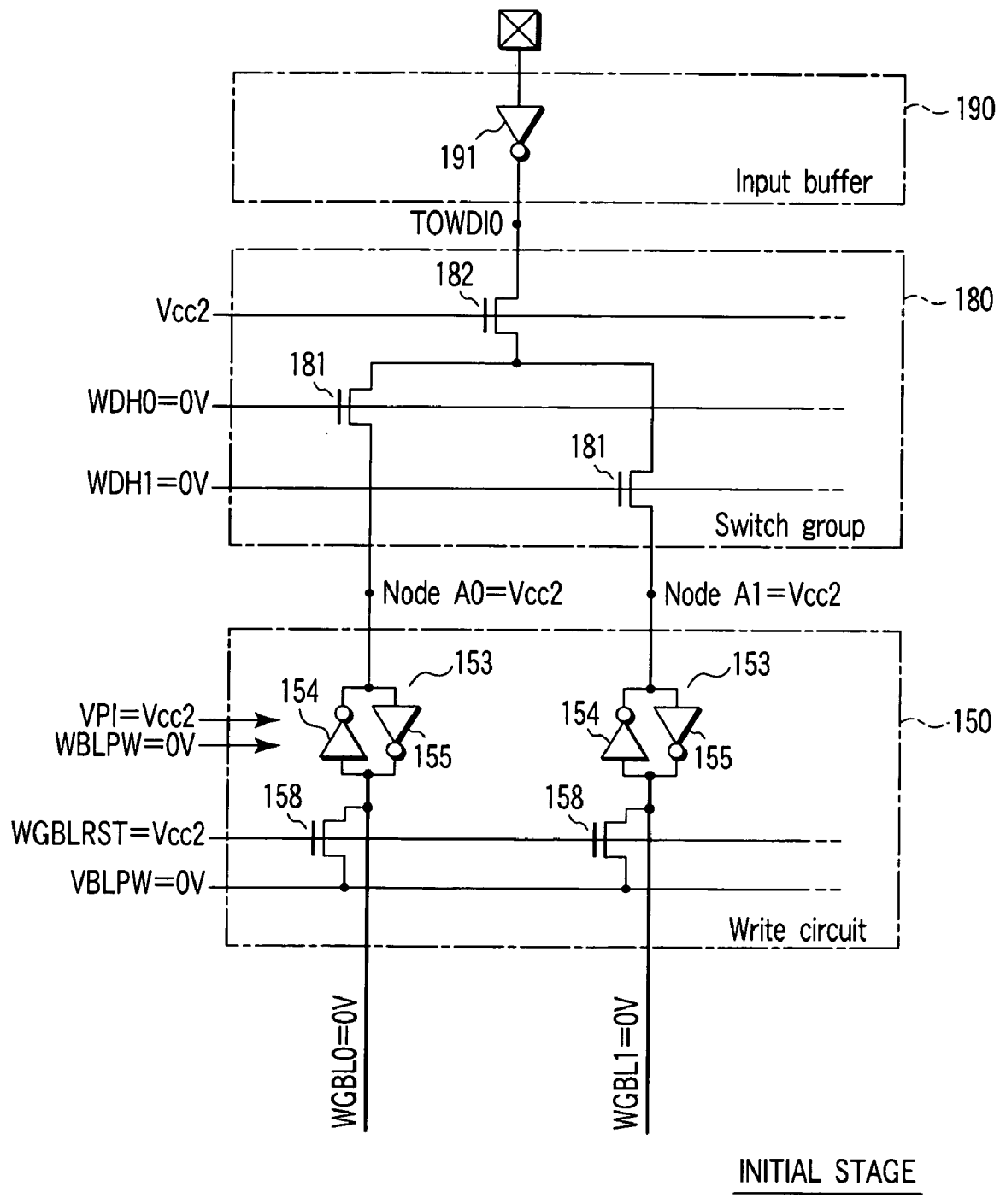
F I G. 29

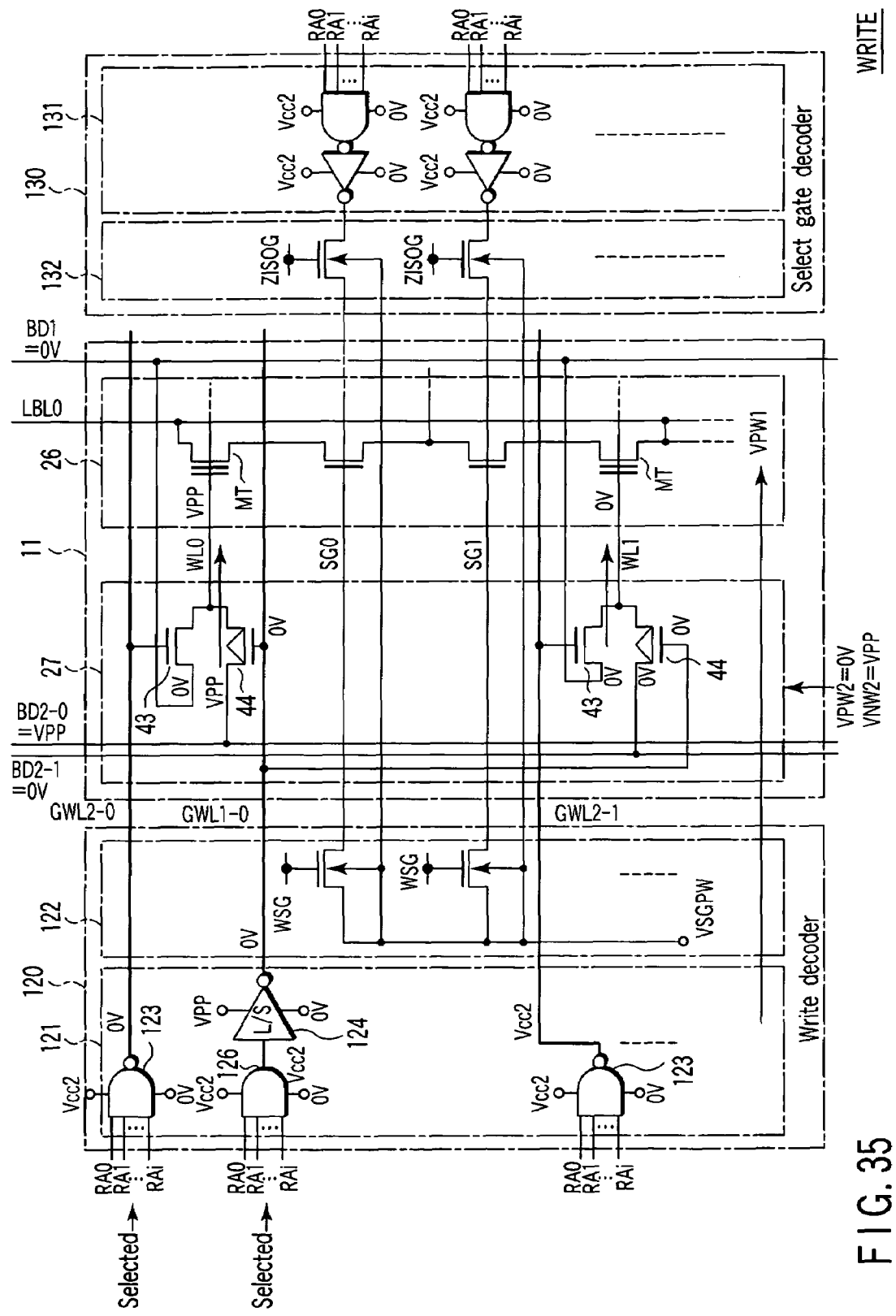
F I G. 35

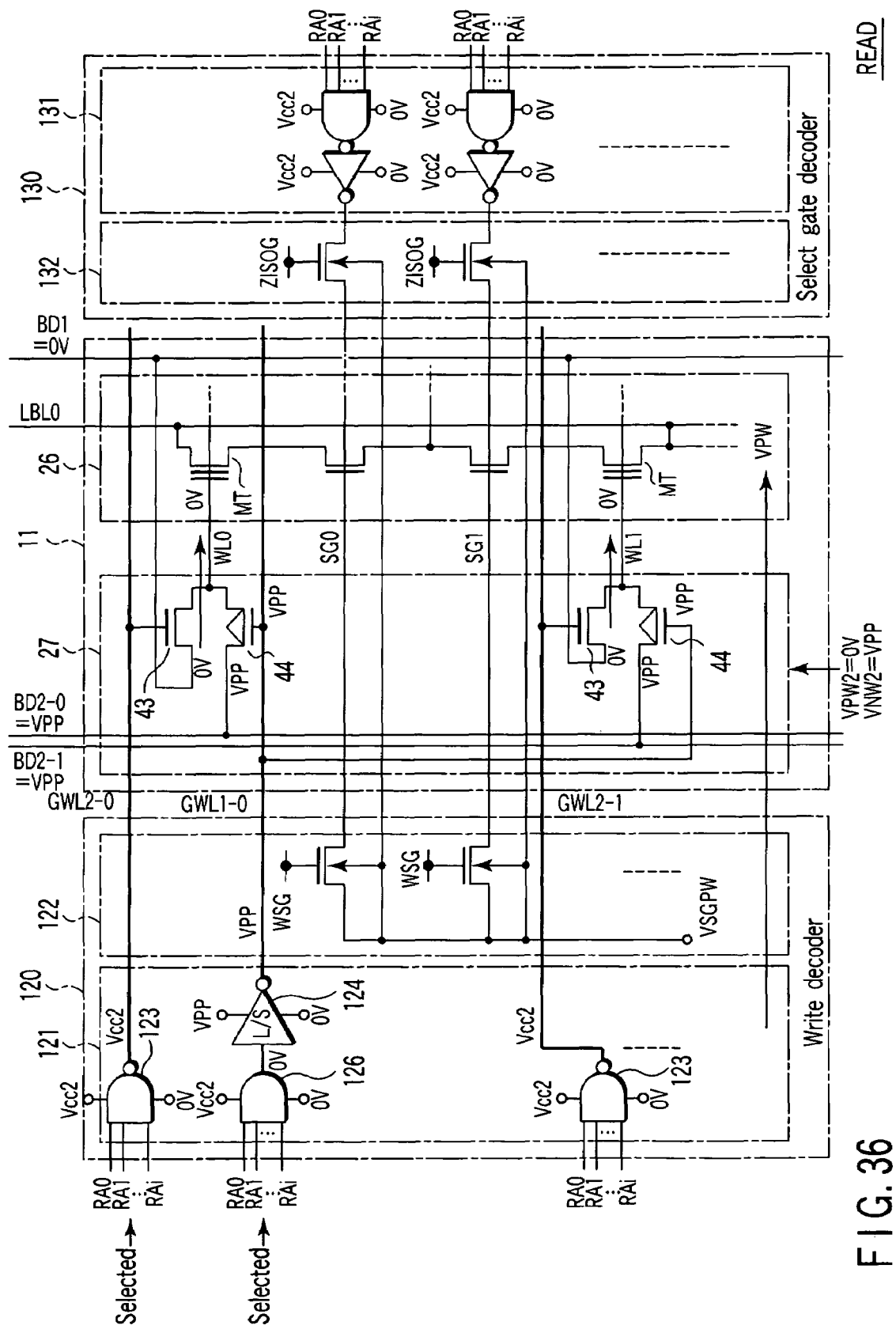
F I G. 36

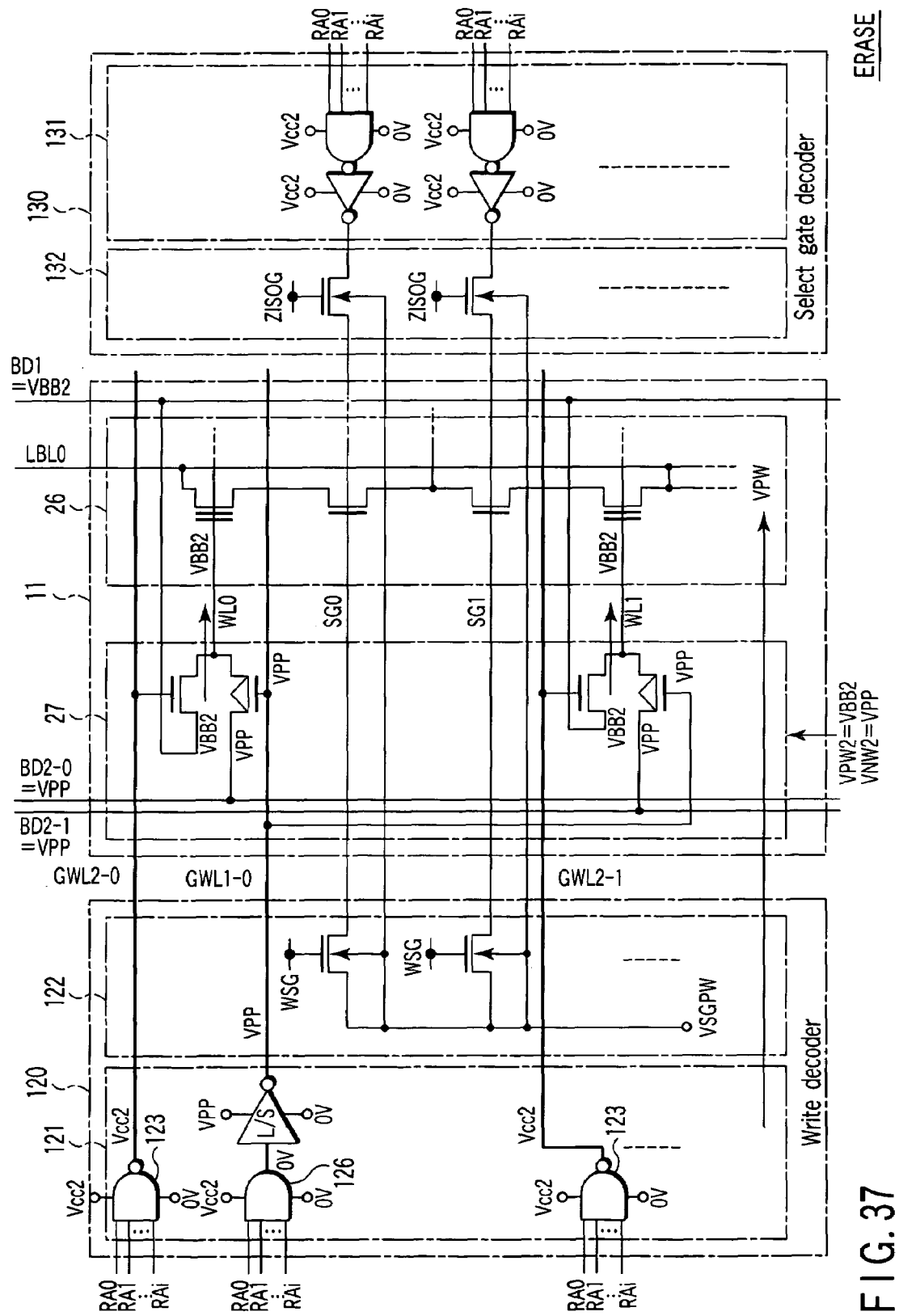
F I G. 37

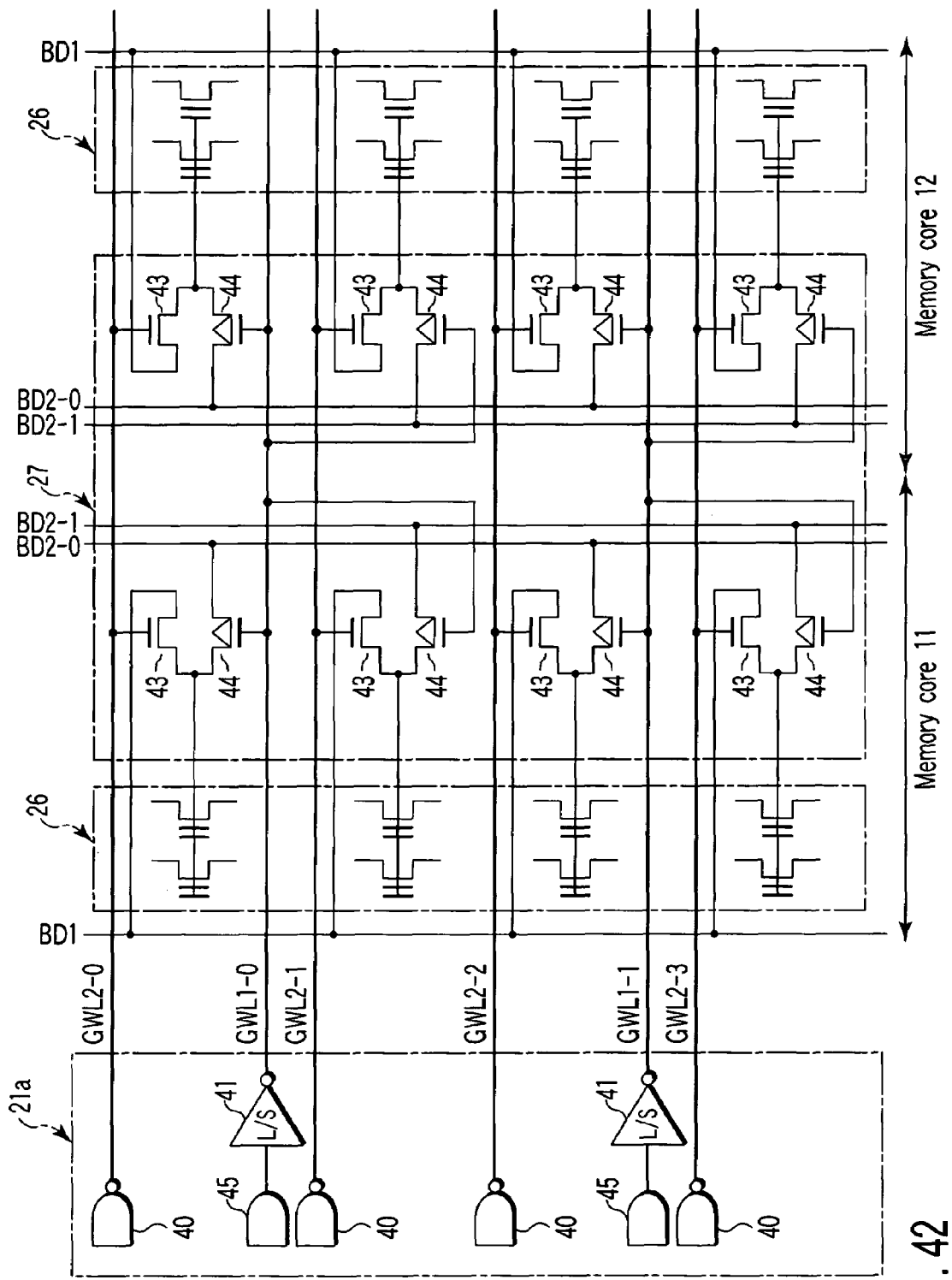
F I G. 42

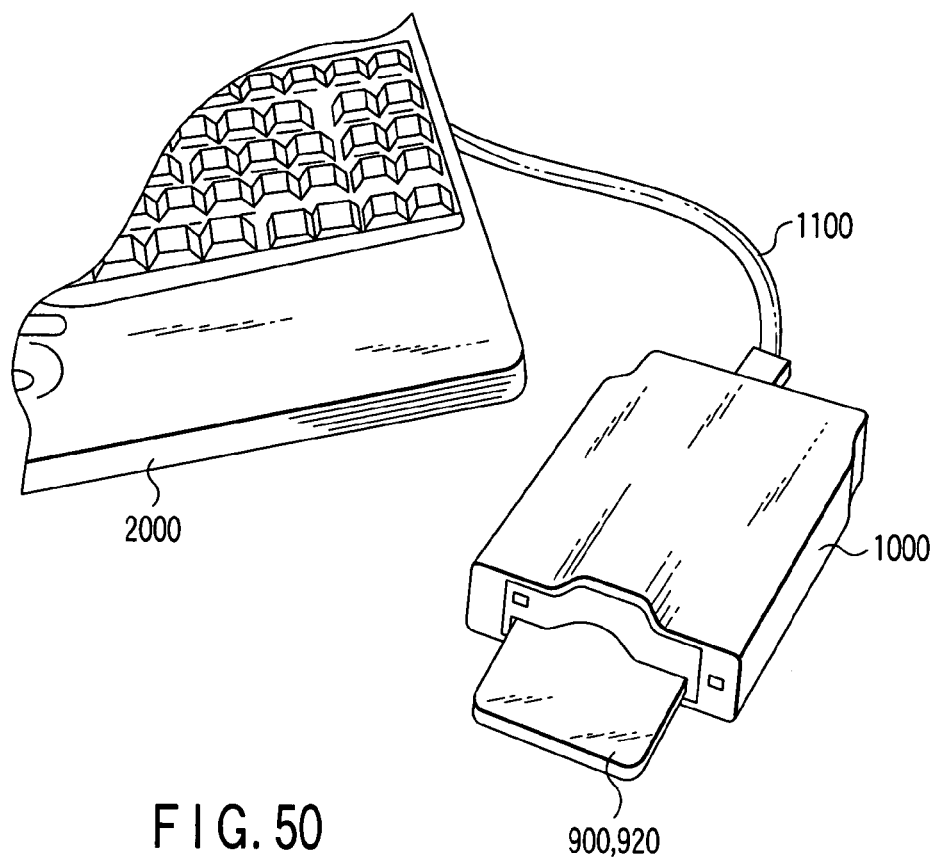
F I G. 50
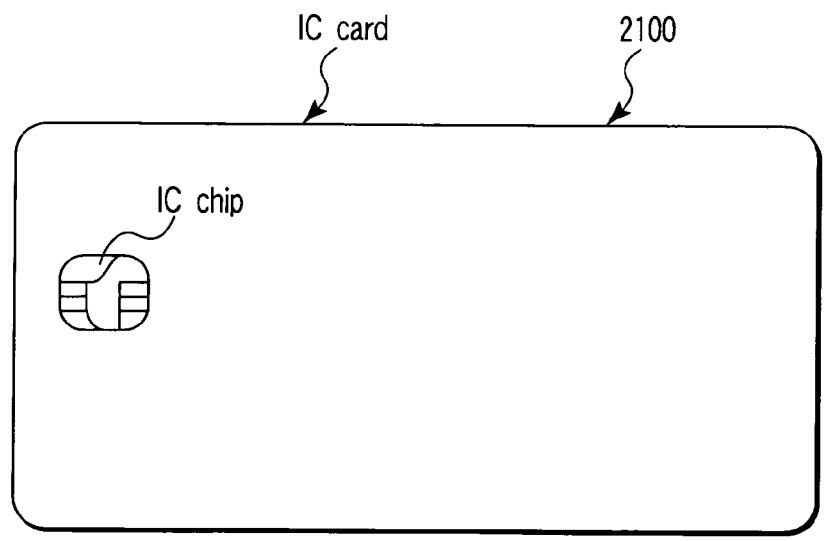
F I G. 51

US 7,423,910 B2

SEMICONDUCTOR DEVICE INCLUDING MOS TRANSISTORS HAVING FLOATING GATE AND CONTROL GATE

CROSS-REFERENCE TO RELATED APPLICATIONS

This application is based upon and claims the benefit of priority from prior Japanese Patent Application No. 2005-151080, filed May 24, 2005, the entire contents of which are incorporated herein by reference.

BACKGROUND OF THE INVENTION

1. Field of the Invention

The present invention relates to a semiconductor memory device. For example, the present invention relates to a semiconductor memory including MOS transistors each having a floating gate and a control gate.

2. Description of the Related Art

NOR type flash memories and NAND type flash memories are conventionally known as nonvolatile semiconductor memories and are commonly used. In recent years, a flash memory (referred to as a 2Tr flash memory below) has been proposed which has the advantages of both a NOR type flash memory and a NAND type flash memory. The 2Tr flash memory is disclosed in, for example, Wei-Hua Liu, "A2-Transistor Source-select (2TS) Flash EEPROM for 1.8V-Only Application", Non-Volatile Semiconductor Memory Workshop 4.1, 1997.

In the flash memory, in operation, a row, decoder selects a word line connected to any of the memory cells arranged in a matrix. For example, Jpn. Pat. Appln. KOKAI Publication No. 2000-49312 makes various proposals for the configuration of the row decoder. However, the conventional row decoder has a large size, thus hindering a reduction in the size of the flash memory.

BRIEF SUMMARY OF THE INVENTION

A semiconductor memory device according to an aspect of the present invention includes:

a plurality of memory cells each of which has a MOS transistor including a floating gate and a control gate;

a memory cell array including the memory cells arranged in a matrix;

word lines each of which connects commonly the control gates of the MOS transistors in the same row in the memory cell array;

a row decoder which decodes a row address signal used to select any of the word lines;

first MOS transistors each provided for a corresponding one of the word lines and which transfer a first voltage to the word line unselected by the row decoder, the first MOS transistor having a drain connected to the word line and a source to which the first voltage is applied, a back gate bias for the first MOS transistor being controlled independently of a potential at the source of the first MOS transistor; and second MOS transistors each provided for a corresponding one of the word lines and which transfer a second voltage to the word line selected by the row decoder, the second MOS transistor having a drain connected to the word line and a source to which the second potential is applied.

A memory card according to an aspect of the present invention includes a semiconductor memory device, device including:

a plurality of memory cells each of which has a MOS transistor including a floating gate and a control gate;

a memory cell array including the memory cells arranged in a matrix;

word lines each of which connects commonly the control gates of the MOS transistors in the same row in the memory cell array;

a row decoder which decodes a row address signal used to select any of the word lines;

first MOS transistors each provided for a corresponding one of the word lines and which transfer a first voltage to the word line unselected by the row decoder, the first MOS transistor having a drain connected to the word line and a source to which the first voltage is applied, a back gate bias for the first MOS transistor being controlled independently of a potential at the source of the first MOS transistor; and second MOS transistors each provided for a corresponding one of the word lines and which transfer a second voltage to the word line selected by the row decoder, the second MOS transistor having a drain connected to the word line and a source to which the second potential is applied.

BRIEF DESCRIPTION OF THE SEVERAL VIEWS OF THE DRAWING

FIG. 3 is a circuit diagram of a local column gate provided in the NOR type flash memory according to the first embodiment of the present invention;

FIG. 4 is a circuit diagram of a global column gate provided in the NOR type flash memory according to the first embodiment of the present invention;

FIG. 5 is a circuit diagram of a global row decoder, a local row decoder, and a memory cell array provided in the NOR type flash memory according to the first embodiment of the present invention;

FIG. 6 is a circuit diagram of a level shift circuit provided in the NOR type flash memory according to the first embodiment of the present invention;

FIG. 7 is a circuit diagram of a level shift circuit provided in the NOR type flash memory according to the first embodiment of the present invention;

FIG. 8 is a sectional view of the NOR type flash memory according to the first embodiment of the present invention;

FIG. 15 is a circuit diagram of the global row decoder, local row decoder, and memory cell array provided in the NOR type flash memory according to the first embodiment of the present invention, the diagram showing how an erase operation is performed;

FIG. 17 is a circuit diagram of the global row decoder, local row decoder, and memory cell array provided in the NOR type flash memory;

FIG. 18 is a circuit diagram of a global row decoder, a local row decoder, and a memory cell array provided in a NOR type flash memory according to a second embodiment of the present invention;

FIG. 20 is a circuit diagram of the global row decoder, local row decoder, and memory cell array provided in the NOR type flash memory according to the second embodiment of the present invention, the diagram showing how a read operation is performed;

FIG. 29 is a circuit diagram of a write circuit, a switch group, and an input buffer provided in the 2Tr flash memory according to the third embodiment of the present invention, the diagram showing an initial state;

FIG. 35 is a circuit diagram of the memory cell array, write decoder, and select gate decoder provided in the 2Tr flash memory according to the third embodiment of the present invention, showing how a write operation is performed;

FIG. 36 is a circuit diagram of the memory cell array, write decoder, and select gate decoder provided in the 2Tr flash memory according to the third embodiment of the present invention, showing how a read operation is performed;

FIG. 37 is a circuit diagram of the memory cell array, write decoder, and select gate decoder provided in the 2Tr flash memory according to the third embodiment of the present invention, showing how an erase operation is performed;

FIG. 42 is a circuit diagram of a global row decoder, a local row decoder, and a memory cell array provided in a flash memory according to a first modification of the first to sixth embodiments of the present invention;

FIG. 50 is a diagram showing the appearance of a connection apparatus to which the memory card comprising the flash memory according to the first to fifth embodiments is connected;

FIG. 51 is a diagram showing the appearance of an IC card comprising the flash memory according to the first to fifth embodiments.

DETAILED DESCRIPTION OF THE INVENTION

Figure 1:
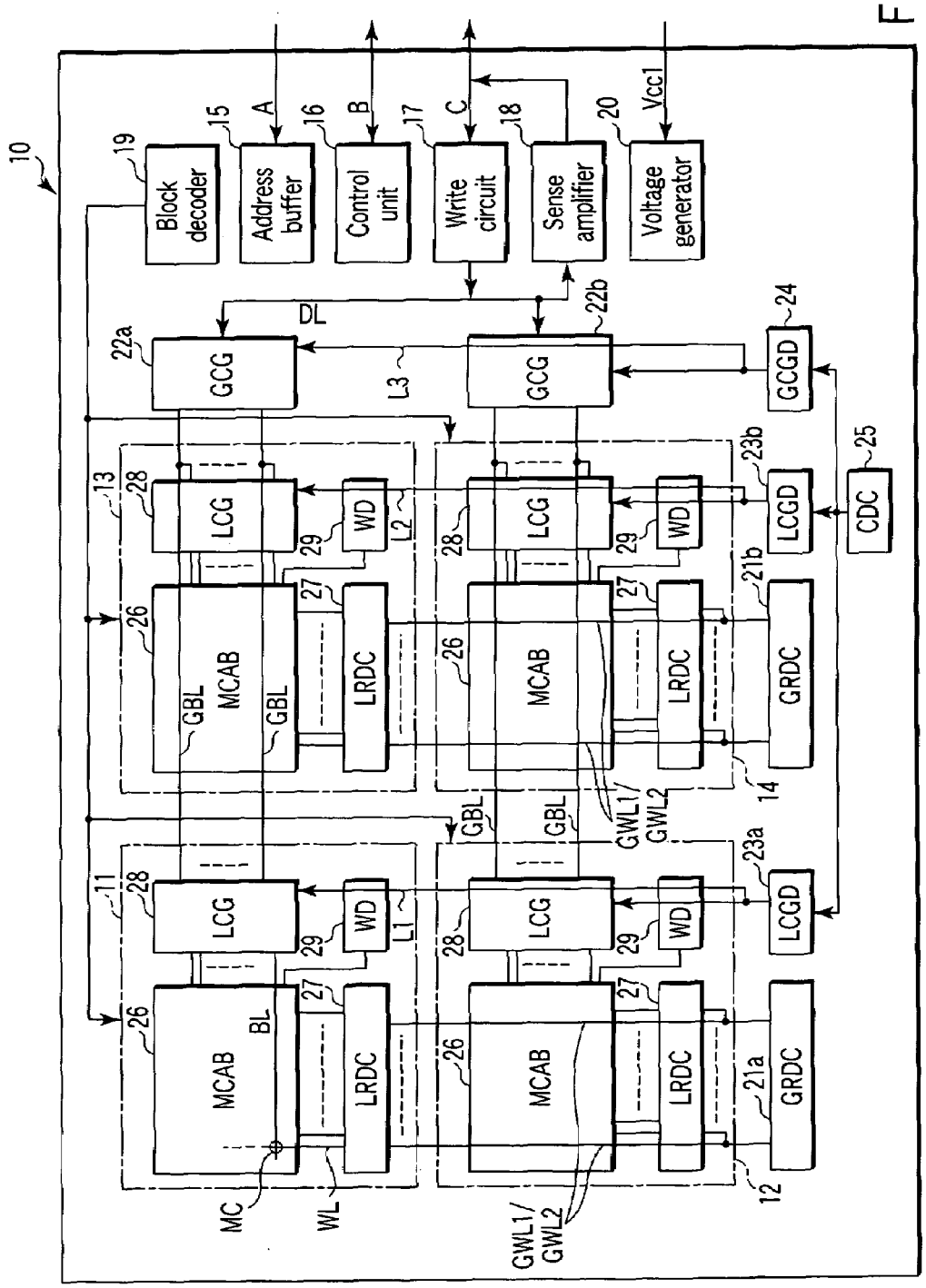
FIG. 1 is a block diagram of LSI according to a first embodiment of the present invention.

With reference to FIG. 1, description will be given of a semiconductor memory device according to a first embodiment of the present invention. FIG. 1 is a block of LSI according to the present embodiment. As shown in the figure, LSI 10 comprises four memory cores 11 to 14, an address buffer 15, a control unit 16, a write circuit 17, a sense amplifier 18, a block decoder 19, a voltage generating circuit 20, global row decoders 21a and 21b, global column gates 22a and 22b, local column gate driving units 23a and 23b, a global column gate driving unit 24, and a column decoder 25.

The memory cores 11 to 14 each comprises NOR type flash memory cells and have the same configuration. Each of the memory cores 11 to 14 comprises a memory cell array 26, a local row decoder 27, a local column gate 28, and a well decoder 29.

The address buffer 15 receives and holds an external address signal. The control section 16 generally controls LSI 10. The write circuit 17 receives and writes external write data to memory cells. The sense amplifier 18 senses data read from memory cells. The block decoder 19 selects any of the memory cores 11 to 14 and supplies a voltage to this memory core. The voltage generating circuit 20 comprises a charge pump circuit to generate a positive or negative voltage on the basis of an externally supplied voltage Vcc1.

Figure 2:
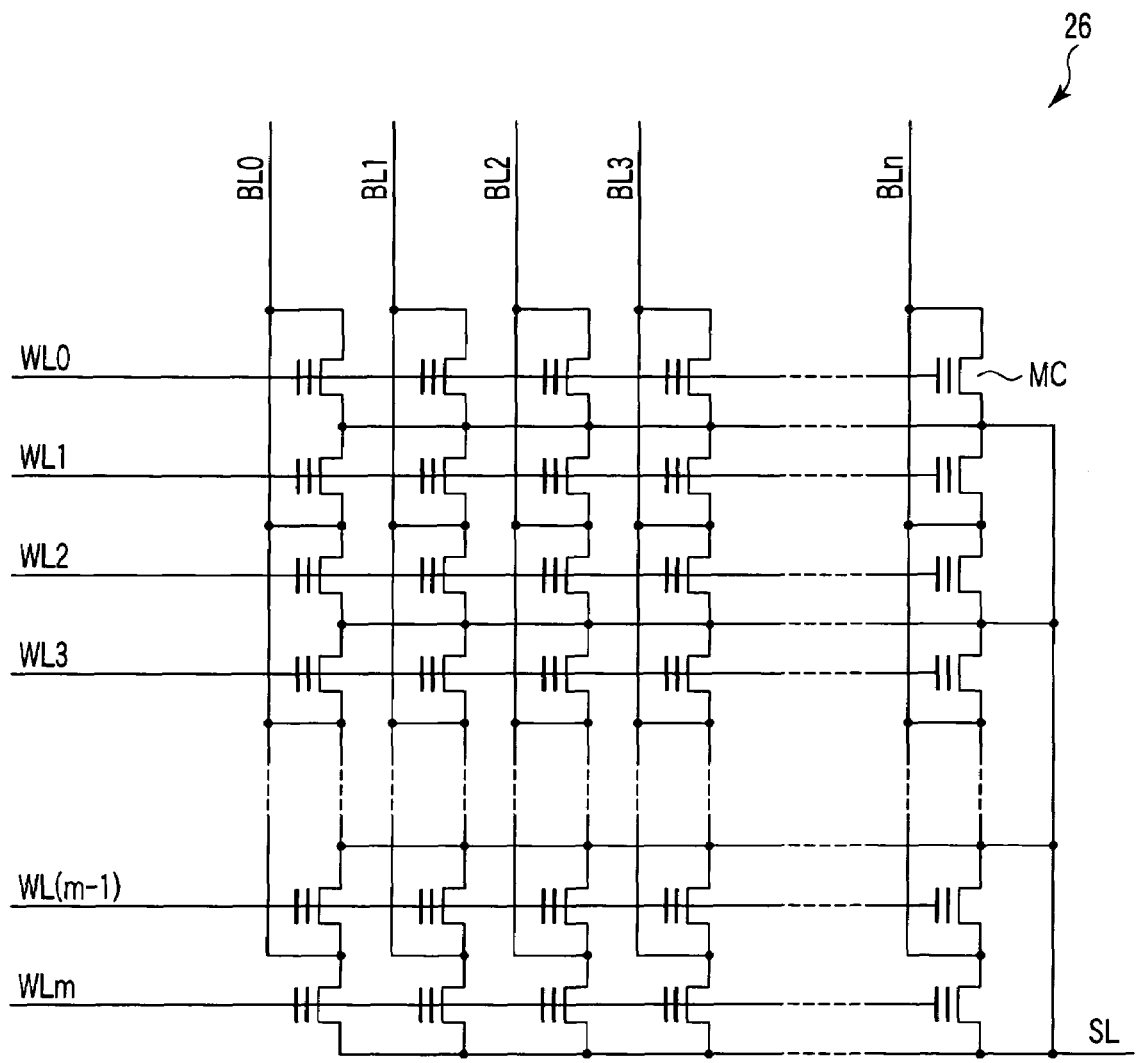
FIG. 2 is a circuit diagram of a memory cell array provided in a NOR type flash memory according to the first embodiment of the present invention.

FIG. 2 is a block diagram of the memory cell array 26. As shown in the figure, the memory cell array 26 comprises a plurality of memory cells MC00 to MCmn arranged in a matrix. Each of the memory cells MC00 to MCmn comprises a floating gate formed on a semiconductor substrate with a gate insulating film interposed therebetween and a control gate formed on the floating gate with an inter-gate insulating film interposed therebetween. The control gates of the memory cells in the same row are connected commonly to any of the local word lines WL0 to WLm. The drains of the memory cells in the same column are connected commonly to any of local bit lines BL0 to BLn. The sources of the memory cells are connected to a source line SL.

The local column gate 28 selects any of the local bit lines and connects this local bit line to a global bit line GBL. The local column gate 28, placed in each of the memory cores 11 and 13, is connected to the global column gate 22a via the global bit line GBL. The global column gate 22a selects the global bit line GBL. Similarly, the local column gate 28, placed in each of the memory cores 12 and 14, is connected to the global column gate 22b via the global bit line GBL. The global column gate 22b selects the global bit line GBL. The local column gate 28, placed in each of the memory cores 11 and 12, is connected to the local column gate driving unit 23a via an interconnect L1. The local column gate driving unit 23a drives the local column gates 28, arranged in the memory cores 11 and 13, in accordance with a column address supplied by the address buffer 15. The local column gate 28, placed in each of the memory cores 13 and 14, is connected to the local column gate driving unit 23b via an interconnect L2. The local column gate driving unit 23b drives the local column gates 28, arranged in the memory cores 13 and 14, in accordance with a column address supplied by the address buffer 15. Moreover, the global column gates 22a and 22b are connected to a global column gate driving unit 24 via an interconnect L3. The global column gate driving unit 24 selects and drives the global column gate 22a or 22b in accordance with a column address signal supplied by the address buffer 15. The local column gate driving units 23a and 23b and the global column gate driving unit 24 are connected to the column decoder 25. The column decoder 25 drives one of the local column gate driving units 23a and 23b and global column gate driving section 24 in accordance with a column address signal supplied by the address buffer 15.

The global column gates 22a and 22b are connected to the write circuit 17 via a data line DL. During a data write operation, the global column gates 22a and 22b are selectively driven by the column decoder 25 and global column gate driving unit 24. The global column gates 22a and 22b supply data from the write circuit 17 to the local column gate 28 selected by the local column gate driving unit 23a or 23b. During a data read operation, the global column gates 22a and 22b supply the sense amplifier 18 with data loaded into the local column gate 28 from the memory cells in the selected memory cell array 26.

FIG. 3 shows the configuration of the memory cell array 26 and local column gate 28 connected to one of the global bit lines. As shown in the figure, the local column gate 28 comprises a plurality of n-channel MOS transistors 31 to 34. One end of a current path in each of the MOS transistors 31 to 34 is connected to the global bit line GBL. The other end of the current path is connected to the corresponding one of the local bit lines BL0 to BL3. The gates of the MOS transistors 31 to 34 are supplied with selection signals CA0 to CA3 output by the local column gate driving unit 23a or 23b. The MOS transistors 31 to 34 are made conductive in accordance with the respective selection signals CA0 to CA3. Each of the MOS transistors 31 to 34 connects the selected local bit line to the global bit line GBL. In the example in FIG. 3, the local column gate 28 comprises the MOS transistors 31 to 34. Further, one global bit line GBL is provided for every four local bit lines BL. Therefore, when the number of local bit lines BL is defined as (n+1), the number of global bit lines GBL is (n+1)/4. However, this is only an example. For example, one global bit line may be provided for every eight local bit lines or for every two local bit lines as required.

FIG. 4 shows the configuration of the global column gates 22a and 22b. Each of the global column gates 22a and 22b comprises a plurality of n-channel MOS transistors 35 to 38. One end of a current path in each of the MOS transistors 35 to 38 is connected to the write circuit 17 and sense amplifier 18 via the data line DL. The other end of the current path in each of the MOS transistors 35 to 38 is connected to the corresponding one of the global bit lines GBL0 to GBL3. The gates of the MOS transistors 35 to 38 are supplied with selection signals CA4 to CA7, respectively, output by the global column gate driving unit 24. The MOS transistors 35 to 38 are made conductive in accordance with the respective selection signals CA4 to CA7 to select the respective global bit lines GBL0 to GBL3. FIG. 4 shows the four global bit lines GBL. However, the number of global bit lines GBL is not limited to this. MOS transistors may be provided depending on the number of global bit lines.

Referring back to FIG. 1, the description will be continued.

The well decoder 29 supplies a voltage to a well region in which the memory cell array 26 is formed.

The local row decoder 27 selects a local word line WL in accordance with a row address signal supplied by the address buffer 15. The local row decoder 21, placed in each of the memory cores 11 and 12, is connected to the global row decoder 21a via a first global word line GWL1 and a second global word line GWL2. The global row decoder 21a selects the local row decoder 27 in the memory core 11 or 12 in accordance with an address signal supplied by the address buffer 15. Similarly, the local row decoder 27, placed in each of the memory cores 13 and 14, is connected to the global row decoder 21b via the first global word line GWL1 and second global word line GWL2. The global row decoder 21b selects the local row decoder 27 in the memory core 13 or 14 in accordance with an address signal supplied by the address buffer 15.

FIG. 5 is a circuit diagram of a part of the global row decoder 21a and memory cores 11 and 12. As shown in the figure, the global row decoder 21a comprises row address decode circuits 40 and 45 and a level shifter 41. The row address decode circuit 40 is a NAND gate provided for each of the local word lines WL0 to WLm to decode a row address signal provided by the address buffer 15. Outputs from (m+1) row address decode circuits 40 are provided to the second global word lines GWL2-0 to GWL2-m. The second global word lines GWL2-0 to GWL2-m are shared by the memory cores 11 and 12. An "L" level is output by the row address decode circuit 40 corresponding to the second global word line matching the row address signal. An "H" level is output by the row address code circuit 40 corresponding to the second global word line not matching the row address signal.

One row address decode circuit 45, that is, one AND gate, is provided for two local word lines WL, in other words, for two second global word lines GWL2. That is, the row address decode circuits 45 are arranged in association with the global word lines GWL2-0, GWL-2-2, GWL2-4, . . . Each of the row address decode circuits decodes a row address signal. If the row address decode circuit 45 matches the row address signal, it outputs the "H" level. If the row address decode circuit 45 does not match the row address signal, it outputs the "L" level.

The level shifter 41 is provided for each row address decode circuit 45. The level shifter 41 inverts an output from the corresponding row address decode circuit 45 for level shifting. The level shifter 41 then outputs the inverted output to the corresponding one of the first global word lines GWL-0 to GWL((m/2)-1). The first global word lines GWL1-0 to GWL((m/2)-1) are shared by the memory cores 11 and 12.

The local row decoder 27 comprises switch groups each provided for the corresponding one of the local word lines WL0 to WLm. Each of the switch groups 42 comprises an n-channel MOS transistor 43 and a p-channel MOS transistor 44. The gate of the n-channel MOS transistor 43 is connected to the corresponding one of the second global word lines GWL2-0 to GWL2-m. The drain of the n-channel MOS transistor 43 is connected to the corresponding one of the local word lines WL0 to WLm. The source of the n-channel MOS transistor 43 is connected to a first block decode interconnect BD1. The gate of the p-channel MOS transistor 44 is connected to the corresponding one of the first global word lines GWL1-0 to GWL((m/2)-1). The drain of the p-channel MOS transistor 44 is connected to the corresponding one of the local word lines WL0 to WLm. The source of the p-channel MOS transistor 44 is connected to a second block decode interconnect BD2-0 or BD2-1.

In the local row decoder 27, configured as described above, the second global word lines GWL2-0 to GWL2-m are connected to the switch groups 42 corresponding to the local word lines WL0 to WLm, respectively. Each of the first global word lines GWL1-0 to GWL((m/2)-1) is provided for every two switch groups 42 corresponding to the respective local word lines WL. That is, the first global word line GWL1-0 is connected to the two switch groups 42 corresponding to the local word lines WL0 and WL1. The first global word line GWL1-1 is connected to the two switch groups 42 corresponding to the local word lines WL2 and WL3. The first global word line GWL1-2 is connected to the two switch groups 42 corresponding to the local word lines WL4 and WL5. For example, the block decoder 19 provides a voltage to the first block decode interconnect BD1 and second block decode interconnects BD2-0 and BD2-1. A well potential for the n-channel MOS transistor 43 can be provided separately from a source potential for it. The block decoder 19 provides the well potential. This also applies to the p-channel MOS transistor 44 and a well potential for the p-channel MOS transistor 44 can be provided separately from a source potential for it. The block decoder 19 provides the well potential. Only the memory core 11 and 12 have been described above. However, the memory cores 13 and 14 have a similar configuration.

FIG. 6 is a circuit diagram of the level shifter 41. As shown in the figure, the level shifter 41 comprises p-channel MOS transistors 50 and 51, n-channel MOS transistors 52 to 55, and an inverter 56. The source of the MOS transistor 50 is connected to a power supply potential. Its drain is connected to the drain of the MOS transistor 52 and the gate of the MOS transistor 51. The gate of the MOS transistor 50 is connected to the drains of the transistors 51 and 53. The source of the MOS transistor 51 is connected to the power supply potential. The sources of the MOS transistors 52 and 53 are connected to the drains of the MOS transistors 54 and 55. A voltage of 2.5 V (2×Vref) is applied to the gates of the MOS transistors 52 and 53. The MOS transistors 54 and 55 are of a low withstand-voltage type and have thinner gate insulating films than the MOS transistors 50 to 53. The sources of the MOS transistors 54 and 55 are connected to the ground potential. The gate of the MOS transistor 54 functions as an input terminal IN of the level shifter 41 to which a signal is input. A signal is input to the gate of the MOS transistor 55; the signal is obtained by an inverter 56 by inverting the input signal to the input terminal IN. The connection node between the drains of the MOS transistors 50 and 52 functions as an output terminal OUT of the level shifter 41.

The level shifter 41 may be configured as shown in FIG. 7. As shown in the figure, the MOS transistors 52 and 53 in the configuration in FIG. 6 are eliminated. The drains of the MOS transistors 54 and 55 are connected to the drains of the MOS transistors 50 and 51, respectively. The MOS transistors 54 and 55 are of a high withstand-voltage type.

FIG. 8 is a diagram schematically showing the sectional structure of the global row decoder 21a, local row decoder 27, and memory cell array 26. FIG. 8 shows only the memory cores 11 and 12 but also applies to the memory cores 13 and 14.

As shown in the figure, n-type well regions 61 to 65 separated from one another are formed in a surface of a p-type semiconductor substrate 60. MOS transistors are formed on the semiconductor substrate 60 and on the p-type well region 65; the MOS transistors are used to form row address decoder circuits 40. The MOS transistors are of a low withstand-voltage type and have a thinner gate insulating film than the MOS transistor used to form a local row decoder 27.

P-type well regions 66 and 68 are formed in parts of the surfaces of the n-type well regions 61 and 63, respectively. The n-type well regions 61 and 63 and the p-type well regions 66 and 68 are used to form the local row decoder 27. The MOS transistors 44 are formed on the n-type well regions 61 and 64. The MOS transistors 43 are formed on the p-type well regions 66 and 68.

P-type well regions 67 and 69 are formed in parts of the surfaces of the n-type well regions 62 and 64, respectively. The n-type well regions 61 and 63 and the p-type well regions 67 and 69 are used to form the memory cell array 26. MOS transistors in the flash cells are formed on the p-type well regions 67 and 69.

A potential VPW2 is provided to the p-type well region 66, in which the MOS transistor 43 is formed. The potential VPW2 can be set independently of the source potential (potential of BD1) of the MOS transistor 43. A potential VNW2 is provided to the n-type well region 61, in which the MOS transistor 44 is formed. The potential VNW2 can be set independently of the source potential (potential of BD2) of the MOS transistor 44.

Although not shown in FIG. 8, the level shifters 41, like the local row decoders 27, are formed on the n-type well region formed in the surface of the p-type semiconductor substrate 60 and on the p-type well region formed in the surface of the n-type well region.

Figure 9:
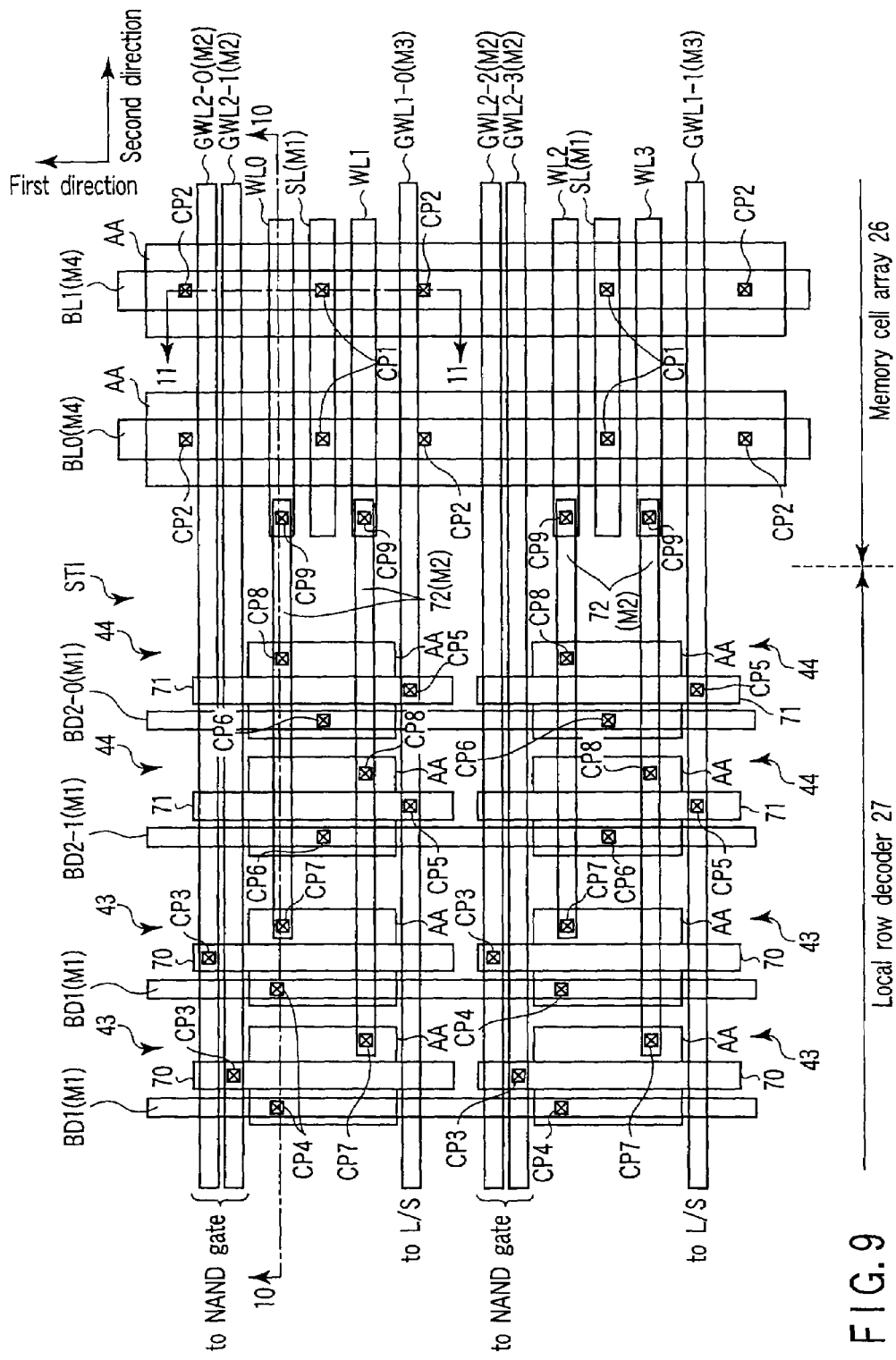
FIG. 9 is a plan view of the local row decoder and memory cell array provided in the NOR type flash memory according to the first embodiment of the present invention.

FIG. 9 is a plan view of a part of the local row decoder 27 and memory cell array 26. The description (Mi, i=1, 2, 3, 4) in the figure means that the interconnect is an interconnect layer located at the level of the i-th layer.

First, the memory cell array 26 will be described. As shown in the figure, a plurality of stripe-shaped element regions AA are formed in the semiconductor substrate 60 along a first direction. Local word lines WL are formed on the semiconductor substrate 60 along a second direction orthogonal to the first direction so as to stride the plurality of element regions. Each of the local word lines WL has a stacked structure including a floating gate formed on the element region AA with a gate insulating film interposed therebetween and a control gate formed on the floating gate with an inter-gate insulating film interposed therebetween. A MOS transistor using the stacked structure as a gate electrode, that is, a memory cell MC, is formed on the element region AA. The adjacent memory cells MC share a source or drain. The first metal interconnect layer above the memory cell MC forms a source line SL that connects the sources of the memory cells MC in the same row, using contact plugs CP1. The fourth metal interconnect layer forms a local bit line BL that connects the drains of the memory cells MC in the same column, using contact plugs CP2. The second global word line GWL2 and the first global word line GWL1 pass through the memory cell array 26; the second global word line GWL2 is formed by the second metal interconnect layer and the first global word lines GWL1 is formed by the third metal interconnect layer. These metal interconnect layers are shaped like stripes extending along the second direction.

Now, the local row decoder 27 will be described. As shown in the figures, the element regions AA are formed in the semiconductor substrate 60 in a matrix. The MOS transistors 43 and 44 are formed in each of the element regions AA. The element regions are arranged so as to have the relationship described below. That is, along the first direction, one element region AA is formed for two local word lines WL. Along the second direction, four element regions AA are formed per row. When there are ((m+1)×(n+1)) memory cells ML, the local row decoder 27 includes ((m+1)/2)×4) element regions AA. The two MOS transistors 43 and two MOS transistors 44 provided on the same row are used to select the two local word lines WL provided in association with the MOS transistors. Further, the MOS transistors 44 provided on the same column area connected to the same second block decode interconnect BD2.

Stripe-shaped gate electrodes 70 and 71 are formed on each element region AA along the first direction. A stripe-shaped first block decode interconnect BD1 is formed along the first direction so as to connect the sources of the MOS transistors 43 in the same column. The first block decode interconnect BD1 is formed using the first metal interconnect layer and is connected to the MOS transistors 43 using contact plugs CP4. Further, the stripe-shaped second decode interconnects BD2-0 and BD2-1 are formed along the first direction so as to connect the sources of the MOS transistors 44 in the same column. The second block decode interconnects BD2-0 and BD2-1 are formed using the first metal interconnect layer and are connected to the MOS transistors 44 using contact plugs CP6.

Moreover, the stripe-shaped first global word line GWL1 is formed along the second direction so as to connect the gates of the MOS transistors 44 in the same row. The first global word line GWL1 is formed using the third metal interconnect layer and is connected to the MOS transistors 44 using contact plugs CP5. One end of the first global word line GWL is connected to the level shifter 41. The other end of the first global word line GWL passes over the memory cell array 26 and reaches another local row decoder 27 on the same row. Further, a stripe-shaped metal interconnect layers 72 is formed along the second direction so as to connect the drains of the MOS transistors 43 and 44 in the same row. The metal interconnect layer 72 is formed using the second metal interconnect layer and is connected to the MOS transistors 43 and 44 using contact plugs CP7 and CP8. Moreover, the metal interconnect layer 72 is connected to the local word line WL using a contact plug CP9. Further, the stripe-shaped second metal interconnect layer along the second direction is used to form the second global word lines GWL2-0 to GWL2-m. Each of the second global word lines GWL2-0 to GWL2-m is connected to the gate 70 of the corresponding MOS transistor 43 using a contact CP3.

Figure 10:
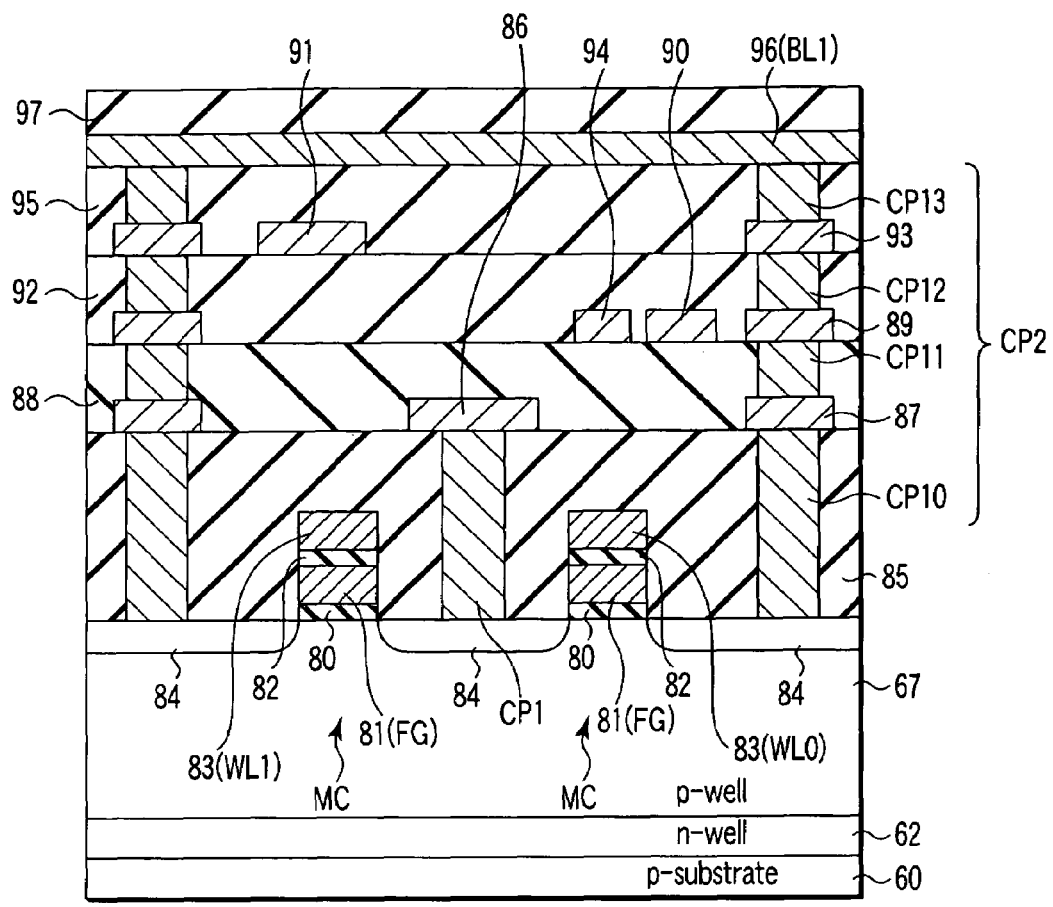
FIG. 10 is a sectional view along the direction of line 10-10 in FIG. 9.
Figure 11:
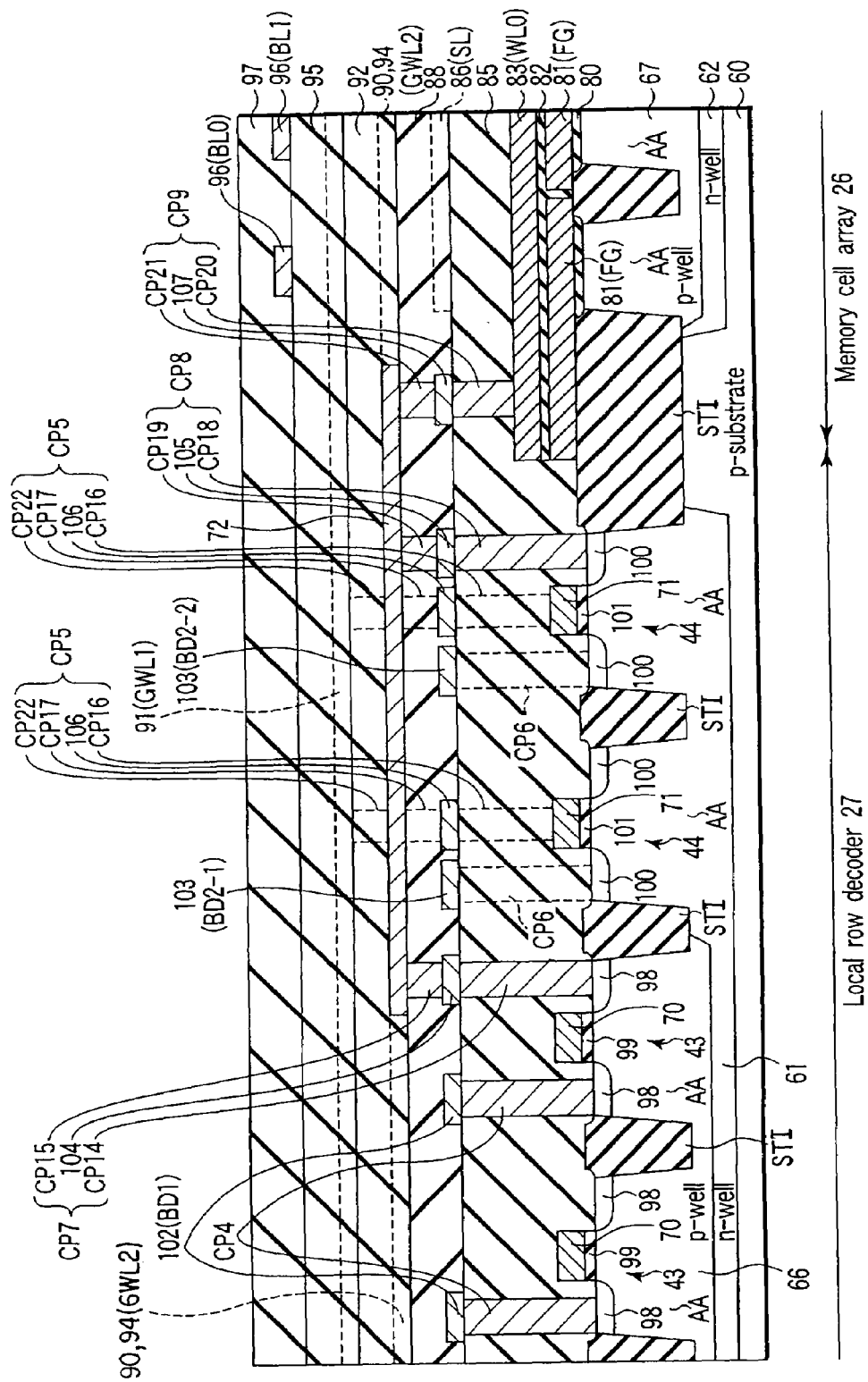
FIG. 11 is a sectional view along the direction of line 11-11 in FIG. 9.

Now, description will be given of the sectional structure of the memory cell array 26 and local decoder 27. First, the structure of the memory cell array 26 will be described. FIG. 10 is a sectional view taken along line 10-10 in FIG. 9. FIG. 11 is a sectional view taken along line 11-11 in FIG. 9. The description below focuses on the memory core 11 but also applies to the other memory cores 12 to 14.

As shown in the figures, the n-type well region 62 is formed in a surface region of the p-type semiconductor substrate 60. The p-type well region 67 is formed in a surface region of the n-type semiconductor substrate 62. The gate electrode of the MOS transistor in the memory cell MC is formed on the p-type well region 67 with a gate insulating film 80 interposed therebetween. The gate electrode of the memory cell MC has a polycrystalline silicon layer (floating gate) 81 formed on the gate insulating film 80, an inter-gate insulating film 82 formed on the polycrystalline silicon layer 81, and a polycrystalline silicon layer (control gate) 83 formed on the inter-gate insulating film 82. The floating gate 81 is separated into pieces for individual memory cells as shown in FIG. 11. On the other hand, the control gates 83 of the memory cells in the same row are connected together. An impurity diffusion layer 84 is formed in a surface of the p-type well region 67 located between the adjacent gate electrodes. The impurity diffusion layer 84 is shared by the adjacent transistors.

An inter-layer insulating film 85 is formed on the p-type well region 67 so as to cover the memory cell. The contact plug CP1 is formed in the interlayer insulating film 85 so as to reach the impurity diffusion layer (source region) 84 shared by the two memory cells MC. A metal interconnect layer 86 connected to the contact plug CP1 is formed on the interlayer diffusion layer 85. The metal interconnect layer 86 functions as the source line SL. A contact plug CP10 is formed in the interlayer insulating film 85 so as to reach the impurity diffusion layer (drain region) 84 shared by the two memory cells (MC). A metal interconnect layer 87 connected to the contact plug CP10 is formed on the interlayer insulating film 85.

An interlayer insulating film 88 is formed on the interlayer insulating film 85 so as to cover the metal interconnect layers 86 and 87. A contact plug CP11 reaching the metal interconnect layer 87 is formed in the interlayer insulating film 88. A metal interconnect layer 89 connected to the contact plug CP11 is formed on the interlayer insulating film 88. Metal interconnect layers 90 and 94 are formed on the interlayer insulating film 88. The metal interconnect layers 90 and 94 function as second global word lines.

An interlayer insulating film 92 is formed on the interlayer insulating film 88 so as to cover the metal interconnect layers 89, 90, and 94. A contact plug CP12 reaching the metal interconnect layer 89 is formed in the interlayer insulating film 92. A metal interconnect layer 93 connected to the contact plug CP12 is formed on the interlayer insulating film 92. A metal interconnect layer 91 is formed on the interlayer insulating film 92. The metal interconnect layer 91 functions as a first global word line.

An interlayer insulating film 95 is formed on the interlayer insulating film 92 so as to cover the metal interconnect layers 91 and 93. A contact plug CP13 reaching the metal interconnect layer 93 is formed in the interlayer insulating film 95. A metal interconnect layer 96 connected to the plurality of contact plugs CP13 is formed on the interlayer insulating film 92. The metal interconnect layer 96 functions as a local bit line BL. That is, the contact plugs CP10 to CP13 and the metal interconnect layers 87, 89, and 93 function as the contact plugs CP2 in FIG. 9. An interlayer insulating film 97 is formed on the interlayer insulating film 95 so as to cover the metal interconnect layer 97.

Now, with reference to FIG. 11, description will be given of the sectional structure of the local row decoder 27.

As shown in the figure, the n-type well region 61 is formed in the surface region of the p-type semiconductor substrate 60. The p-type well region 66 is formed in the surface region of the n-type well region 61. The MOS transistor 43 is formed on the p-type well region 66. That is, impurity diffusion regions 98 functioning as a source and a drain are formed in the surface of the p-type well region 66. The gate electrode 70 is formed on the well region 66 between the adjacent impurity diffusion layers 98 with a gate insulating film 99 interposed between the electrode 70 and the well region 66. Further, the MOS transistor 44 is formed on the n-type well region 61. That is, impurity diffusion regions 100 functioning as a source and a drain are formed in the surface of the p-type well region 61. The gate electrode 71 is formed on the well region 61 between the adjacent impurity diffusion layers 100 with a gate insulating film 101 interposed between the electrode 71 and the well region 61. The transistors are electrically isolated from each other by an isolation region STI.

The interlayer insulating film 85 is formed on the well regions 61 and 66 so as to cover the MOS transistors 43 and 44. The contact plugs CP4 reaching the sources of the MOS transistors 43 are formed in the interlayer insulating film 85. The metal interconnect layer 102 functions as the first block decode interconnect BD1. A contact plug CP14 reaching the drain of the MOS transistor 43 is also formed in the interlayer insulating film 85. A metal interconnect layer 104 connected to the contact plug CP14 is formed on the interlayer insulating film 85. Moreover, the contact plugs CP6 reaching the sources of the MOS transistors 44 are formed in the interlayer insulating film 85. Metal interconnect layers 103 connected to the contact plugs CP6 are formed on the interlayer insulating film 85. The metal interconnect layers 103 function as the block decode interconnects BD2. A contact plug CP18 reaching the drain of the MOS transistor 44 is also formed in the interlayer insulating film 85. A metal interconnect layer 105 connected to the contact plug CP18 is formed on the interlayer insulating film 85. Moreover, contact plugs CP16 reaching the gate electrodes 71 of the MOS transistors 44 are also formed in the interlayer insulating film 85. Metal interconnect layers 106 connected to the contact plugs CP16 are formed on the interlayer insulating film 85.

The interlayer insulating film 88 is formed on the interlayer insulating film 85. Contact plugs CP15, CP19, and CP17 are formed in the interlayer insulating film 88 so as to reach the metal interconnect layers 104, 105, and 106, respectively. The metal interconnect layer 72, connected to the contact plugs CP15 and CP19, is formed on the interlayer insulating film 88. That is, the contact plugs CP14 and CP15 and metal interconnect layer 104 correspond to the contact plug CP7 in FIG. 9. In addition, the contact plugs CP18 and CP19 and metal interconnect layer 105 correspond to the contact plug CP8 in FIG. 9.

A contact plug CP20 is formed in the interlayer insulating film 85 at the boundary between the local row decoder 27 and the memory cell array 26. A metal interconnect layer 107 is formed on the interlayer insulating film 85. A contact plug CP21 is formed in the interlayer insulating film 88. The contact plugs CP20 and CP21 and metal interconnect layer 107 connect the metal interconnect layer 72 to the control gate 83. That is, the contact plugs CP20 and CP21 and metal interconnect layer 107 function as the contact plug CP9 in FIG. 9.

Further, the second global word line GWL2 is formed on the interlayer insulating film 88 in a region not shown in the figures. The second global word line GWL2 is connected, in a region not shown in the figures, to the gate electrodes 70 of the corresponding MOS transistors using the contact plugs CP3.

The interlayer insulating film 92 is formed on the interlayer insulating film 88. Contact plugs CP22 connected to the contact plugs CP17 are formed in the interlayer insulating film 92. The metal interconnect layer 91 is formed on the interlayer insulating film 92. The metal interconnect layer 91 functions as the first global word line GWL1. The contact plugs CP17 on the same row are connected to the same first global word line GWL1 (metal interconnect layer 91). That is, the contact plugs CP16, CP17, and CP22 and metal interconnect layer 106 function as the contact plug CP5 in FIG. 9.

The interlayer insulating film 95 is formed on the interlayer insulating film 92. The metal interconnect layers 95 and 93, constituting bit lines, are formed on the interlayer insulating film 95.

Now, description will be given of operations of the NOR type flash memory configured as described above.

<Write Operation>

A write operation will first be described. For example, in the configuration shown in FIG. 2, if memory cells MC00 to MC07 are selected for a write operation, VPP1 (9 V) is applied to the local word line WL0, shared by these memory cells, while 0 V is applied to the other local word lines. The local word lines in the unselected memory cell arrays are also at 0 V.

The voltage applied to the local bit line depends on write data. A voltage Vdp (5 V) is applied to the local bit line to which data "0" is written, whereas 0 V is applied to the local bit line to which data "1" is written. The source line SL is set at 0 V. The bit lines in the unselected memory cell arrays are at 0 V.

In memory cells with their gate set at VPP1 and their drain set at Vdp, some electrons moving from the source to the drain have high energy (hot electrons). These electrons reach the floating gate owing to an electric field acting toward the gate. In this manner, memory cells in a "1" state in which the floating gate contains a relatively small number of electrons replace those in a "0" state in which the floating gate contains a relatively large number of electrons.

In memory cells in which the gate and the drain have a voltage relationship different from that described above, no drain current flows, with the data in the memory cells remaining unchanged.

<Read Operation>

Now, a read operation will be described. In the configuration shown in FIG. 2, if the memory cells MC00 to MC07 are selected for a data read operation, a voltage Vcc2 (4.75 V) is applied to the local word line WL0, shared by these memory cells. The other local word lines are set at 0 V. The local word lines in the unselected memory cell arrays are also at 0 V.

A voltage Vd (1 V) is applied to the selected local bit line, whereas 0 V is applied to the unselected local bit lines. The source line SL is set at 0 V. Then, a current flows through memory cells in the "1" state, whereas no current flows through memory cells in the "0" state. By sensing this state, it is possible to read the data "0" or "1".

<Erase Operation>

Now, an erase operation will be described. All the data in the memory cell array is erased at a time. On this occasion, all the local word lines in the selected memory cell array are set at VBB (−7 V). The p-type well region 67 and the n-type well region 62 are set at VPP2 (11 V). The source line and the local bit line are floating. Then, a high electric field is applied to the gate insulating film 80. The electrons in the floating gate 81 are withdrawn to the p-type well region 67 owing to FN tunneling. As a result, the data in the memory cell becomes "1". In this case, since the p-type well region and word line in the unselected memory core are at 0 V, the data is not erased.

The method for erasing data may involve applying a bias voltage to the source rather than applying a voltage to the well region as described above. In this case, a tunnel current flows through the overlap portion between the source and gate to erase the data.

<Erase Verify Operation>

The data erasure shifts the threshold voltages for all the memory cells from data "0" toward data "1". Subsequently, an erase verify operation is performed to check whether or not the upper limit on the threshold voltage for the erased cell is at most a predetermined value VEV (for example, 3.5 V). Therefore, the erase verify operation is performed by applying the voltage VEV to the selected local word line WL to perform a read operation.

Figure 12:
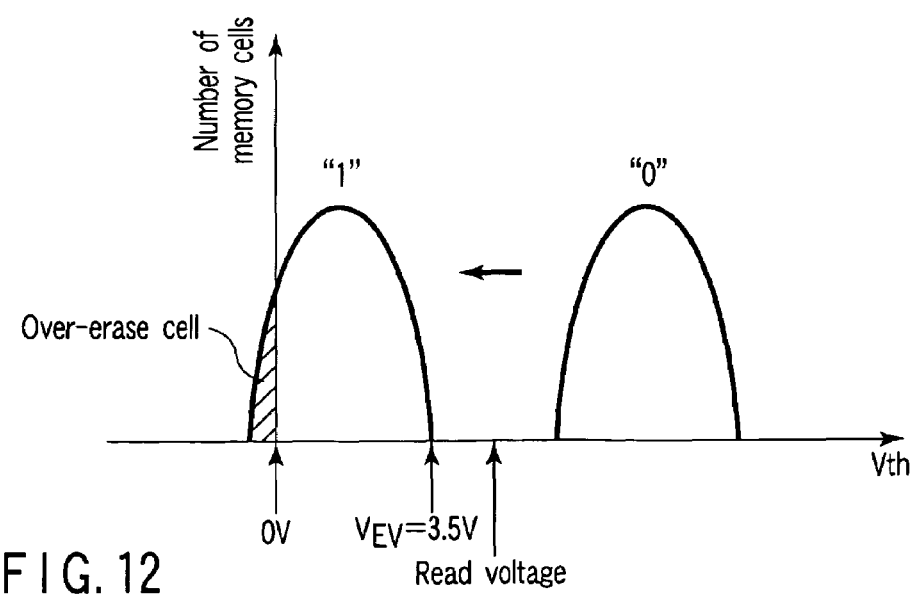
FIG. 12 is a graph showing the relationship between a threshold voltage and the number of memory cells in the NOR type flash memory according to the first embodiment of the present invention.

FIG. 12 is a graph showing the relationship between a threshold voltage Vth for a memory cell and the number of memory cells. In a flash memory such as a NOR type which has no select transistor, the threshold voltage may have a negative value (this is called an "over-erase" cell) as shown in FIG. 12. Thus, for an erase verify operation, to eliminate the adverse effects of the over-erase cell, that is, to reliably keep the over-erase cell off, for example, −1.5 V is applied to the unselected local word lines WL.

Now, with reference to FIGS. 13 to 16, a detailed description will be given of operations of the global row decoders 21a and 21b and local row decoder 27 during the read operation, write operation, erase operation, and erase verify operation. FIGS. 13 to 16 are circuit diagrams of the global row decoder 21a and the memory cell arrays 26 and local row decoders 27 in the memory cores 11 and 12. In the description below, the memory core 11 is selected, and for the read operation, write operation, and erase verify operation, the local word line WL0 in the memory core 11 is selected.

<Read Operation>

Figure 13:
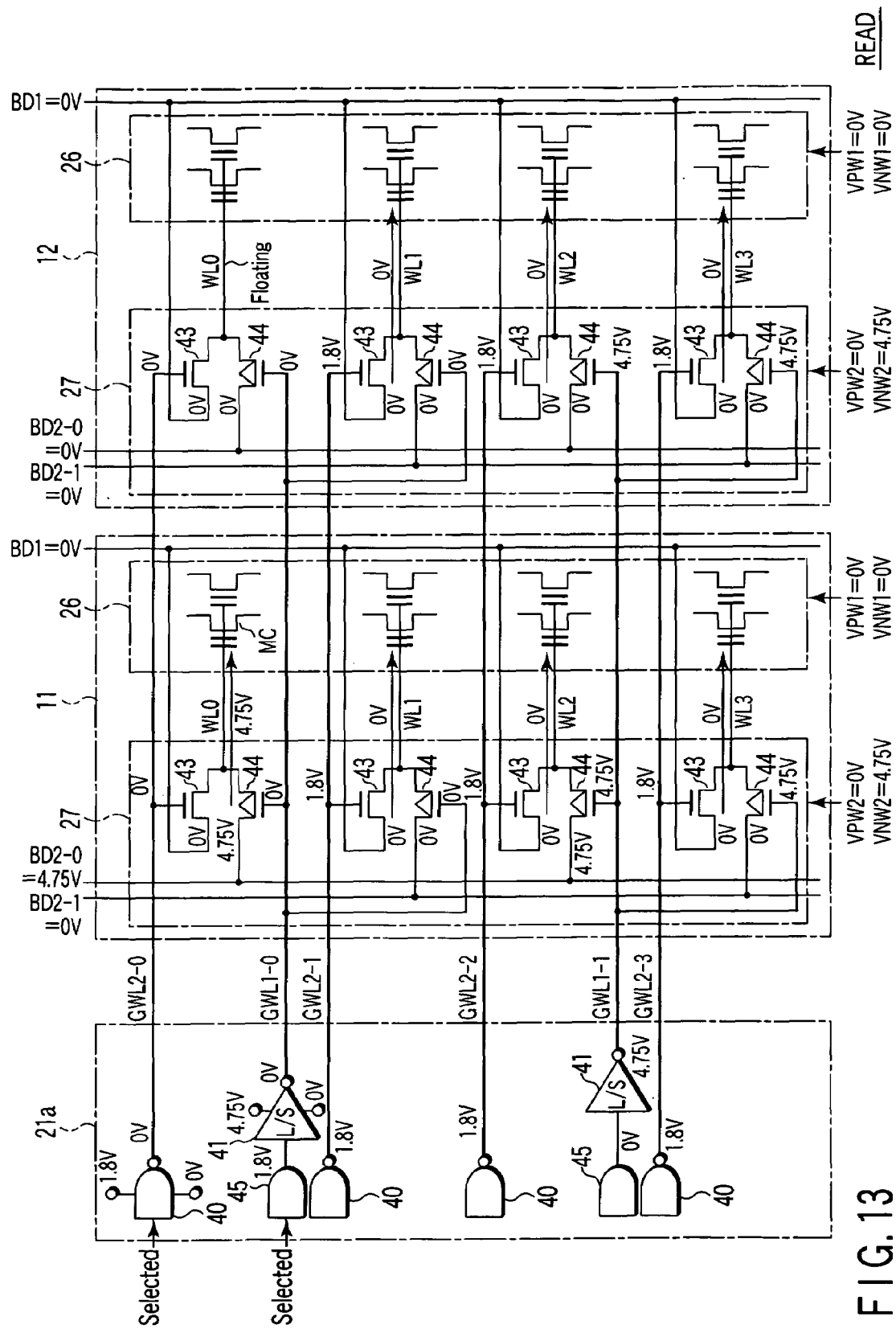
FIG. 13 is a circuit diagram of the global row decoder, local row decoder, and memory cell array provided in the NOR type flash memory according to the first embodiment of the present invention, the diagram showing how a read operation is performed.

First, the read operation will be described with reference to FIG. 13. When a row address signal corresponding to the local word line WL0 (selected local word line) is provided, the outputs from the row address decode circuits 40 and 45 corresponding to the selected local word line WL0 are set to an "L" level (0 V) and an "H" level (1.8 V), respectively. On the other hand, the outputs from the row address decode circuits 40 and 45 corresponding to the other local word line WL1 to WLm (unselected word lines) are set to the "H" and "L" levels, respectively. That is, the first global word line GWL1-0 is set to the "L" level (0 V), while the other first global word lines are set to the "H" level (4.75 V). The second global word line GWL2-0 is set to the "L" level (0 V), while the other second global word lines are set to the "H" level (1.8 V).

Further, the block decoder 19 supplies a voltage VPW2 of 0 V and a voltage VNW2 of 4.75 V. Moreover, the block decoder 19 applies 0 V to the block decode interconnect BD1 in the selected memory core 11. The block decoder 19 applies 4.75 V and 0 V to the block decode interconnects BD2-0 and BD2-1, respectively, in the selected memory core 11. The block decoder 19 applies 0 V to the block decode interconnects BD1, BD2-0, and BD2-1 in the unselected memory core 12.

Then, in the selected memory core 11, the MOS transistor 43 corresponding to the selected local word line WL0 is turned off. The MOS transistor 44 corresponding to the selected local word line WL0 is turned on. Consequently, the potential (4.75 V) of the second block decode interconnect BD2-0 is applied to the local word line WL0. For the unselected local word lines WL1 to WLm, the MOS transistor 43 is turned on, while the MOS transistor 44 is turned off. Consequently, the potential (0 V) of the block decode interconnect BD1 is applied to the local word lines WL1 to WLm.

In the unselected memory core 12, both MOS transistors 43 and 44 corresponding to the local word line WL0 are turned off. Accordingly, the local word line WL0 is at floating state electrically. For the other local word lines WL1 to WLm, the MOS transistor 43 is turned on, while the MOS transistor 44 is turned off. Consequently, the potential (0 V) of the block decode interconnect BD1 is applied to the local word lines WL1 to WLm.

<Write Operation>

Figure 14:
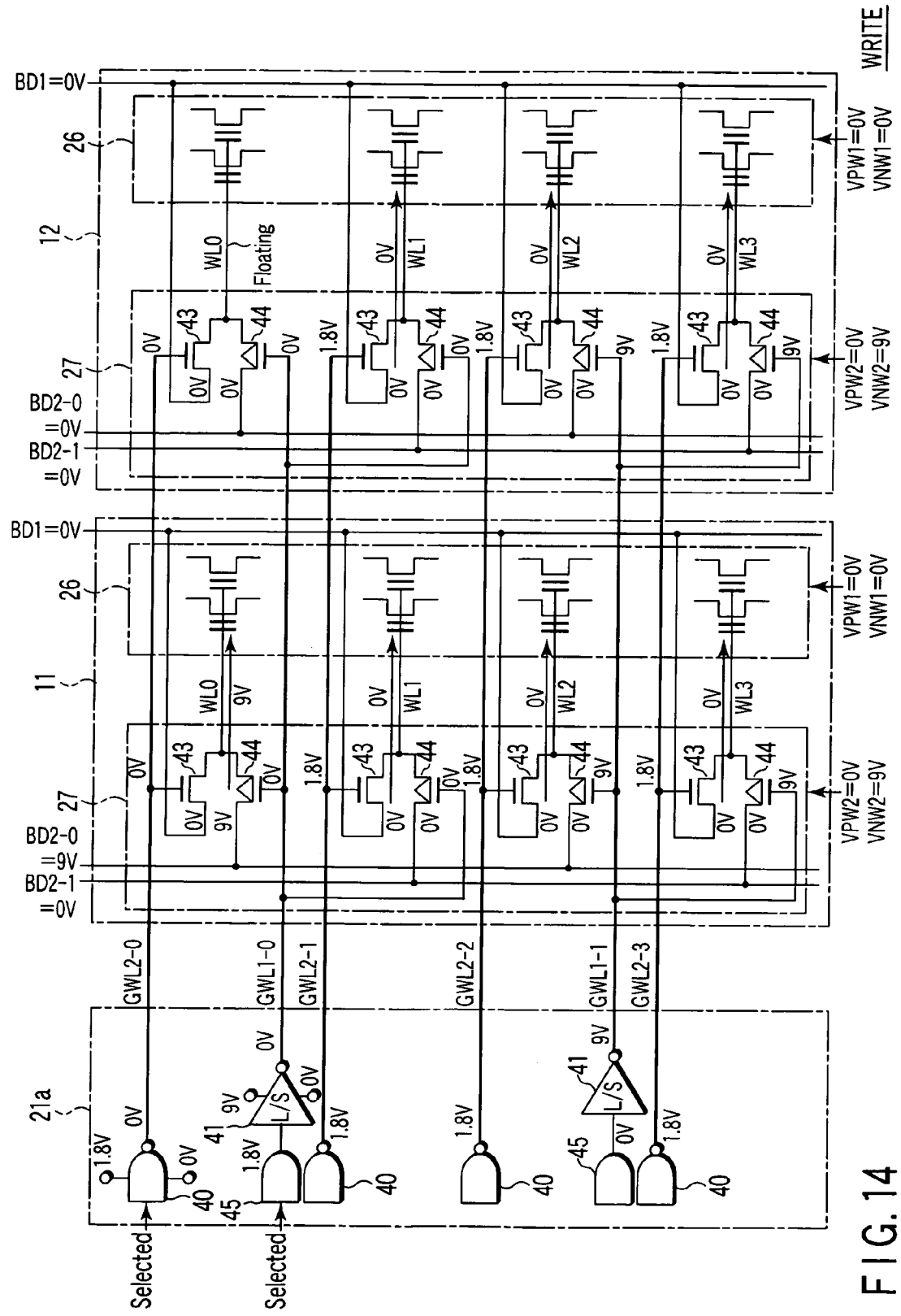
FIG. 14 is a circuit diagram of the global row decoder, local row decoder, and memory cell array provided in the NOR type flash memory according to the first embodiment of the present invention, the diagram showing how a write operation is performed.

Now, the write operation will be described with reference to FIG. 14. When a row address signal corresponding to the selected local word line WL0 is provided, the outputs from the row address decode circuits 40 and 45 corresponding to the selected local word line WL0 are set to the "L" level (0 V) and the "H" level (1.8 V), respectively. On the other hand, the outputs from the row address decode circuits 40 and 45 corresponding to the other local word lines WL1 to WLm are set to the "H" and "L" levels, respectively. That is, the first global word line GWL1-0 is set to the "L" level (0 V), while the other first global word lines are set to the "H" level (9 V). The second global word line GWL2-0 is set to the "L" level (0 V), while the other second global word lines are set to the "H" level (1.8 V).

Further, the block decoder 19 supplies a voltage VPW2 of 0 V and a voltage VNW2 of 9 V. Moreover, the block decoder 19 applies 0 V to the block decode interconnect BD1 in the selected memory core 11. The block decoder 19 applies 9 V and 0 V to the block decode interconnects BD2-0 and BD2-1, respectively, in the selected memory core 11. The block decoder 19 applies 0 V to the block decode interconnects BD1, BD2-0, and BD2-1 in the unselected memory core 12.

Then, in the selected memory core 11, the MOS transistor 43 corresponding to the selected local word line WL0 is turned off. The MOS transistor 44 corresponding to the selected local word line WL0 is turned on. Consequently, the potential (9 V) of the second block decode interconnect BD2-0 is applied to the local word line WL0. For the unselected local word lines WL1 to WLm, the MOS transistor 43 is turned on, while the MOS transistor 44 is turned off. Consequently, the potential (0 V) of the block decode interconnect BD1 is applied to the local word lines WL1 to WLm.

In the unselected memory core 12, both MOS transistors 43 and 44 corresponding to the local word line WL0 are turned off. Accordingly, the local word line WL0 is at floating state electrically. For the other local word lines WL1 to WLm, the MOS transistor 43 is turned on, while the MOS transistor 44 is turned off. Consequently, the potential (0 V) of the block decode interconnect BD1 is applied to the local word lines WL1 to WLm.

<Erase Operation>

Now, the erase operation will be described with reference to FIG. 15. For the erase operation, the outputs from all the row address decoders 40 are set to the "H" level (1.8 V). The outputs from all the row address decode circuits 45 are set to the "L" level (0 V). That is, all the local word lines are unselected, with all the first and second global word lines set to the "H" level (1.8 V). Further, the block decoder 19 supplies a voltage VPW2 of −7 V and a voltage VNW2 of 11 V. Moreover, the block decoder 19 applies −7 V to the block decode interconnect BD1 in the selected memory core 11. The block decoder 19 applies 1.8 V and 0 V to the block decode interconnects BD2-0 and BD2-1, respectively, in the selected memory core 11. The block decoder 19 applies 0 V to the block decode interconnects BD1, BD2-0, and BD2-1 in the unselected memory core 12.

Then, in the selected memory core 11, the MOS transistors 43 corresponding to the local word lines WL0 to WLm are turned on. The MOS transistors 44 corresponding to the local word lines WL0 to WLm are turned off. Consequently, the potential (−7 V) of the block decode interconnect BD1 is applied to the local word lines WL0 to WLm.

In the unselected memory core 12, the MOS transistors 43 and 44 are turned off. Consequently, the local word lines WL0 to WLm are at floating state electrically.

<Erase Verify Operation>

Now, the erase verify operation will be described with reference to FIG. 16. When a row address signal corresponding to the selected local word line WL0 is provided, the outputs from the row address decode circuits 40 and 45 corresponding to the selected local word line WL0 are set to the "L" level (0 V) and the "H" level (1.8 V), respectively. On the other hand, the outputs from the row address decode circuits 40 and 45 corresponding to the other local word lines WL1 to WLm are set to the "H" level (1.8 V) and the "L" level (0 V), respectively. That is, the first global word line GWL1-0 is set to the "L" level (0 V), while the other first global word lines are set to the "H" level (3.5 V). The second global word line GWL2-0 is set to the "L" level (0 V), while the other second global word lines are set to the "H" level (1.8 V).

Further, the block decoder 19 supplies a voltage VPW2 of −3 V and a voltage VNW2 of 3.5 V. Moreover, the block decoder 19 applies −1.5 V to the block decode interconnect BD1 in the selected memory core 11. The block decoder 19 applies 3.5 V and 0 V to the block decode interconnects BD2-0 and BD2-1, respectively, in the selected memory core 11. The block decoder 19 applies 0 V to the block decode interconnects BD1, BD2-0, and BD2-1 in the unselected memory core 12.

Then, in the selected memory core 11, the MOS transistor 43 corresponding to the selected local word line WL0 is turned off. The MOS transistor 44 corresponding to the selected local word line WL0 is turned on. Consequently, the potential (3.5 V) of the second block decode interconnect BD2-0 is applied to the local word line WL0. For the unselected local word lines WL1 to WLm, the MOS transistor 43 is turned on, while the MOS transistor 44 is turned off. Consequently, the potential (−1.5 V) of the block decode interconnect BD1 is applied to the local word lines WL1 to WLm.

In the unselected memory core 12, both MOS transistors 43 and 44 corresponding to the local word line WL0 are turned off. Accordingly, the local word line WL0 is at floating state electrically. For the other local word lines WL1 to WLm, the MOS transistor 43 is turned on, while the MOS transistor 44 is turned off. Consequently, the potential (0 V) of the block decode interconnect BD1 is applied to the local word lines WL1 to WLm.

As described above, the effects described below can be produced by the NOR type flash memory according to the first embodiment of the present invention.

(1) Size of Row Decoder can be Reduced (First Aspect)

The NOR type flash memory according to the present embodiment comprises the global row decoders 21a and 21b and the local row decoder 27.

In the conventional NOR type flash memory, the local row decoder requires at least three MOS transistors as shown in FIG. 5 of Jpn. Pat. Appln. KOKAI Publication No. 2000-49312. This is because a negative voltage must be transferred during the erase operation. According to the technique disclosed in Jpn. Pat. Appln. KOKAI Publication No. 2000-49312, a MOS transistor 51c transfers a negative voltage provided to the well region to the word line WL.

In this regard, the configuration according to the present embodiment enables the local row decoder 27 to be formed by two MOS transistors as shown in FIG. 5. In particular, since the MOS transistors used for the local row decoder are of a high withstand-voltage type and have a relatively large size and the switch group 42 is provided for each word line, the ability to reduce the number of transistors in the switch group 42 contributes greatly to a reduction in the size of the row decoder.

In the present embodiment, to reduce the number of MOS transistors in the local row decoder 27, the block decode interconnects BD1 and BD2 are provided. Moreover, the block decoder 19 controls the potential of the well region of the local row decoder 27. Specifically, the control described below is performed.

In the switch group 42 corresponding to the row address signal, the p-channel MOS transistor 44 transfers the potential of the second block decode interconnect BD2 to the selected word line.

In the switch groups 42 not corresponding to the row address signal, the n-channel MOS transistor 43 transfers the potential of the first block decode interconnect BD1 to the unselected word lines.

To meet the above relationship, the turning-on and -off of the MOS transistors 43 and 44 is controlled using the first and second global word lines GWL1 and GWL2, second block interconnect BD2, and well potential.

Figure 16:
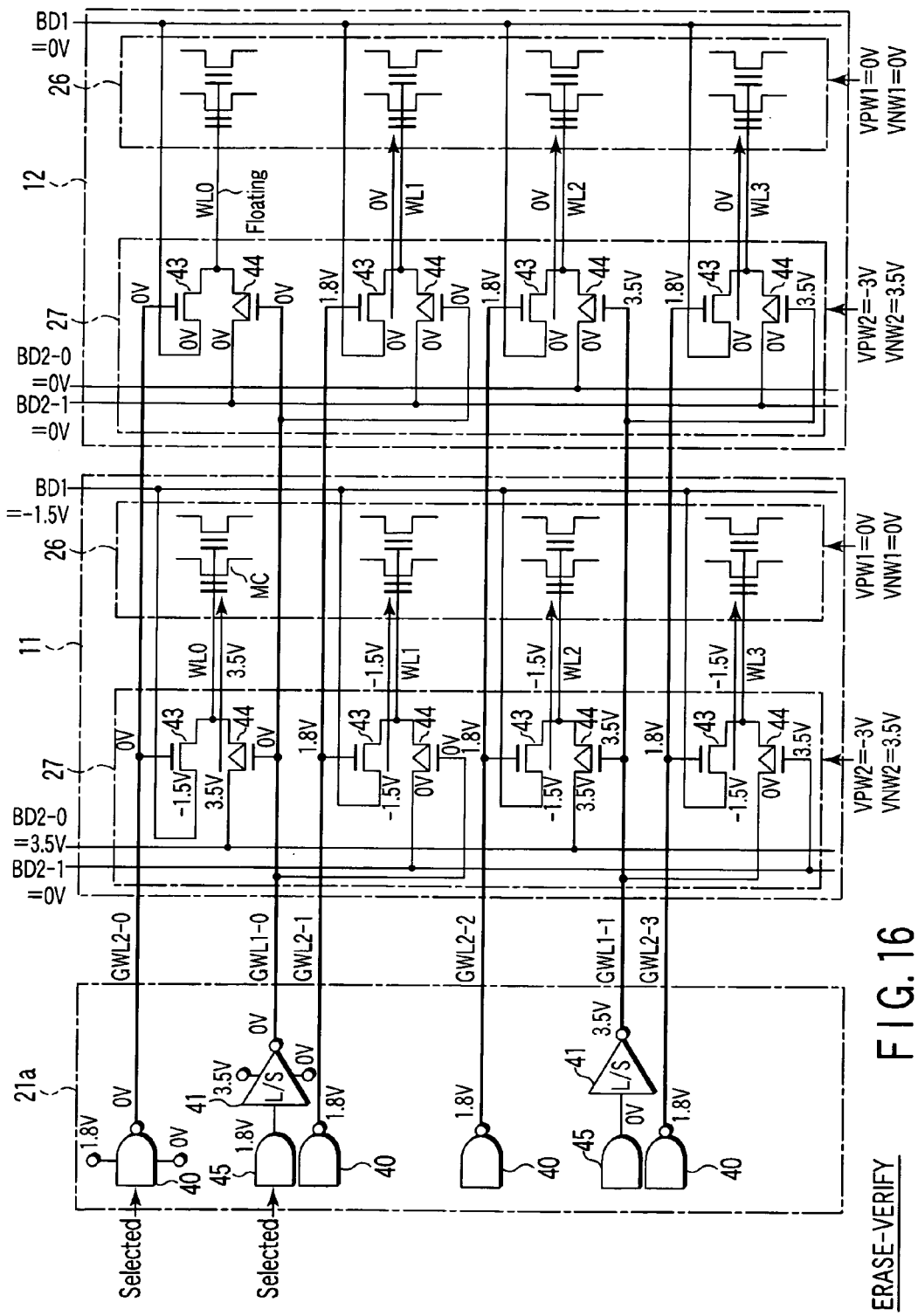
FIG. 16 is a circuit diagram of the global row decoder, local row decoder, and memory cell array provided in the NOR type flash memory according to the first embodiment of the present invention, the diagram showing how an erase verify operation is performed.

For the erase verify operation, the block decoder 19 applies a voltage to the p-type well region which is lower than that of the block decode interconnect BD1 (see FIG. 16). Then, a back gate bias effect raises the threshold voltage for the n-channel MOS transistor 43 corresponding to the selected local word line. This results in a cutoff state. Thus, the p-channel MOS transistor 44 can stably supply a read voltage (3.5 V) to the selected local word line.

Further, in the selected memory core, the block decode interconnects BD2-0 and BD2-1 are provided with complementary signals. In contrast, in the unselected memory core, the block decode interconnects BD2-0 and BD2-1 are provided with the same signal. As a result, in the unselected memory core, the word line connected to the same second global word line as that connected to the selected local word line may be at floating state electrically. That is, no voltage may be applied to the word line. As a result, no voltage stress is imposed on the gate insulating film in the memory cell. This improves the reliability of the memory cell.

(2) Size of Row Decoder can be Reduced (Second Aspect)

In the present embodiment, each of the global row decoder 21*a* and 21*b* comprises the level shifter 41. In the conventional NOR type flash memory, the level shifter is required for each word line as shown in, for example, FIG. 4 of Jpn. Pat. Appln. KOKAI Publication No. 2000-49312.

In this regard, in the configuration according to the present embodiment, two local word lines share one level shifter 41 as shown in FIG. 5. That is, the number of level shifters 41 can be reduced to half compared to that in the conventional art. This makes it possible to reduce the size of the row decoder. The block decode interconnect BD2 must be provided in order to reduce the number of level shifters to half. However, this requires only an interconnect space and does not hinder the reduction in the size of the row decoder.

The configuration according to the present embodiment also enables a reduction in the size of the level shifter 41. In the conventional NOR type flash memory, the level shifter has a two-stage configuration including a first stage composed of MOS transistors 41*b* to 41*g* and a second stage composed of MOS transistors 41*d* to 41*e* as shown in, for example, FIG. 4 of Jpn. Pat. Appln. KOKAI Publication No. 2000-49312. This configuration is required because a negative voltage must be output for an erase operation.

However, in the configuration according to the present embodiment, the n-channel MOS transistor 43 transfers the negative voltage used for the erase operation. Accordingly, the level shifter 41 need not output the negative voltage. Therefore, the configuration of the level shifter 41 can be simplified (the level shifter 41 is composed of only one stage) as shown in FIGS. 6 and 7. This makes it possible to reduce the size of the level shifter 41.

The configuration shown in FIG. 6 enables the level shifter 41 to operate at high speed. This is because the MOS transistors 54 and 55 have only to withstand a voltage lower than that which must be withstood by the MOS transistors 50 to 53 (the MOS transistors 54 and 55 may have a thinner gate insulating film). On the other hand, in the configuration shown in FIG. 7, the MOS transistors 54 and 55 are of the high withstand-voltage type. Consequently, although the level shifter 41 in FIG. 7 operates slower than that in FIG. 6, it does not require the MOS transistors 52 and 53. This makes it possible to further reduce the size of the level shifter.

(3) Size of Row Decoder can be Reduced (Third Aspect)

With the configuration according to the present embodiment, the local row decode circuit 40 controls the gate of the n-channel MOS transistor 43. Accordingly, the MOS transistor in the NAND gate corresponding to the local row decoder circuit 40 has only to withstand a voltage lower than that which must be withstood by the MOS transistors in the level shifter 41 and switch group 42. This also applies to the row address decode circuit 45. This makes it possible to reduce the size of the global row decoders 21*a* and 21*b*.

In the above embodiment, each local word line WL is provided with the NAND gate corresponding to the row address decode circuit 40. However, as shown in FIG. 17, a plurality of local word lines may share one row address decode circuit 40. However, in this case, the unselected local word lines are at floating state electrically. Then, disadvantageously, the local word lines may be subjected to coupling noise or a current may leak from the bit lines. Therefore, the row address decode circuit 40 is preferably provided for each local word line as described in the present embodiment, in view of the stable operation of the circuit.

Now, description will be given of a semiconductor memory device according to the second embodiment of the present invention. The present embodiment is the same as the first embodiment except for decreases in the numbers of row address decode circuits 45 and level shifters 41. FIG. 18 is a circuit diagram of the global row decoder 21*a* and memory cores 11 and 12 in the NOR type flash memory according to the present embodiment.

In the first embodiment, one row address decode circuit 45 and one level shifter 41 are provided for every two local word lines. In contrast, according to the present embodiment, the row address decode circuit 45 and the level shifter 41 are provided for every four local word lines as shown in FIG. 18. That is, four local word lines WL share the first global word line GWL1. In this case, the MOS transistors 44 for the four local word lines WL sharing the first global word line GWL1 are connected to the different second block decode interconnects BD2. The four second block decode interconnects BD2-0 to BD2-3 unselect all the word lines except the selected one.

Figure 19:
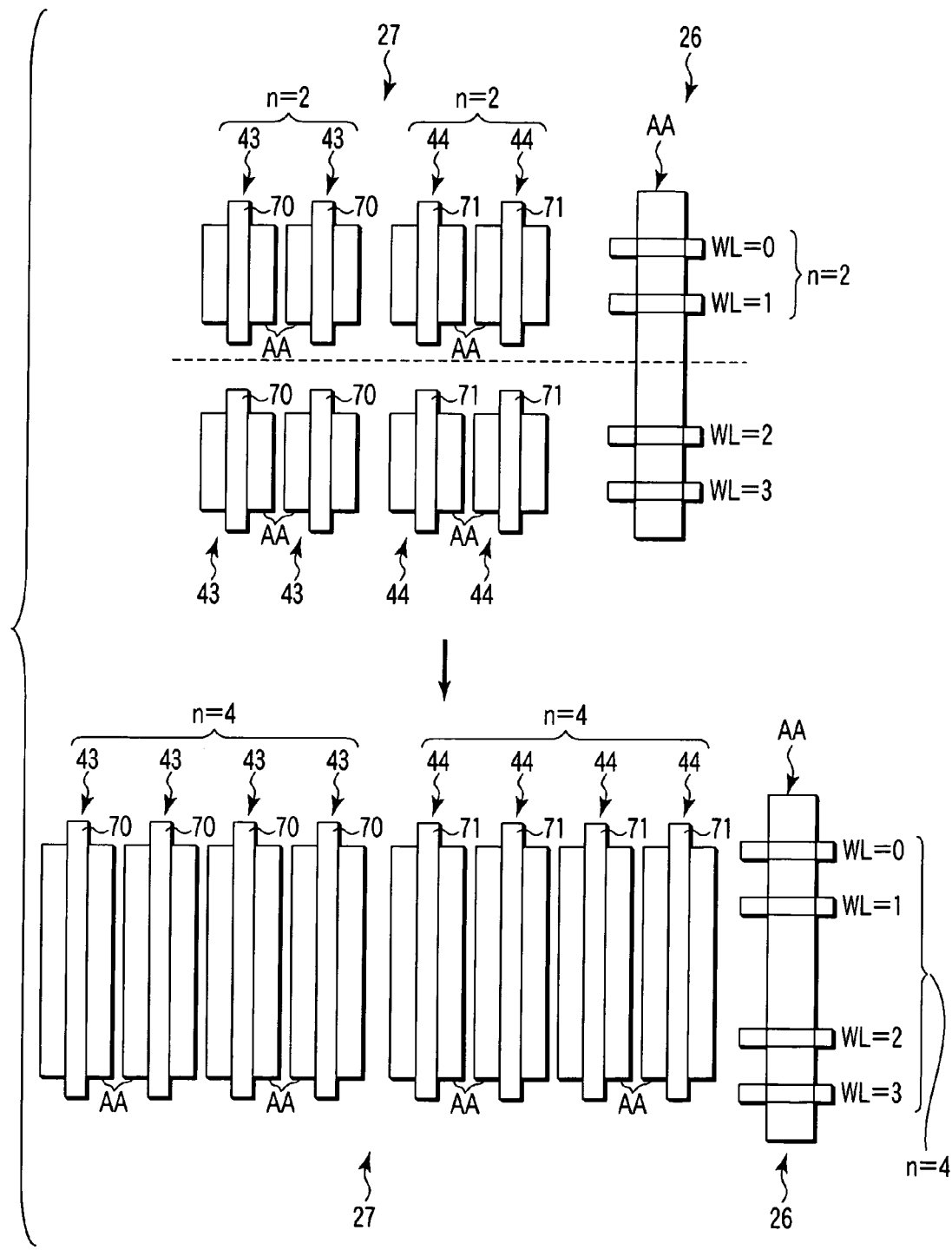
FIG. 19 is a circuit diagram of the global row decoder, local row decoder, and memory cell array provided in the NOR type flash memory according to the second embodiment of the present invention.

FIG. 19 is a plan view of the local row decoder 27 and memory cell array 26 according to the present embodiment. As shown in the figure, the MOS transistors 43 and 44 are arranged adjacent to the memory cell array 26 along the word line direction. The MOS transistors 43 and 44 are arranged in a matrix. In the first embodiment, since two local word lines share one first global word line, the MOS transistors 43 and 44 in one row are arranged for every two local word lines. Each row contains two MOS transistors 43 and two MOS transistors 44. In contrast, according to the present embodiment, four local word lines share one first global word line. Accordingly, the MOS transistors 43 and 44 in one row are arranged for every four local word lines. Each row contains four MOS transistors 43 and four MOS transistors 44.

The sectional configuration of the memory cell and local row decoder is similar to that shown in FIGS. 9 and 10, described in the first embodiment. The difference is that four metal interconnect layers (metal interconnect layers 90 and 94 according to the first embodiment) functioning as the second global word lines GWL2-0 to GWL2-3 are formed on the interlayer insulating film 88 within a four cell pitch.

Now, operations of the NOR type flash memory according to the present embodiment will be described by focusing on the global row decoder 21a and local row decoder 27. FIGS. 20 to 23 are circuit diagrams of the global row decoder 21a and the memory cell array 26 and local row decoder 27 in the memory cores 11 and 12. In the description below, the memory core 11 is selected, and for the read operation, write operation, and erase verify operation, the local word line WL0 in the memory core 11 is selected. Description will be given only of differences from the first embodiment.

<Read Operation>

First, the read operation will be described with reference to FIG. 20. When a row address signal corresponding to the local word line WL0 (selected local word line) is provided, the first global word line GWL1-0 is set to the "L" level (0V). Accordingly, 0 V is applied to the gates of the MOS transistors 44 corresponding to the local word lines WL0 to WL3. The block decoder 19 applies 0 V to the block decode interconnect BD1, 4.75 V to the block decode interconnect BD2-0, and 0 V to the block decode interconnects BD2-1 to BD2-3, in the selected memory core 11. All the block decode interconnects BD2-0 to BD2-3 in the unselected memory core 12 are set to 0 V.

Then, as in the case of the first embodiment, in the selected memory core 11, the MOS transistor 43 corresponding to the selected local word line WL0 is turned off. The MOS transistor 44 corresponding to the selected local word line WL0 is turned on. Consequently, the potential (4.75 V) of the second block decode interconnect BD2-0 is applied to the local word line WL0. For the unselected local word lines WL1 to WLm, the MOS transistor 43 is turned on, while the MOS transistor 44 is turned off. Consequently, the potential (0V) of the block decode interconnect BD1 is applied to the local word lines WL1 to WLm.

<Write Operation>

Figure 21:
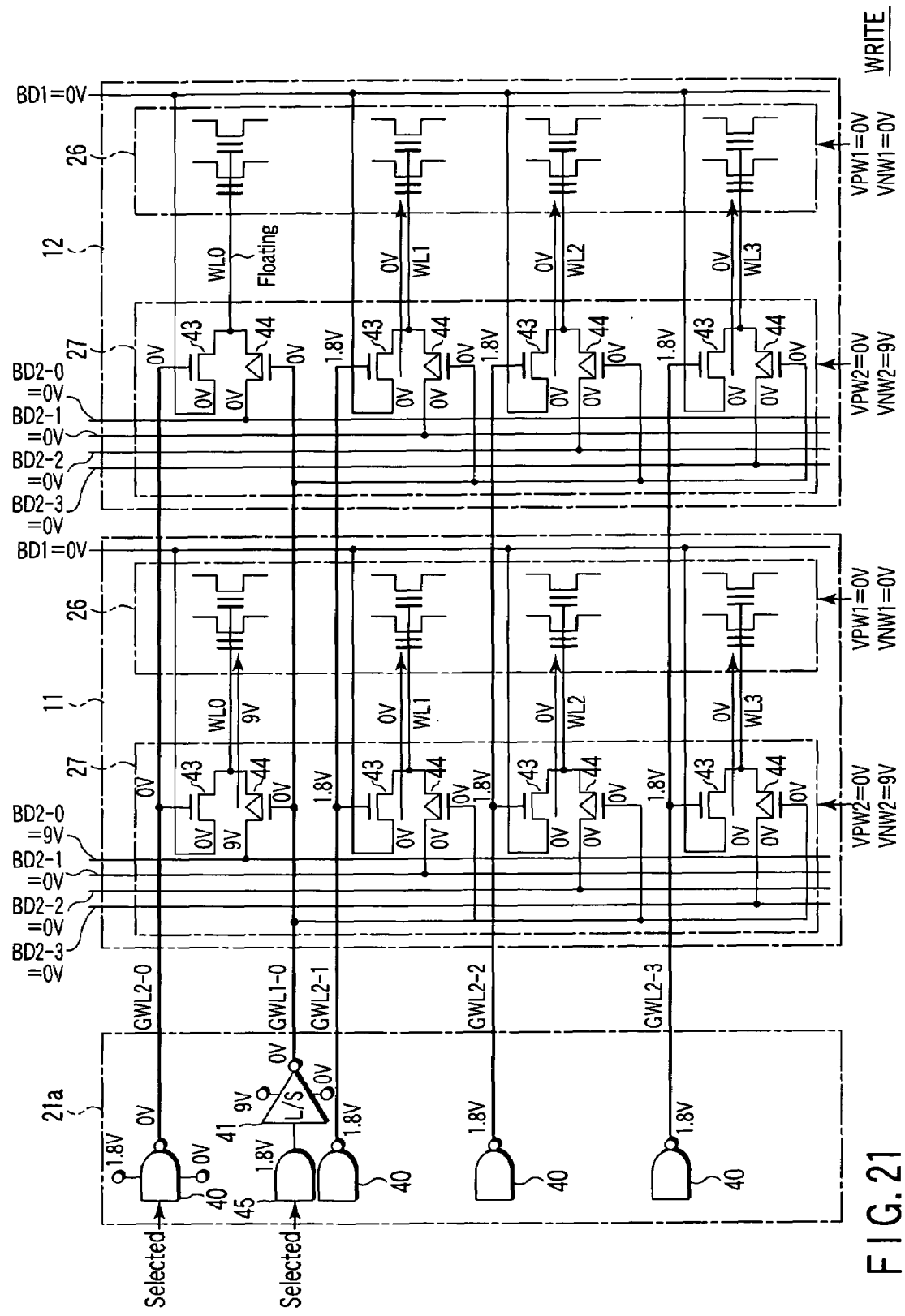
FIG. 21 is a circuit diagram of the global row decoder, local row decoder, and memory cell array provided in the NOR type flash memory according to the second embodiment of the present invention, the diagram showing how a write operation is performed.

Now, the write operation will be described with reference to FIG. 21. When a row address signal corresponding to the selected local word line WL0 is provided, the first global word line GWL1-0 is set to the "L" level (0 V). Accordingly, 0 V is applied to the gates of the MOS transistors 44 corresponding to the local word lines WL0 to WL3. The block decoder 19 applies 0 V to the block decode interconnect BD1, 9 V to the block decode interconnect BD2-0, and 0 V to the block decode interconnects BD2-1 to BD2-3, in the selected memory core 11. All the block decode interconnects BD2-0 to BD2-3 in the unselected memory core 12 are set to 0 V. The block decoder 19 further applies 0 V and 9 V to VPW1 and VNW2, respectively.

Then, as in the case of the first embodiment, in the selected memory core 11, the MOS transistor 43 corresponding to the selected local word line WL0 is turned off. The MOS transistor 44 corresponding to the selected local word line WL0 is turned on. Consequently, the potential (9 V) of the second block decode interconnect BD2-0 is applied to the local word line WL0. For the unselected local word lines WL1 to WLm, the MOS transistor 43 is turned on, while the MOS transistor 44 is turned off. Consequently, the potential (0V) of the block decode interconnect BD1 is applied to the local word lines WL1 to WLm.

<Erase Operation>

Figure 22:
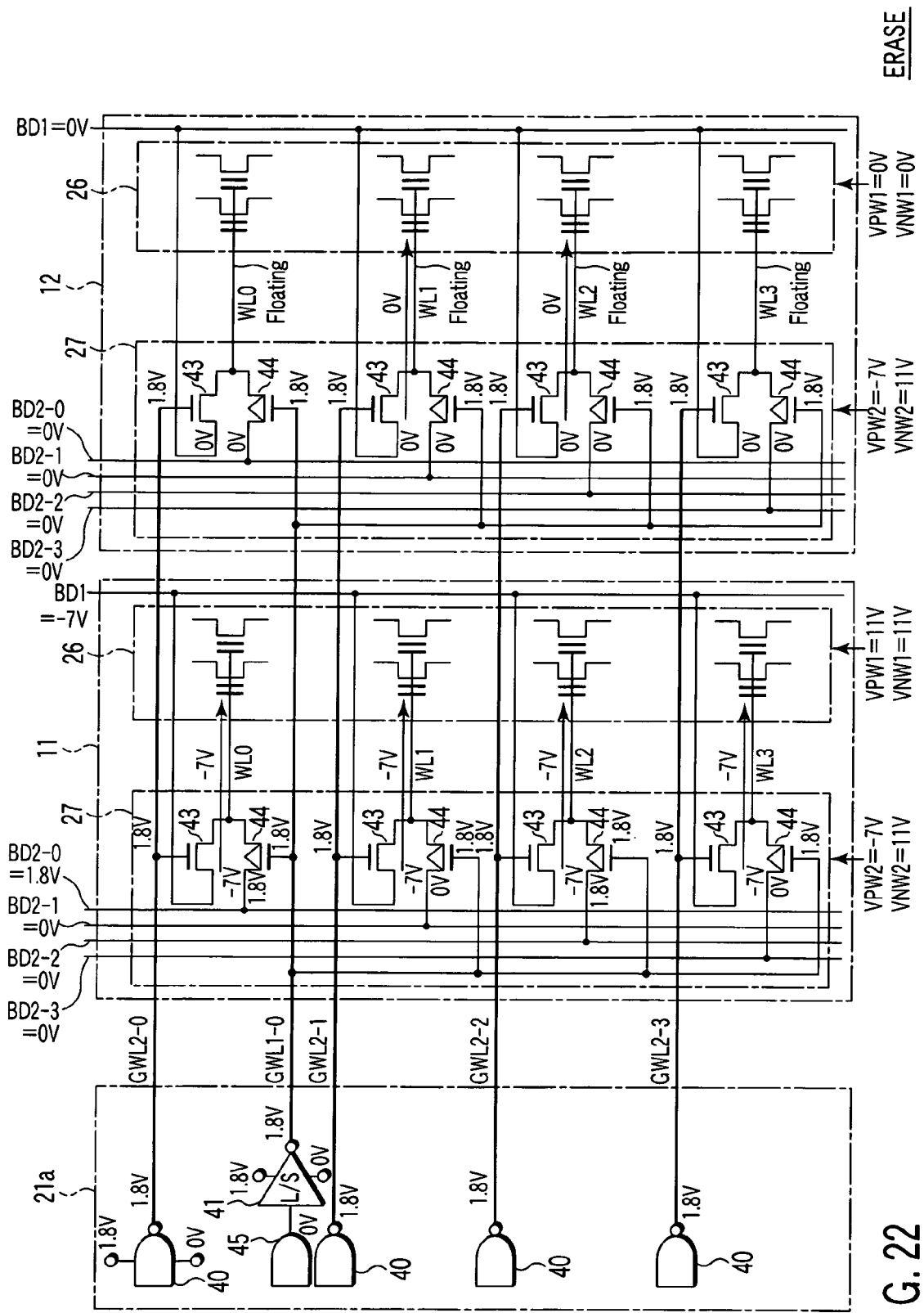
FIG. 22 is a circuit diagram of the global row decoder, local row decoder, and memory cell array provided in the NOR type flash memory according to the second embodiment of the present invention, the diagram showing how an erase operation is performed.

Now, the erase operation will be described with reference to FIG. 22. For the erase operation, all the first and second global word lines are set to the "H" level (1.8 V). The block decoder 19 applies −7 V to the block decode interconnect BD1, 1.8 V to the block decode interconnect BD2-0, and 0 V to the block decode interconnects BD2-1 to BD2-3, in the selected memory core 11. Further, the block decoder 19 applies 0 V to the block decode interconnects BD1 and BD2-0 to BD2-3 in the unselected memory core 12. The block decoder 19 further applies 0 V and 11 V to VPW1 and VNW2, respectively.

Then, as in the case of the first embodiment, in the selected memory core 11, the MOS transistors 43 corresponding to the local word lines WL0 to WLm are turned on. The MOS transistors 44 corresponding to the local word lines WL0 to WLm are turned off. Consequently, the potential (−7V) of the block decode interconnect BD1 is applied to the local word lines WL0 to WLm.

In the unselected memory core 12, the MOS transistors 43 and 44 are turned off. Consequently, the local word lines WL1 to WLm is at floating state electrically.

<Erase Verify Operation>

Figure 23:
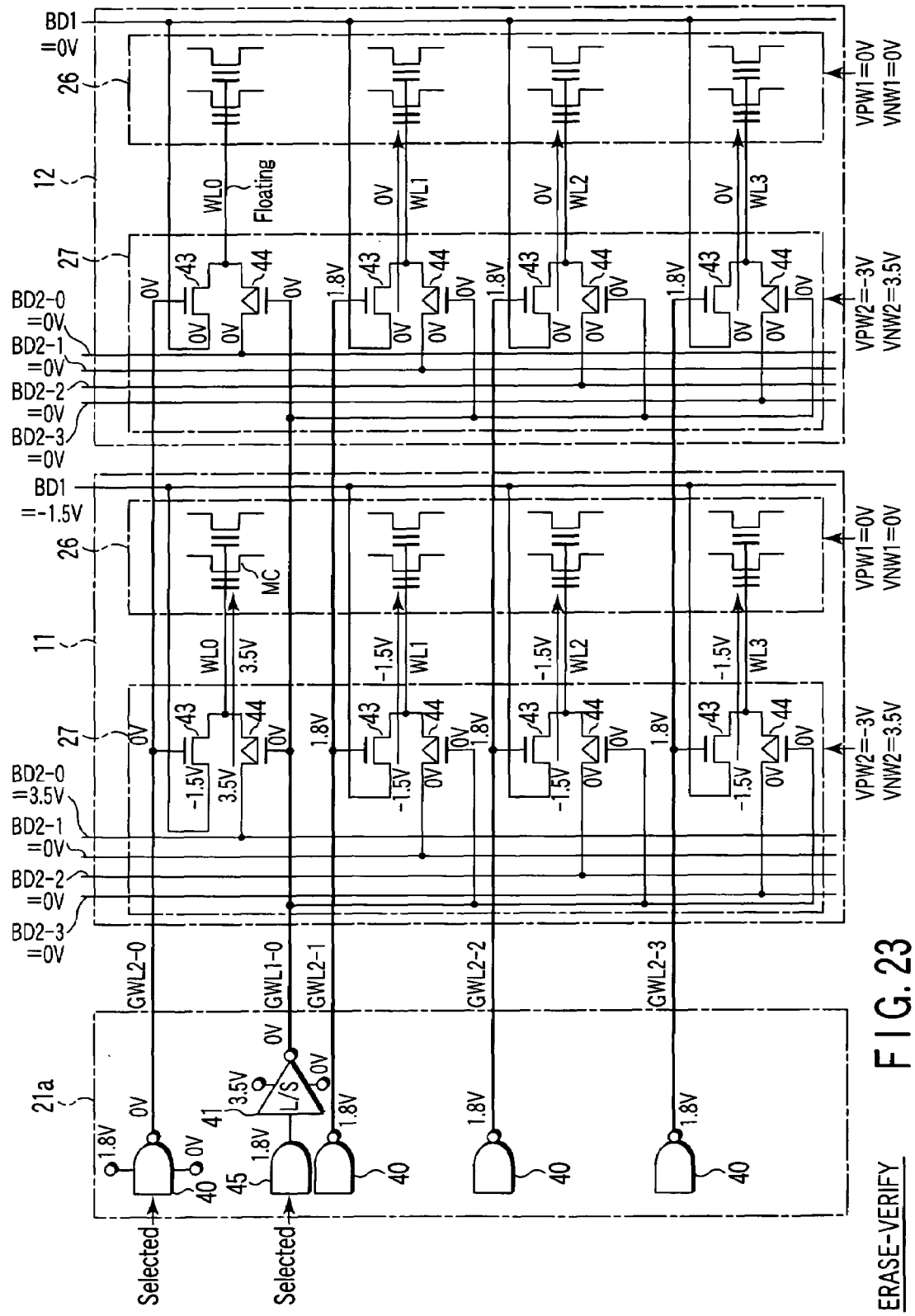
FIG. 23 is a circuit diagram of the global row decoder, local row decoder, and memory cell array provided in the NOR type flash memory according to the second embodiment of the present invention, the diagram showing how an erase verify operation is performed.

Now, the erase verify operation will be described with reference to FIG. 23. When a row address signal corresponding to the selected local word line WL0 is provided, the first global word line GWL1-0 is set to the "L" level (0V). Accordingly, 0 V is applied to the gates of the MOS transistors 44 corresponding to the local word lines WL0 to WL3. The block decoder 19 applies −1.5 V to the block decode interconnect BD1, 3.5 V to the block decode interconnect BD2-0, and 0 V to the block decode interconnects BD2-1 to BD2-3, in the selected memory core 11. The block decoder 19 applies 0 V to the block decode interconnects BD1 and BD2-0 to BD2-3 in the unselected memory core 12.

Then, in the selected memory core 11, the MOS transistor 43 corresponding to the selected local word line WL0 is turned off. The MOS transistor 44 corresponding to the selected local word line WL0 is turned on. Consequently, the potential (3.5 V) of the second block decode interconnect BD2-0 is applied to the local word line WL0. For the unselected local word lines WL1 to WLm, the MOS transistor 43 is turned on, while the MOS transistor 44 is turned off. Consequently, the potential (1.5 V) of the block decode interconnect BD1 is applied to the local word lines WL1 to WLm.

As described above, the semiconductor memory device according to the second embodiment of the present invention produces not only the effects (1) to (3), described in the first embodiment, but also an effect (4) described below.

(4) Size of Row Decoder can be Reduced (Fourth Aspect)

According to the present embodiment, four local word lines share one first global word line GWL1. The present embodiment can thus reduce the number of row address decode circuits 45 and the number of level shifters 41 to half. The size of the global row decoder can be sharply reduced compared to that according to the first embodiment. Further, because of a decrease in the number of parts required for the global row decoder, the present embodiment can be implemented even with a reduction in cell size. The present embodiment is thus particularly effective if the size of the semiconductor memory has further been reduced.

Now, description will be given of a semiconductor memory device according to a third embodiment of the present invention. The present embodiment corresponds to the first embodiment applied to a 2Tr flash memory. Accordingly, the configuration of LSI 10 is almost the same as that shown in FIG. 1. Only the differences from the first embodiment will be described below.

Figure 24:
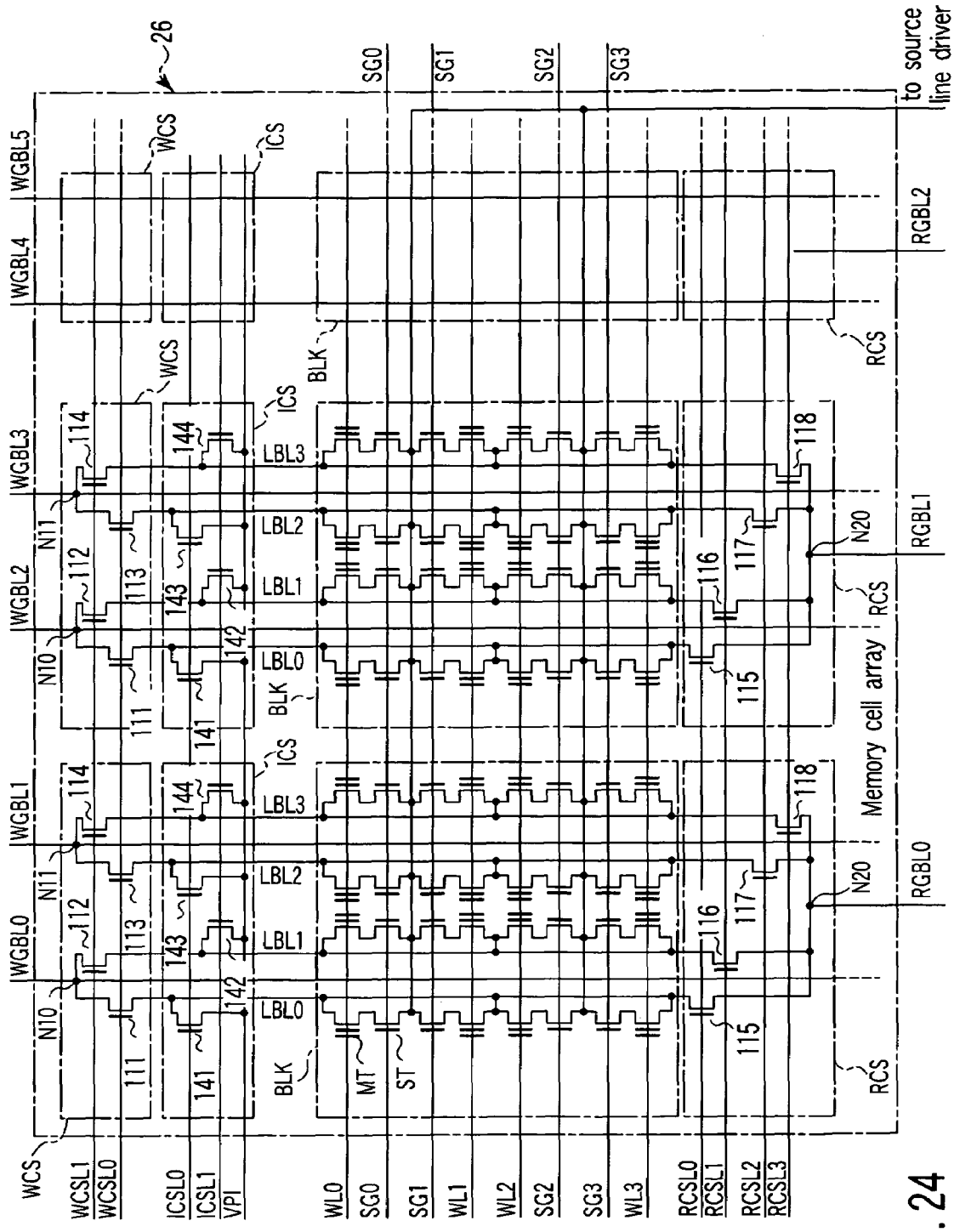
FIG. 24 is a circuit diagram of a memory cell array provided in a 2Tr flash memory according to a third embodiment of the present invention.

FIG. 24 is a circuit diagram of the memory cell array 26 in the 2Tr flash memory according to the present embodiment. As shown in the figure, the memory cell array 26 has ((m+1)×(n+1); m and n are natural numbers) memory block cells BLK and a write column selector WCS, a read column selector RCS, and a write inhibition column selector ICS which are provided for each of the memory blocks BLK.

Each of the memory cell blocks BLK contains a plurality of memory cells MC. The memory cells MC are for a 2Tr flash memory. That is, each of the memory cells MC has one memory cell transistor MT and one select transistor ST. The source of the memory cell transistor MT is connected to the drain of the select transistor ST. The memory cell transistor MT comprises a stacked gate structure having a floating gate formed on the semiconductor substrate with a gate insulating film interposed therebetween and a control gate formed on the floating gate with an inter-gate insulating film interposed therebetween. The memory cells located adjacent to each other across the columns share the drain region of the memory cell transistor MT or the source region of the select transistor ST. Each memory cell block BLK contains (4×4) memory cells MC. In FIG. 24, four memory cells MC are arranged across the columns. However, this number is only illustrative and may be 8, 16, or the like. The number is not limited. Four local bit lines LBL0 to LBL3 connect commonly the drain regions of the memory cell transistors MT in the four memory cells MC arranged in parallel, respectively. The write column selector WCS is connected to one end of each of the local bit lines LBL0 to LBL3. The other end is connected to the read column selector RCS.

In the memory cell array 26, one of the local word lines WL0 to WL(4$m$−1) connects commonly the control gates of the memory cell transistors MT in the same row. One of the select gate lines SG0 to SG(4$m$−1) connects commonly the gates of the select transistors ST in the same row. Each of the local bit lines LBL0 to LBL3 connects commonly the memory cell transistor only in the corresponding memory cell block BLK. In contrast, each word line WL and each select gate line SG connect commonly the memory cell transistors and select transistors, respectively, in the same row even though the transistors belong to the different memory cell blocks. The local word lines WL0 to WL(4$m$−1) are connected to the local row decoder 27. The select gate lines SG0 to SG(4$m$−1) are connected to the global row decoders 21$a$ and 21$b$. Further, the source regions of the select transistors ST in a plurality of memory cell blocks BLK are connected together and connected to the source line driver.

Now, the configuration of the write column selector WCS will be described. Each write column selector WCS comprises four MOS transistors 111 to 114. One end of each of the local bit lines LBL0 to LBL3 is connected to the corresponding end of a current path in the corresponding one of the MOS transistors 111 to 114. The other ends of the current paths through the MOS transistors 111 and 112 are connected together. The other ends of the current paths through the MOS transistors 113 and 114 are connected together. The common connection node between the MOS transistors 111 and 112 will be called a node N10 below. The common connection node between the MOS transistors 113 and 114 will be called a node N11 below. The gates of the MOS transistors 111 to 114 are connected to one of write column select lines WCSL0 to WCSL(2$m$−1). The MOS transistors 111 and 113 included in the write column selectors WCS in the same row are connected to the same write column select line WCSL(i−1) (i:1, 3, 5, . . . ). The MOS transistors 112 and 114 included in the write column selectors WCS in the same row are connected to the same write column select line WCSLi. During the write operation, the local column gate driving units 23$a$ and 23$b$ select any of the write column select lines WCSL0 to WCSL(2$m$−1).

The nodes N10 and N11 in the write column selector WCS are connected to one of write global bit lines WGBL0 to WGBL(2$n$−1). Each of the write global bit lines WGBL0 to WGBL(2$n$−1) connects the nodes N10 or N11 in the write column selectors WCS in the same column. The write global bit lines WGBL0 to WGBL(2$n$−1) are connected to the write circuit 17.

Now, the configuration of the read column selector RCS will be described. Each write column selector RCS comprises four MOS transistors 115 to 118. The other end of each of the local bit lines LBL0 to LBL3 is connected to the corresponding end of a current path in the corresponding one of the MOS transistors 115 to 118, respectively. The other ends of the current paths through the MOS transistors 115 and 118 are connected together. The common connection node between the MOS transistors 115 and 118 will be called a node N20 below. The gates of the MOS transistors 115 to 118 are connected to different read column select lines RCSL0 to RCSL(4$m$−1). Each of groups of MOS transistors 115 to 118 included in the read column selectors WCS in the same row are connected to the same one of the read column select lines RCSL0 to RCSL(4$m$−1). For the read operation, the local column gate driving units 23$a$ and 23$b$ select any of the read column select lines RCSL0 to RCSL(4$m$−1).

The node N20 in the read column selector RCS is connected to one of read global bit lines RGBL0 to RGBL(n−1). Each of the read global bit lines RGBL0 to RGBL(n−1) connects the nodes N20 in the read column selectors WCS in the same column. The read global bit lines RGBL0 to RGBL(n−1) are connected to the sense amplifier 18 via the global column gates 22$a$ and 22$b$.

Now, the configuration of the write inhibition column selector ICS will be described. Each write inhibition column selector ICS comprises four MOS transistors 141 to 144. One end of each of the local bit lines LBL0 to LBL3 is connected to the corresponding end of current path of the MOS transistors 141 to 144, respectively. A write inhibition voltage VPI is applied to the other ends of the current paths through the MOS transistors 141 to 144. The gates of the MOS transistors 141 to 144 are connected to one of write inhibition column select lines ICSL0 to ICSL(2$m$−1). The MOS transistors 141 and 143 included in the write inhibition column selectors ICS in the same row are connected to the same write inhibition column select line ICSL(i−1) (i:1, 3, 5, . . . ). The MOS transistors 142 and 144 included in the write inhibition column selectors ICS in the same row are connected to the same write inhibition column select line ICSLi. For the write operation, the local column gate driving units 23$a$ and 23$b$ select any of the write inhibition column select lines ICSL0 to ICSL(2$m$−1). The numbers of memory cells, read global bit lines RGBL, and write global bit lines WGBL within the memory cell block are not limited to the values in the present example.

In the above configuration, the local column gate 28 in FIG. 1 corresponds to the write column selector WCS, read column selector RCS, and write inhibition column selector ICS.

Figure 25:
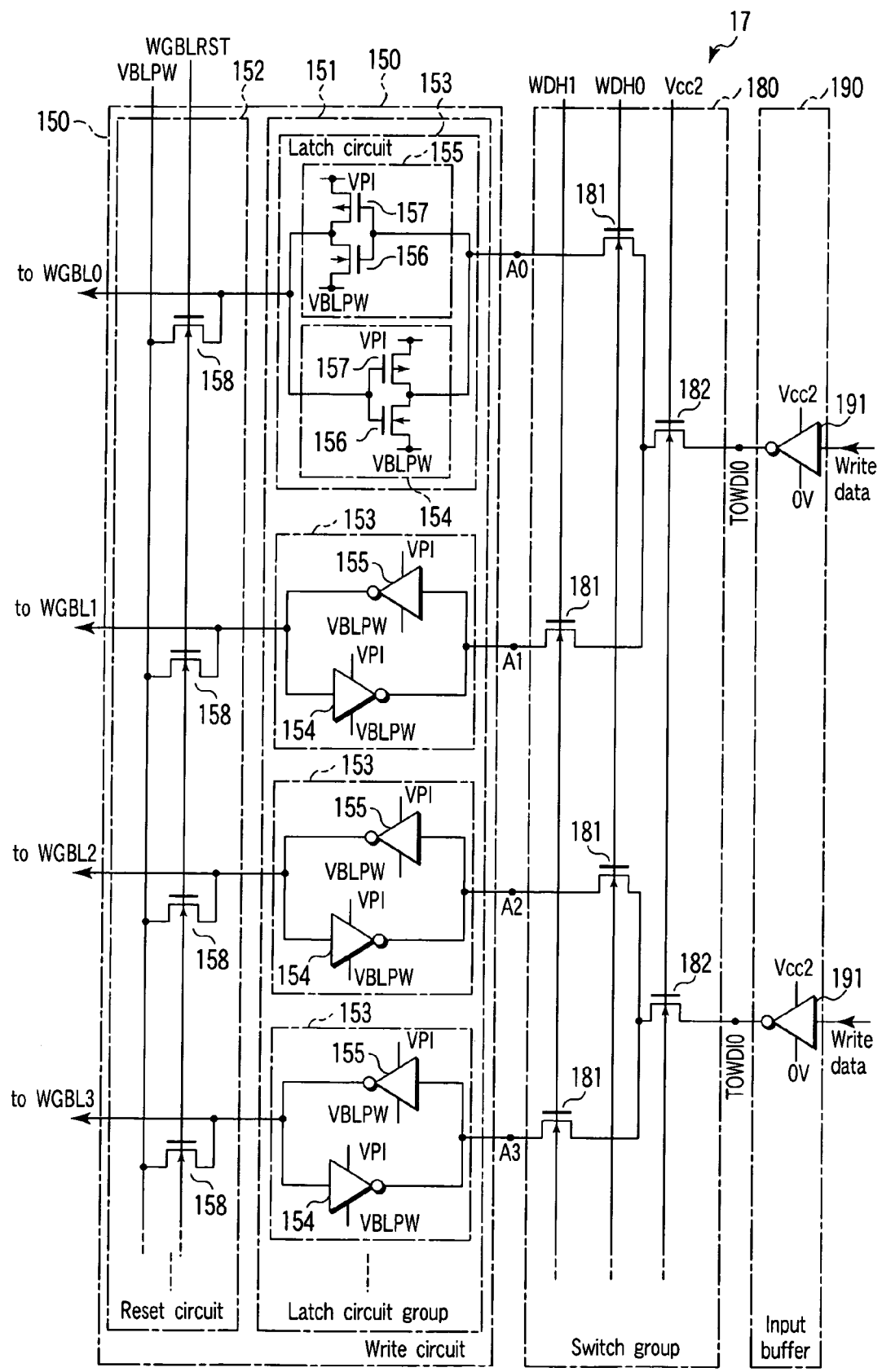
FIG. 25 is a circuit diagram of a write circuit provided in the 2Tr flash memory according to the third embodiment of the present invention.

FIG. 25 is a circuit diagram of the write circuit 17. As shown in the figure, the write circuit 17 comprises a write circuit 150, a switch group 180, and an input buffer 190.

First, the write circuit 150 will be described. The write circuit 150 comprises a latch circuit group 151 and a reset circuit 152. The latch circuit group 151 comprises a latch circuit 153 provided for each of the write global bit lines WGBL0 to WGBL(2$n$−1). The latch circuit 153 comprises two inverters 154 and 155. An input node of the inverter 154 is connected to an output node of the inverter 155. An output node of the inverter 154 is connected to an input node of the inverter 155. The connection node between the input node of the inverter 154 and the output node of the inverter 155 functions as an output node of the latch circuit 153 and is connected to the corresponding write global bit line. Each of the inverters 154 and 155 comprises an n-channel MOS transistor 156 and a p-channel MOS transistor 157 which have respective current paths connected in series. The source of the n-channel MOS transistor 156 is connected to a VBLPW node. The source of the p-channel MOS transistor 157 is connected to a write inhibition voltage node VPI. The gate of the n-channel MOS transistor 156 is connected to the gate of the p-channel MOS transistor 157. The connection node between the drain of the p-channel MOS transistor 157 and the drain of the n-channel MOS transistor 156 in the inverter 155 is connected to the connection node between the gate of the p-channel MOS transistor 157 and the gate of the n-channel MOS transistor 156 in the inverter 154. The connection node between the drain of the p-channel MOS transistor 157 and the drain of the n-channel MOS transistor 156 in the inverter 155 is also connected to the write global bit line. The connection node between the drain of the p-channel MOS transistor 157 and the drain of the n-channel MOS transistor 156 in the inverter 154 is connected to the connection node between the gate of the p-channel MOS transistor 157 and the gate of the n-channel MOS transistor 156 in the inverter 155. The connection node between the drain of the p-channel MOS transistor 157 and the drain of the n-channel MOS transistor 156 in the inverter 154 constitutes an input node of the latch circuit 153.

The reset circuit 152 comprises an n-channel MOS transistor 158 provided for each of the write global bit lines WGBL0 to WGBL(2n−1). The drain of each n-channel MOS transistor 158 is connected to the corresponding write global bit line. The source of each n-channel MOS transistor 158 is connected to the VBLPW node. The gate of each n-channel MOS transistor 158 is connected to a WGBLRST node.

The switch group 180 comprises an n-channel MOS transistor 181 and an n-channel MOS transistor 182 provided for each latch circuit 153. One end of a current path in the MOS transistor 181 is connected to an input node of the corresponding latch circuit. The other ends of the current paths through the two MOS transistors 181 connected to the adjacent latch circuits are connected together. That is, the same terminal is shared, at the other end, by the current paths through the MOS transistors 181 connected to the latch circuits 153 corresponding to the write global bit lines WGBL0 and WGBL1. This also applies to the MOS transistors 181 connected to the latch circuits 153 corresponding to the write global bit lines WGBL2 and WGBL3. A WDH0 node is connected to the gates of the MOS transistors 181 connected to the latch circuits 153 corresponding to the write global bit line WGBL(i−1) (i=1, 3, 5, . . . ). A WDH1 node is connected to the gates of the MOS transistors 181 connected to the latch circuits 153 corresponding to the write global bit line WGBLi. The other ends of the current paths through the MOS transistors 181 connected together are connected to one end of a current path in the MOS transistor 182. A positive voltage Vcc2 is applied to the gates of all the MOS transistors 182. The connection nodes between the MOS transistors 181 and the input nodes of the latch circuits 153 will be called nodes A0 to A(2n−1) below.

Now, the input buffer 190 will be described. The input buffer 190 comprises an inverter 191 provided for each of the MOS transistors 182 in the switch group 180. Write data provided by the address buffer 15 is input to an input node of the inverter 191. An output node of the inverter 191 is connected to the other end of the current path in the corresponding MOS transistor 182. The inverter 191 operates using a high voltage-side power supply potential Vcc2 and a low voltage-side power supply potential of 0 V. The connection nodes between the output nodes of the inverters 191 and the MOS transistors 182 will be called nodes TOWDI0 to TOWDI((2n−1)/2) below.

Figure 26:
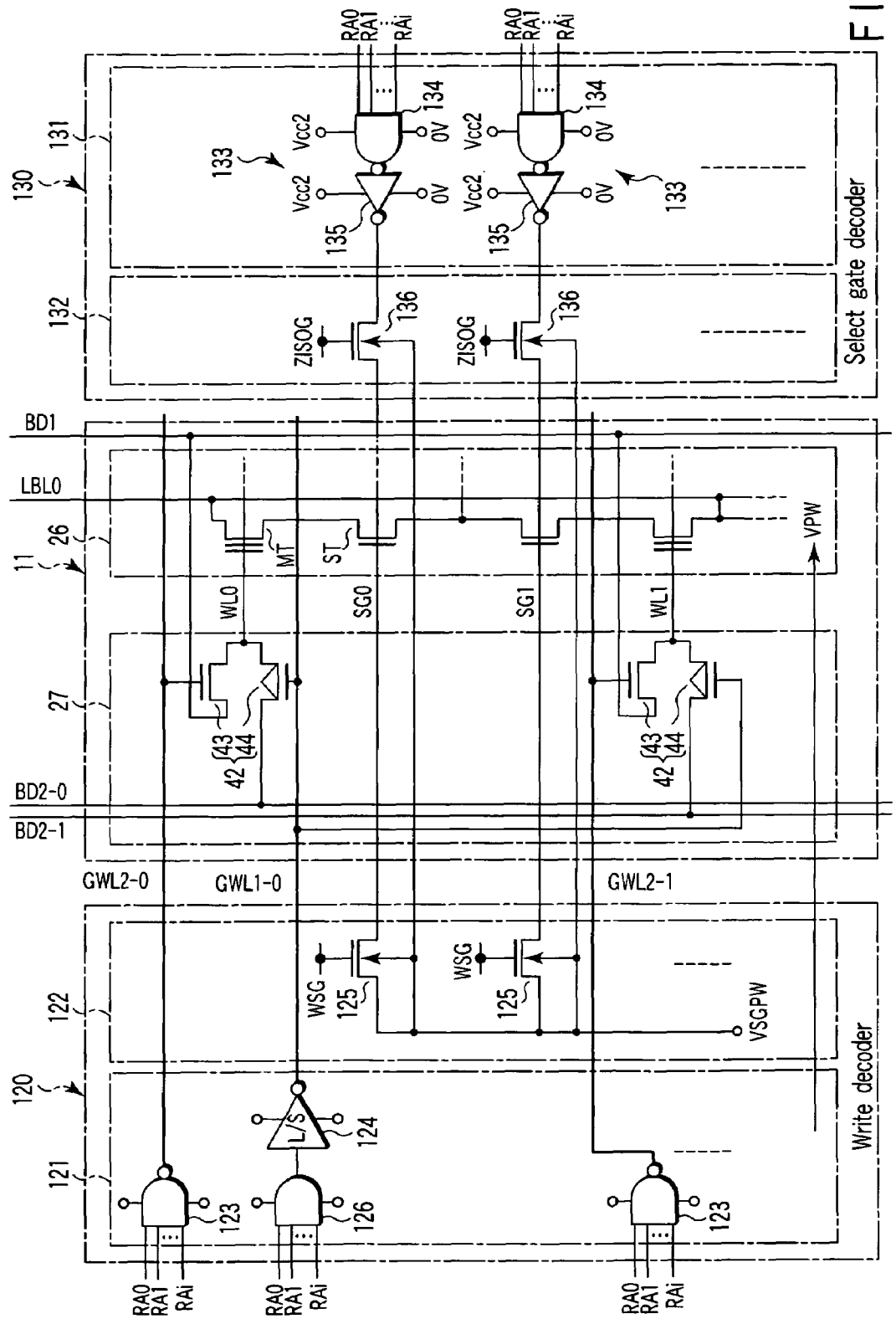
FIG. 26 is a circuit diagram of the memory cell array, a write decoder, and a select gate decoder provided in the 2Tr flash memory according to the third embodiment of the present invention.

FIG. 26 is a circuit diagram of the local row decoder 27, the memory cell array 26, and the global row decoders 21a and 21b. As shown in the figure, each of the global row decoders 21a and 21b includes a write decoder 120 and a select gate decoder 130.

Like the global row decoder described in the first embodiment, the write decoder 120 controls the local row decoder 27. For the write operation, the write decoder 120 applies a negative potential VBB1 (−7 V) to the p-type well region in which the memory cell array is formed as well as select gate lines SG to SG(4m−1). For the erase operation, the write decoder applies a negative potential VBB2 (−8 V) to all the word lines and applies a positive voltage VPP to the p-type well region in which the memory cell array is formed. For the read operation, the select gate decoder 130 selects one of the select gate lines SG to SG(4m−1) to apply the positive voltage Vcc2 to the selected select gate line.

Description will be given of the configuration of the write decoder 120 and select gate decoder 130. The select gate decoder 130 comprises an address decode unit 131 and a switch element group 132. The address decode unit 131 is provided for each select gate line SG and operates at the power supply voltage Vcc2. The address decode unit 131 comprises a row address decode circuit 133 that decodes row address signals RA0 to RAi of (i+1) bits to obtain a row address decode signal. The row address decode circuit 133 comprises a NAND circuit 134 and an inverter 135. The NAND circuit 134 executes a NAND operation on the bits of the row address signals RA0 to RAi. The inverter 135 then inverts the result of the NAND operation to output it as a row address decode signal.

The switch element group 132 has n-channel MOS transistors 136. Each of the n-channel MOS transistors 136 is provided for the corresponding one of the select gate lines SG to SG(4m−1). An output from the inverter 135 is provided to the corresponding one of the select gate lines SG to SG(4m−1) via the current path in the n-channel MOS transistor 136. A control signal ZISOG is input to the gate of the n-channel MOS transistor 136. The control signal ZISOG turns on the MOS transistor 136 for the write and erase operations and turns it off for the read operation.

Now, the configuration of the write decoder 120 will be described. The write decoder 120 comprises an address decode unit 121 and a switch element group 122. The address decode unit 121 comprises row address decode circuits 123 and 126 and a level shifter 124. The row address decode circuit 123 is, for example, a NAND gate provided for each select gate line SG. The row address decode circuit 123 decodes the row address signals RA0 to RAi of (i+1) bits to obtain a row address decode signal. An output from the row address decode circuit 123 is provided to the corresponding one of the second global word lines GWL2-0 to GWL2-(4m−1). The row address decode circuit 126 is, for example, an AND gate provided for every two local word lines. The level shifter 124 is provided for each row address decode circuit 126. The level shifter 124 inverts an output from the row address decode circuit 126 for level shifting. The level shifter 124 then provides the output to the corresponding one of the first global word lines GWL1-0 to GWL1-((4m−1)/2). That is, the row address decode circuits 123 and 126 and level shifter 124 according to the present embodiment correspond to the row address decode circuits 40 and 45 and level shifter 41, described in the first embodiment.

The configuration of the local row decoder 27 is similar to that according to the first embodiment and will thus not be described below.

Figure 27:
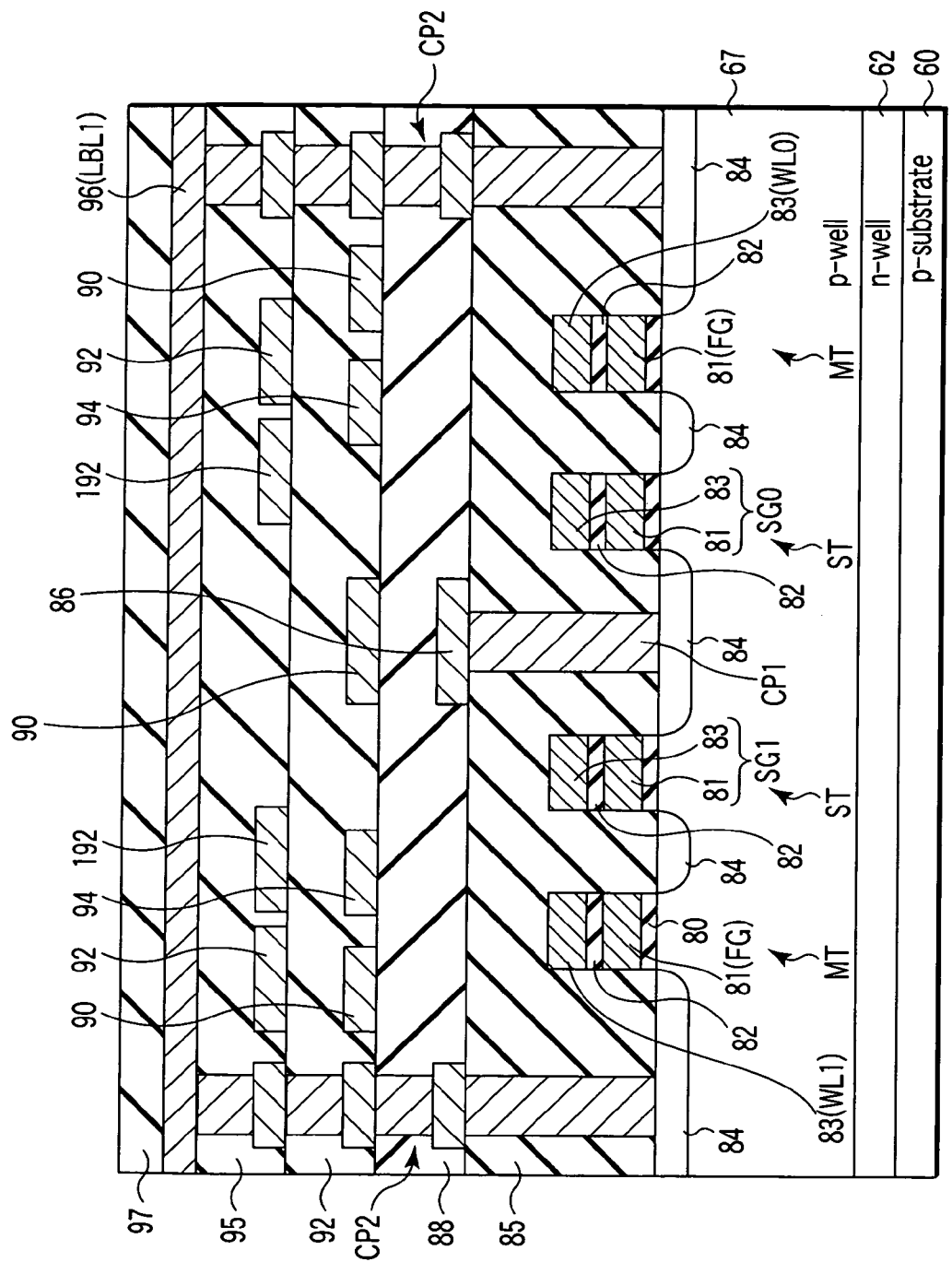
FIG. 27 is a sectional view of a memory cell array provided in the 2Tr flash memory according to the third embodiment of the present invention.

Now, with reference to FIG. 27, description will be given of the sectional structure of the memory cell array 26 in the flash memory configured as described above. FIG. 27 is a sectional view taken across the bit lines in the memory cell array 110.

As shown in the figure, the n-type well region 62 is formed in the surface region of the p-type semiconductor substrate 60. The p-type well region 67 is formed in the surface region of the n-type semiconductor substrate 62. The gate insulating film 80 is formed on the p-type well region 67. The gate electrodes of the memory cell transistor MT and select transistor ST are formed on the gate insulating film 80. The gate electrodes of the memory cell transistor MT and select transistor ST each have the polycrystalline silicon layer 81, the inter-gate insulating film 82 formed on the polycrystalline silicon layer 81, and the polycrystalline silicon layer 83 formed on the inter-gate insulating film 82. The inter-gate insulating film 82 is formed of, for example, a silicon oxide film or an ON, NO, or ONO film that has a stacked structure of a silicon oxide film and a silicon nitride film.

In the memory cell transistors MT, the polycrystalline silicon layers 81 in the element regions AA arranged adjacent to each other across the word lines are isolated from one another. The polycrystalline silicon layer 81 thus functions as a floating gate (FG). On the other hand, the polycrystalline silicon layers 83 in the adjacent element regions AA are connected together and function as control gates (local word line WL).

In the selected transistors ST, the polycrystalline silicon layers 81 and 83 in the element regions AA arranged adjacent to each other across the word lines are connected together. The polycrystalline silicon layers 81 and 83 thus function as select gate lines (SG). However, the polycrystalline silicon layer 83 may be allowed to be at floating state electrically so that only the polycrystalline silicon layer 81 can function as a select gate line.

The impurity diffusion layer 84 is formed in the surface of the p-type well region 67 located between the adjacent gate electrodes. The impurity diffusion layer 84 is shared by the adjacent transistors.

The memory cell MC including the memory cell transistor MT and select transistor ST is formed to have the relationship described below. That is, the select transistors ST or memory cell transistors MT in the adjacent memory cells MC lie adjacent to each other. The adjacent transistors share the impurity diffusion layer (source region) 84. Accordingly, if the select transistors ST in the two adjacent memory cells MC, MC are adjacent to each other, the two select transistors ST, ST are arranged symmetrically with respect to the impurity diffusion layer (source region) 84 shared by them. In contrast, if the memory cell transistors MT in the two adjacent memory cells MC, MC are adjacent to each other, the two memory cell transistors MT, MT are arranged symmetrically with respect to the impurity diffusion layer (drain region) 84 shared by them.

The other arrangements of the present embodiment are similar to those of the first embodiment. The contact plug CP1 is formed on the source 84 of the select transistor ST. The contact plug CP2 is formed on the drain 84 of the memory cell transistor MT. In the present embodiment, a metal interconnect layer 192 is formed on, for example, the interlayer insulating film 92; the metal interconnect layer 192 functions as a shunt interconnect for the select gate line. The metal interconnect layer 192 is connected to the polycrystalline silicon layer 81 in the select transistor ST in a region not shown in the figures. The metal interconnect layer 192 transmits a signal output by the select gate decoder.

Figure 28:
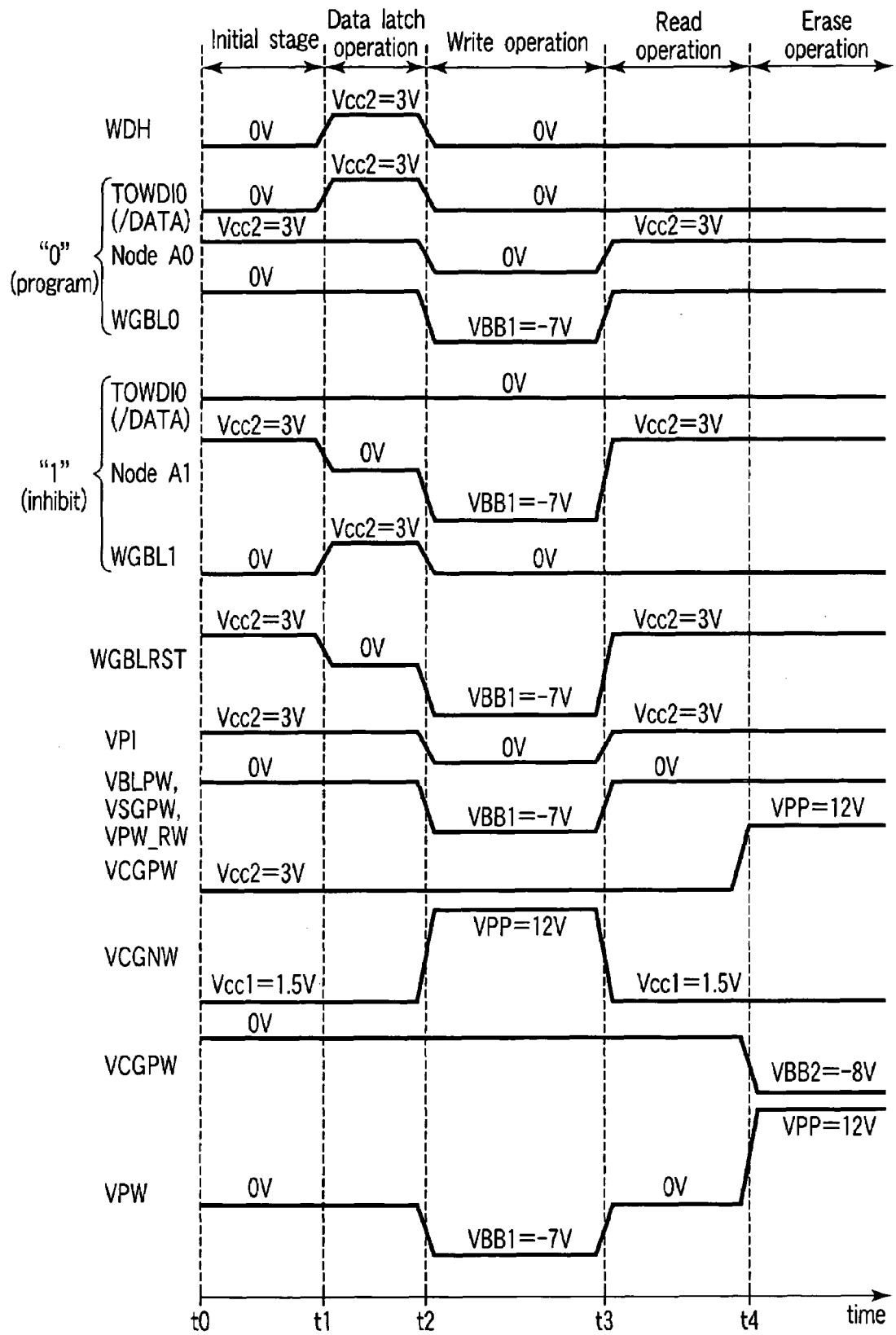
FIG. 28 is a timing chart of various signals during operation of the 2Tr flash memory according to the third embodiment of the present invention.

Now, with reference to FIG. 28, description will be given of operations of the 2Tr flash memory configured as described above. FIG. 28 is a timing chart of various signals and the voltage at each node. In the description below, the following state is defined as the state in which "1" data has been written: no electrons are injected to the floating gate, so that the threshold voltage is negative. Further, the following state is defined as the state in which "0" data has been written: electrons are injected to the floating gate, so that the threshold voltage is positive. Furthermore, for simplification, description will be given below, by way of example, of a memory cell array having two write global bit lines WGBL0 and WGBL1 and one read global bit line RGBL0.

<Initial Operation>

First, an initial operation will be described with reference to FIG. 29. The initial operation is performed before the data write, read, or erase operation. In FIG. 28, the initial operation is performed between a time t0 and a time t1. FIG. 29 is a circuit diagram of the input buffer 190, switch group 180, and write circuit 150 corresponding to the write global bit lines WGBL0 and WGBL1 during the initial operation.

During the initial operation, both signals WDH0 and WDH1 are first set to the "L" level (0 V). Thus, the MOS transistors 181 in the switch group 180 are turned off. Further, the write circuit 150 is electrically separated from the input buffer 190. Furthermore, the write inhibition voltage VPI, a high power supply voltage for the latch circuit 153, is set to Vcc2, and VBLP is set to 0 V. The signal WGBLRST is set to the "H" level (Vcc2) to reset all the write global bit lines WGBL0 and WGBL1. That is, the MOS transistor 158 in the write circuit 50 is turned on. Further, the VBLPW node provides 0 V to the write global bit lines WGBL0 and WGBL1. As a result, the output nodes of all the latch circuits 153 are set to the "L" level (0 V). On the other hand, the input nodes (nodes A0 and A1) of all the latch circuits 153 are set to the "H" level (Vcc2).

As described above, during the initial operation, the write global bit line is set to 0 V, and Vcc2 is provided to the nodes A0 and A1.

<Data Latch Operation>

Figure 30:
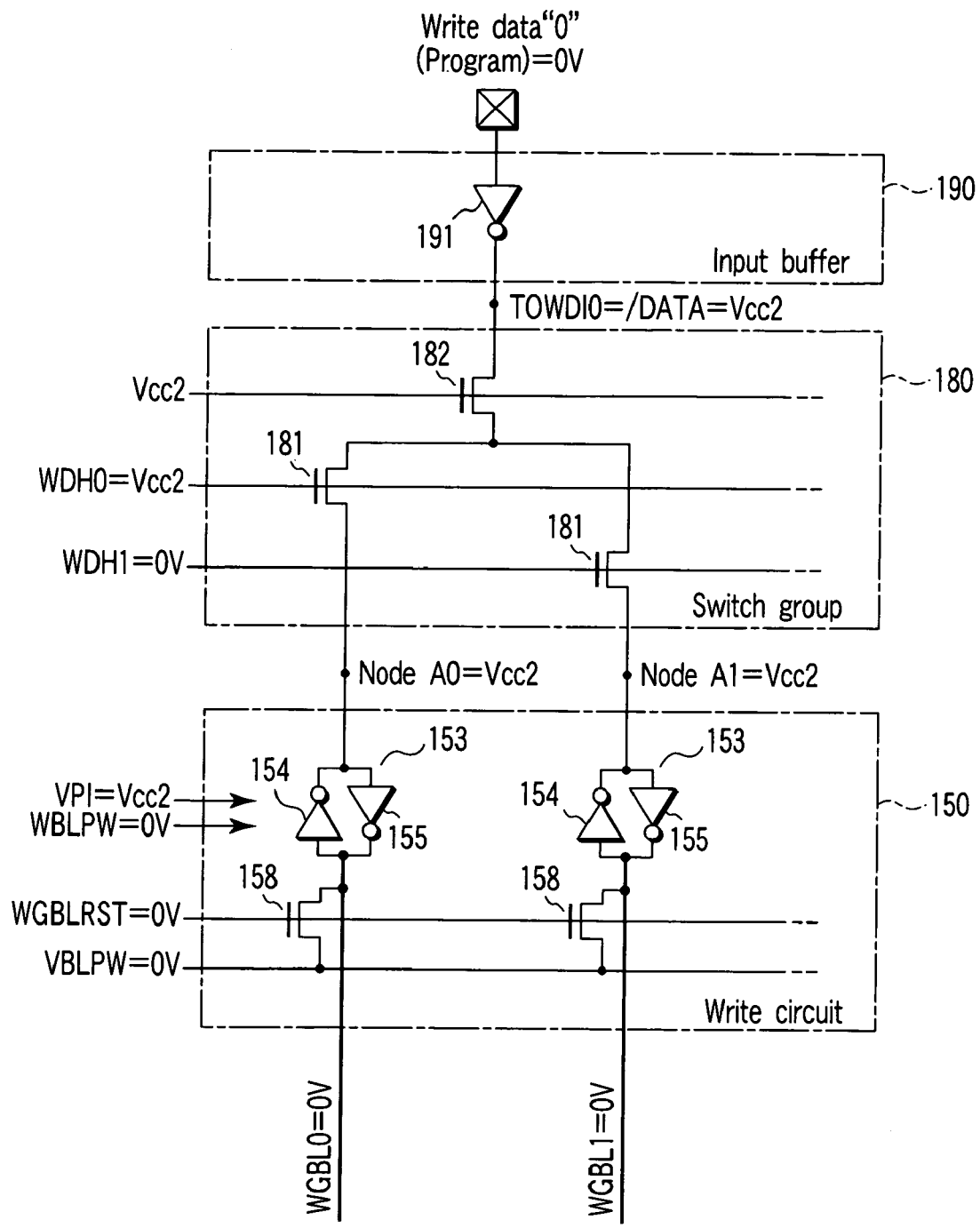
FIG. 30 is a circuit diagram of the write circuit, switch group, and input buffer provided in the 2Tr flash memory according to the third embodiment of the present invention, the diagram showing how data is latched.
Figure 31:
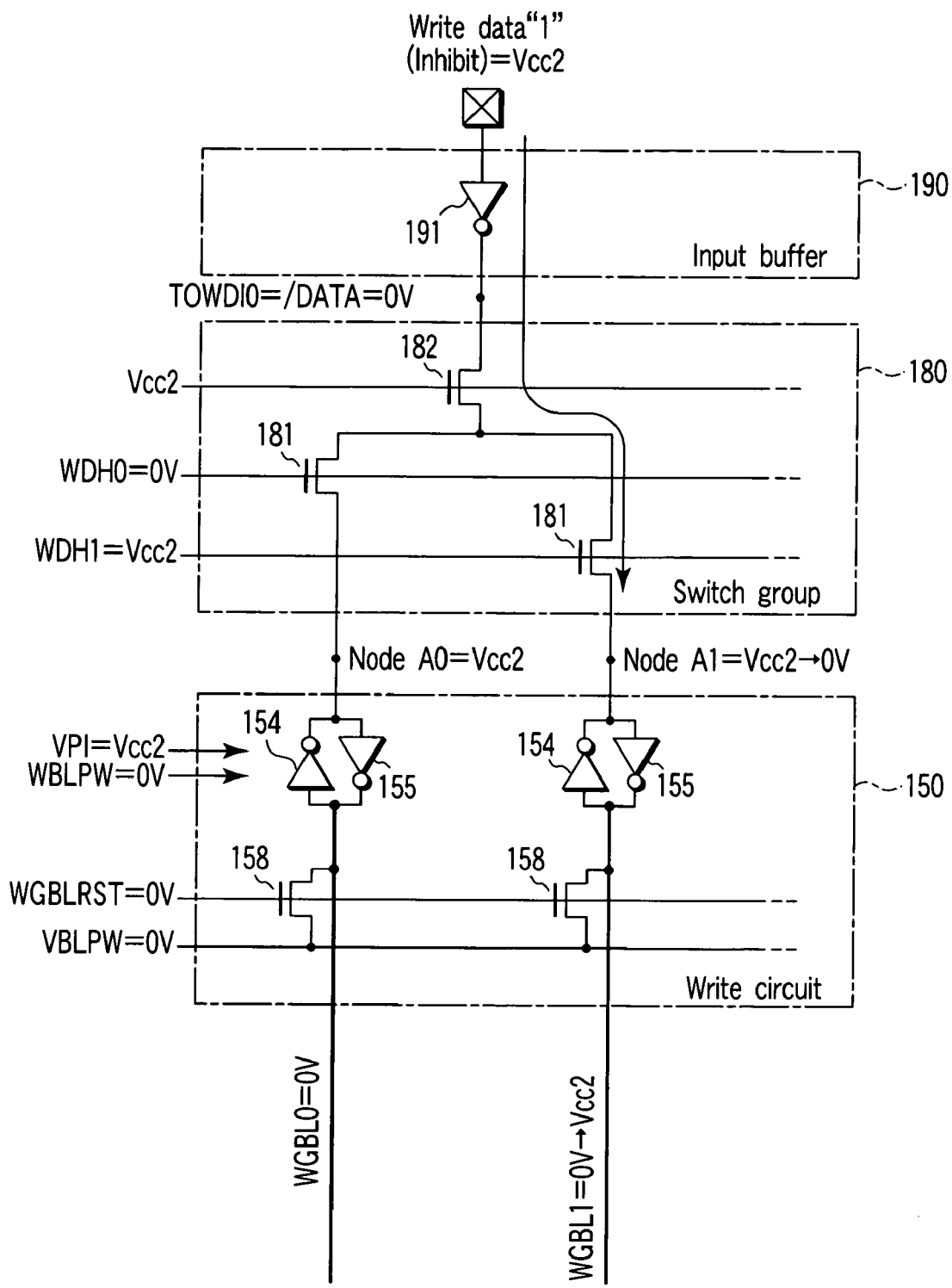
FIG. 31 is a circuit diagram of the write circuit, switch group, and input buffer provided in the 2Tr flash memory according to the third embodiment of the present invention, the diagram showing how data is latched.

Now, a data latch operation will be described with reference to FIGS. 30 and 31. The data latch operation involves inputting write data to each latch circuit 153 for a data write operation. In FIG. 28, the data latch operation is performed between the time t1 and a time t2. FIGS. 30 and 31 are circuit diagrams of the input buffer 190, switch group 180, and write circuit 150. FIG. 30 shows the case in which the "0" data is input, whereas FIG. 31 shows the case in which the "1" data is input. In the example described below, the "0" data is written to the memory cell connected to the write global bit line WGBL0 (WGBL0 is selected), whereas the "1" data is written to the memory cell connected to the write global bit line WGBL1 (WGBL1 is unselected).

First, the input of the "0" data will be described with reference to FIG. 30. For the data latch operation, the signal WGBLRST is set to 0 V and the MOS transistor 158 is turned off. Thus, the write global bit lines WGBL0 and WGBL1 are electrically separated from the VBLPW node. Moreover, to allow the latch circuit 153 corresponding to the write global bit line WGBL0 to latch data, the signal WDH0 is set to the "H" level (Vcc2). Further, the MOS transistor 181 corresponding to the write global bit line WGBL0 is turned on. On the other hand, the MOS transistor 181 corresponding to the write global bit line WGBL1 is turned off. Consequently, the input buffer 190 is electrically connected to the latch circuit 153 corresponding to the write global bit line WGBL0.

Then, the "0" data is input to the inverter of the input buffer 190. When the "0" data is input, 0 V is applied to the input node of the inverter 191. The inverter 191 inverts the "0" data. As a result, the potential of a TOWDI0 node becomes Vcc2. Then, since Vcc2 has been applied to the gate of the MOS transistor 182, the MOS transistor 182 is brought into a cutoff state. Consequently, the latch circuit 153 holds the data provided between the time t0 and the time t1. In other words, the node A0 remains at Vcc2 and the write global bit line WGBL0 remains at 0 V.

Now, the input of the "1" data will be described with reference to FIG. 31. The difference from the input of the "0" data is that WDH0=0 V and WDH1=Vcc2, so that the MOS transistor 181 corresponding to the write global bit line WGBL1 is turned on.

The "1" data is input to the input buffer. When the "1" data is input, Vcc2 is applied to the input node of the inverter 191. Accordingly, the potential of the TOWDI0 node becomes 0 V. The potential of the TOWDI0 node is input to the latch circuit 153 via the current path in the MOS transistor 181. As a result, the potential of the node A1 is inverted from Vcc2 to 0 V. The potential of the write global bit line WGBL1 is inverted from 0 V to Vcc2.

As described above, during the data latch operation, the data is inverted from its initial state in the latch circuit corresponding to the memory cell to which "1" is written. That is, for the write of "0" (injection of electrons), substantially no external data is input. For the write of "1" (avoidance of injection of electrons), external data is loaded.

<Write Operation>

Figure 32:
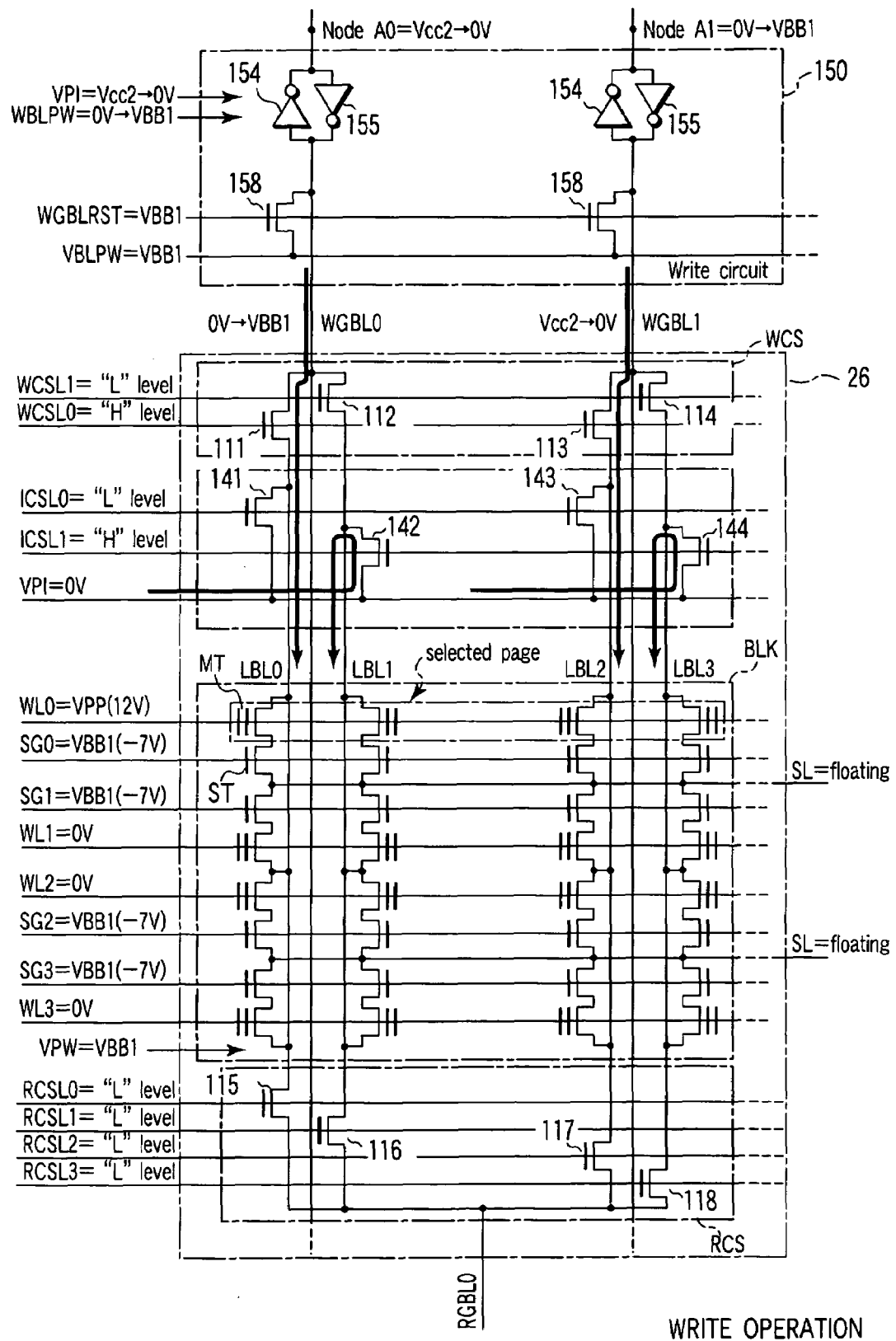
FIG. 32 is a circuit diagram of the write circuit and memory cell array provided in the 2Tr flash memory according to the third embodiment of the present invention, the diagram showing how a write operation is performed.

Now, the write operation will be described with reference to FIG. 32. Data is written to all the memory cell blocks on the same row at a time. However, within each memory cell block, data is simultaneously written to two memory cells: the memory cell connected to the local bit line LBL0 or LBL1 and the memory cell connected to the local bit line LBL2 or LBL3.

In FIG. 28, the write operation is performed between the time t2 and a time t3. FIG. 32 is a circuit diagram of the memory cell array 26 and write circuit 150 during the write operation. In FIG. 32, it is assumed that data is written to the memory cell transistors MT connected to the local word line WL0 and local bit lines LBL0 and LBL2. It is further assumed that the "0" data is written to the memory cell transistor MT connected to the local bit line LBL0 and that the "1" data is written to the memory cell transistor MT connected to the local bit line LBL2. In other words, the memory cell connected to the local bit line LBL0 is selected, whereas the memory cell connected to the local bit line LBL2 is unselected.

First, for the write operation, the signal WGBLRST is set to (−7 V) and the MOS transistor 158 is turned off. The write inhibition voltage VPI changes from Vcc2 to 0 V, while the potential of the VBLPW node changes from 0 V to VBB1. The potential of VPI may have a negative value different from −7 V.

Then, in the latch circuit 153, the low voltage-side power supply voltages of the inverters 154 and 155 changes from 0 V to VBB1. The high voltage-side power supply voltages of the inverters 154 and 155 changes from Vcc2 to 0 V. The potentials of the nodes A0 and A1 change to 0 V and VBB1, respectively. The potentials of the write global bit lines WGBL0 and WGBL1 also change to VBB1 and 0 V, respectively.

Then, the positive potential VPP (12 V) is applied to the selected word line WL0. Further, the MOS transistor 125 is turned on to cause the VSGPW node to apply the negative potential VBB1 (−7 V) to all the select gate lines SG0 to SG(4m−1). Moreover, the negative potential VBB1 is applied to the substrate (p-type well region 67) on which the write decoders 20 form memory cells. For the write operation, the signal ZISOG is set to the "L" level, and the row address decode circuit 133 of the select gate decoder 130 is electrically isolated from the select gate line.

The write column select line WCSL0 is selected from the two write column select lines connected to the write column selector WCS corresponding to the memory cell block BLK containing the selected word line WL0. Thus, the MOS transistors 111 and 113 in the write column selector WCS are turned on. As a result, the write global bit line WGBL0 is electrically connected to the local bit line LBL0. The write global bit line WGBL1 is electrically connected to the local bit line LBL2.

All the write column select lines which are connected to the write column selectors WCS corresponding to the memory cell blocks BLK not containing the selected word line WL0 are unselected. This turns off the MOS transistors 111 to 114 in the write column selectors WCS corresponding to the memory cell blocks BLK not containing the selected word line WL0.

Moreover, all the read column select lines RCSL0 to RCSL(4m−1) are unselected. This turns off the MOS transistors 115 to 118 in all the read column selectors RCS. Accordingly, the read global bit line RGBL is electrically separated from the local bit lines LBL0 to LBL3.

Moreover, the write inhibition column select line ICSL1 is set to the "H" level (Vcc2) in order to turn on the MOS transistors 142 and 144 connected to the local bit lines LBL1 and LBL3, respectively, which are unselected. The write inhibition column select line ICSL0 is set to the "L" level, which line is connected to the MOS transistors 141 and 143 corresponding to the selected local bit lines LBL0 and LBL2, respectively. This causes the write inhibition voltage VPI=0 V to be applied to the unselected local bit lines LBL1 and LBL3.

As a result, the write voltage (VBB1) from the write global bit line WGBL0 is provided, via the MOS transistor 111 in the write column selector WCS, to the local bit line LBL0 in the memory cell block BLK containing the selected local word line WL0. Moreover, the write inhibition voltage VPI (0 V) from the write global bit line WGBL1 is provided, via the MOS transistor 113, to the local bit line LBL2 in the memory cell block BLK containing the selected local word line WL0.

As a result, in the memory cell transistor MT connected to the write global bit line WGBL1 and local word line WL0, no electrons are injected into the floating gate because of an insufficient potential difference between the gate and the channel (VPP−VPI=12 V). That is, the memory cell MC maintains a negative threshold. Specifically, the "1" data is written. Also in the memory cell transistors MT connected to the unselected local bit lines LBL1 and LBL3 and local word line WL0, no electrons are injected into the floating gate because of the application of VPI to the channel. Consequently, the memory cell MC maintains a negative threshold. On the other hand, in the memory cell transistor MT connected to the write global bit line WGBL0 and local word line WL0, FN tunneling allows electrons to be injected into the floating gate because of a sufficient potential difference between the gate and the channel (VPP−VBB1=19 V). This makes the threshold of the memory cell transistor MT positive. That is, the "0" data is written.

As described above, data is written to all the memory cell transistors for one page at a time.

<Read Operation>

Figure 33:
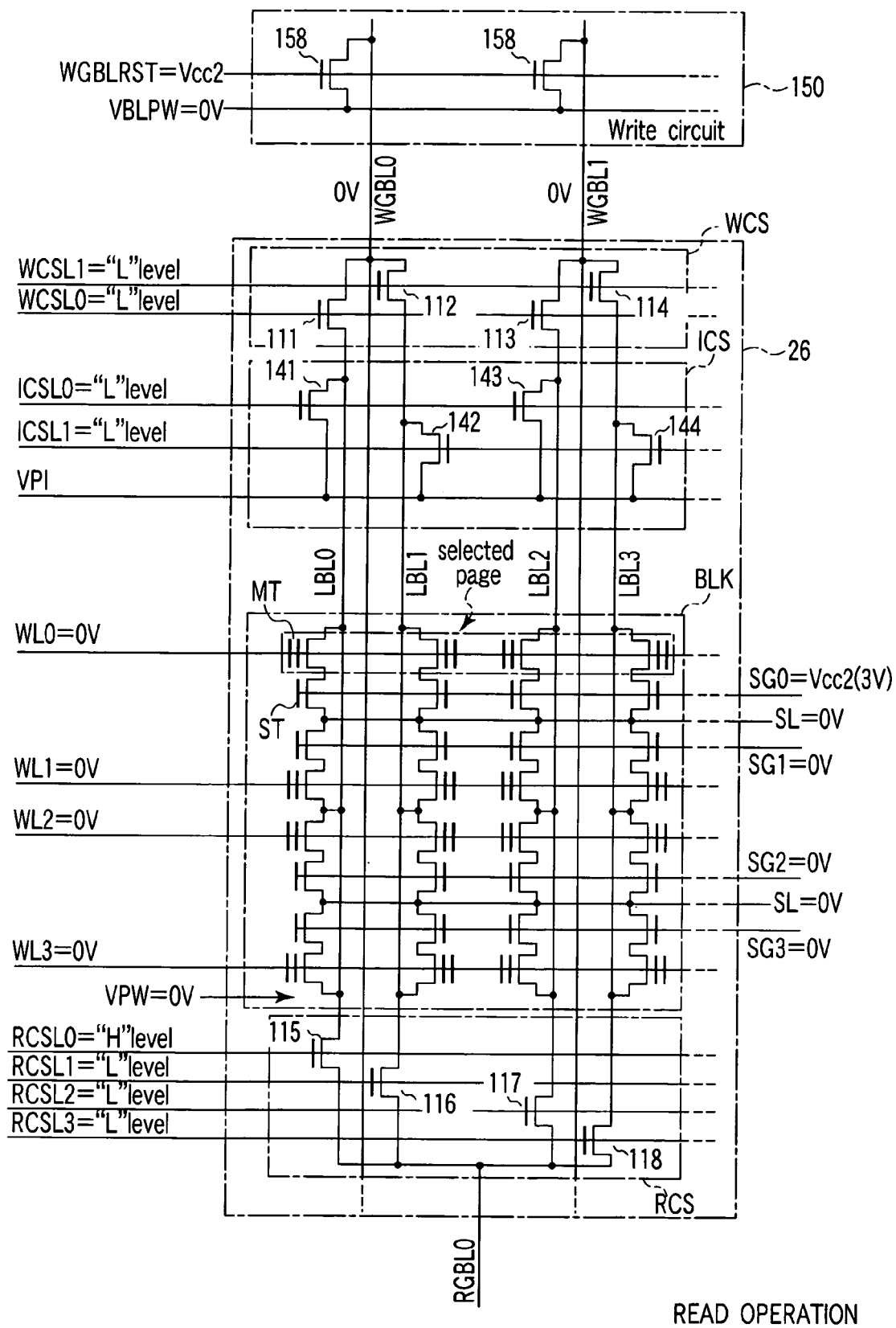
FIG. 33 is a circuit diagram of the write circuit and memory cell array provided in the 2Tr flash memory according to the third embodiment of the present invention, the diagram showing how a read operation is performed.

Now, the read operation will be described with reference to FIG. 33. In FIG. 28, the period from the time t3 to a time t4 corresponds to the read operation. FIG. 33 is a circuit diagram of the memory cell array 26 and write circuit 150 in the 2Tr flash memory. FIG. 33 shows that data is read from the memory cell transistor MT connected to the local bit line LBL0 and local word line WL0. The data is read from one memory cell MC per memory cell block BLK. However, if there are a plurality of read global bit lines per memory cell block BLK, the data is read from these read global bit lines.

As shown in FIG. 33, the read column select line RCSL0 is selected from the four read column select lines RCSL0 to RCSL3 connected to the read column selector RCS corresponding to the memory cell block BLK containing the selected select gate line SG0. This turns on the MOS transistor 115 in the read column selector RCS corresponding to the memory block BLK containing the selected select gate line SG0.

Further, all the write column select lines WCSL0 to WCSL (2m−1) are unselected. This turns off all the four MOS transistors 11 to 14 in the write column select lines WCSL0 to WCSL(2m−1). Consequently, the write global bit line WGBL is electrically isolated from the local bit lines LBL0 to LBL3.

Furthermore, the signal WGBLRST is set to the "H" level (Vcc2) to turn on the MOS transistor 158 in the write circuit 150. The VBLPW node is provided with 0 V. Consequently, for the read operation, all the write global bit lines WGBL0 and WGBL1 are set to 0 V.

Moreover, the read global bit line RGBL0 is precharged. After the read potential global bit line reaches a predetermined precharge potential, the signal ZISOG is set to the "H" level to turn on the MOS transistor 135. The select gate decoder 130 then selects the select gate line SG0 ("H" level: Vcc2=3 V). Further, the local row decoder 27 unselects all the word lines WL0 to WL(4m−1). The potential VPW1 of the p-type well region 67 is set to 0 V. Moreover, the potential of the source line is set to 0 V. For the read operation, the signal WSG is set to the "L" level, and the row address decode circuit 123 of the write decoder 120 is electrically separated from the select gate line.

Then, the select transistor ST connected to the select gate line SG0 is turned on. If the "1" data has been written to the memory cell transistor MT connected to the selected local word line WL0 and selected local bit line LBL0, a current flows from the read global bit line RGBL0 to the source line. On the other hand, if the "0" data has been written to the memory cell transistor MT, no current flows.

The sense amplifier 18 amplifies a change in the potential of the read global bit line. The data read operation is performed as described above.

<Erase Operation>

Figure 34:
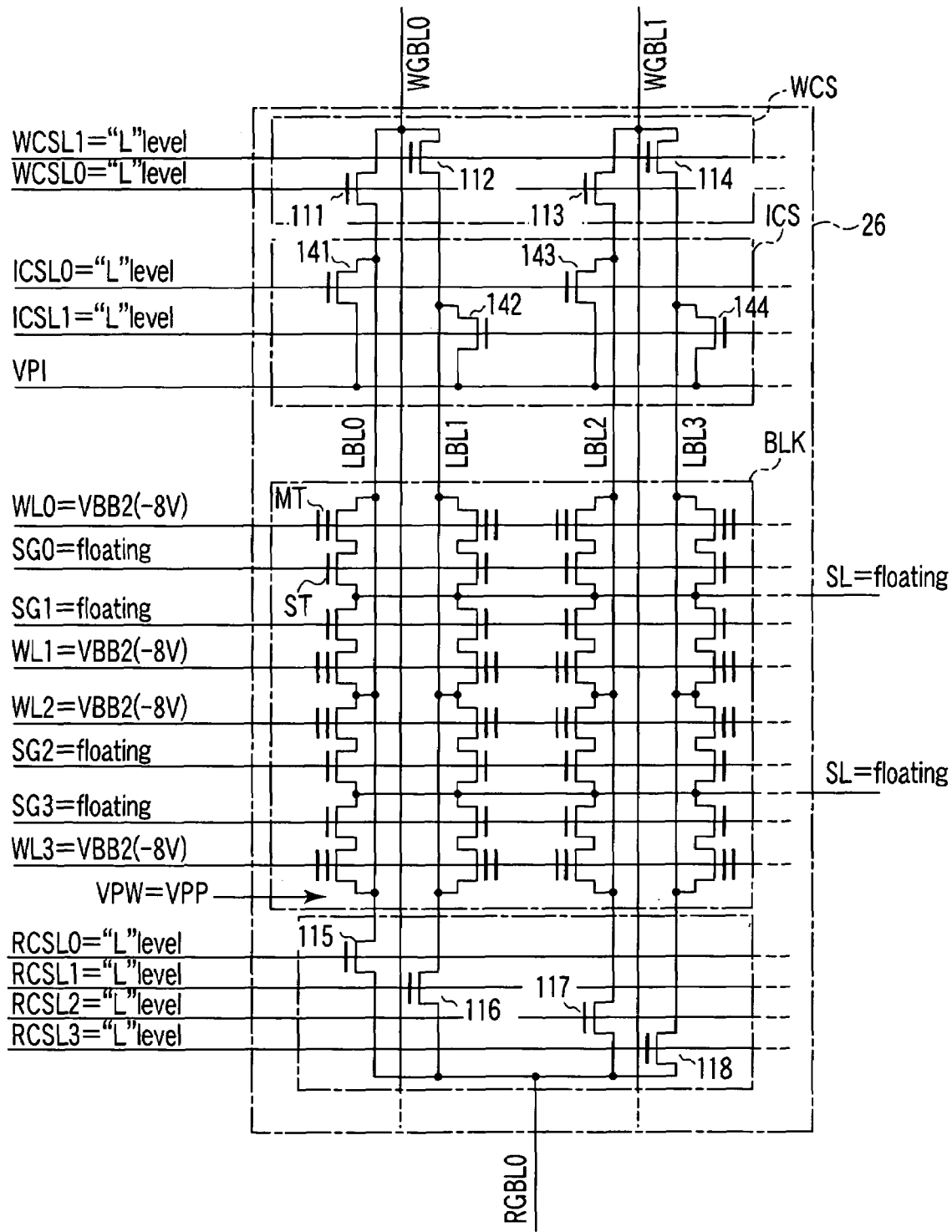
FIG. 34 is a circuit diagram of the memory cell array provided in the 2Tr flash memory according to the third embodiment of the present invention, the diagram showing how an erase operation is performed.

Now, the erase operation will be described with reference to FIG. 34. The erase operation is started at the time 4. FIG. 34 is a circuit diagram of the memory cell array during the erase operation. The data is erased from all the memory cells MC sharing the p-type well region 67. The erase operation is performed by carrying out FN tunneling to draw electrons out of the floating gate.

For the erase operation, all the MOS transistors 111 to 118 and 141 to 144 are turned off. Consequently, all the write global bit lines WGBL0 and WGBL1 are electrically isolated from the latch circuit 151, sense amplifier 18, VBLPW node, and VPI node and thus are at floating state electrically.

The local row decoder 27 then applies the negative voltage VBB2 to all the local word lines WL0 to WL(4m−1) in the selected block. The positive voltage VPP is applied to the substrate (p-type well region 67) on which the memory cell has been formed. For the erase operation, the signals ZISOG and WSG are set to the "L" level. Further, the row address decode circuits 123 and 133 are electrically isolated from the select gate lines.

As a result, FN tunneling causes electrons to be drawn out of the floating gate of the memory cell transistor in the memory cell MC to the semiconductor substrate. This erases the data from all the memory cells MC connected to the local word lines WL0 to WL(4m−1). The threshold voltage becomes negative. The potential of the select gate line rises substantially to VPP owing to the coupling between the select gate line and the p-type well region 67. As described above, the data is erased at a time.

Now, with reference to FIGS. 35 to 37, a detailed description will be given of operations of the global row decoders 21a and 21b and local row decoder 27 during the write, read, and erase operations, respectively. FIGS. 35 to 37 are circuit diagrams of the write decoder 120, select gate decoder 130, and the memory cell array 26 and local row decoder 27 in the memory cell array 11. In the example described below, the memory core 11 is selected, and for the write and read operations, the local word line WL0 in the memory core 11 is selected.

<Write Operation>

Now, the write operation will be described with reference to FIG. 35. When a row address signal corresponding to the selected local word line WL0 is provided, outputs from the row address decode circuits 123 and 126 corresponding to the selected local word line WL0 are set to the "L" level (0 V) and the "H" level (Vcc2), respectively. On the other hand, outputs from the row address decode circuits 123 and 126 corresponding to the other local word lines WL1 to WL(4m−1) are set to the "H" level (Vcc2) and the "L" level (0 V), respectively. That is, the first global word line GWL1-0 is set to the "H" level (VPP), while the other first global word lines are set to the "L" level (0 V). The second global word line GWL2-0 is set to the "L" level (0 V), while the other second global word lines are set to the "H" level (Vcc2).

Further, the write decoder 120 supplies a voltage VPW2 of 0 V and a voltage VNW2 of VPP. Moreover, the block decoder 19 applies 0 V to the block decode interconnect BD1 in the selected memory core 11. The block decoder 19 applies VPP and 0 V to the block decode interconnects BD2-0 and BD2-1, respectively, in the selected memory core 11. The block decoder 19 applies 0 V to the block decode interconnects BD1, BD2-0, and BD2-1 in the unselected memory core 12.

Then, in the selected memory core 11, the MOS transistor 43 corresponding to the selected local word line WL0 is turned off. The MOS transistor 44 corresponding to the selected local word line WL0 is turned on. Consequently, the potential (VPP) of the second block decode interconnect BD2-0 is applied to the local word line WL0. For the unselected local word lines WL1 to WL(4m−1), the MOS transistor 43 is turned on, while the MOS transistor 44 is turned off. Consequently, the potential (0 V) of the block decode interconnect BD1 is applied to the local word lines WL1 to WL(4m−1).

The unselected memory core 12 is subjected to processing similar to that executed in the first embodiment.

<Read Operation>

Now, the read operation will be described with reference to FIG. 36. For the read operation, the outputs from all the row address decode circuits 123 are set to the "H" level (Vcc2). Further, the outputs from all the row address decode circuits 126 are set to the "L" level (0 V). That is, all the first global word lines are set to the "H" level (VPP). Further, all the second global word lines are set to the "H" level (Vcc2). In other words, all the local word lines are unselected.

Furthermore, the write decoder 120 supplies a voltage VPW2 of 0 V and a voltage VNW2 of VPP. Moreover, the block decoder 19 applies 0 V to the block decode interconnect BD1 in the selected memory core 11. The block decoder 19 applies VPP to the block decode interconnects BD2-0 and BD2-1 in the selected memory core 11. The block decoder 19 applies 0 V to the block decode interconnects BD1, BD2-0, and BD2-1 in the unselected memory core 12.

Then, in the selected memory core 11, the MOS transistors 43 corresponding to the local word lines WL0 to WL(4m−1) are turned on. The MOS transistors 44 corresponding to the local word lines WL0 to WL(4m−1) are turned off. Consequently, the potential (0 V) of the block decode interconnect BD1 is applied to the local word lines WL0 to WL(4m−1).

The unselected memory core 12 is subjected to processing similar to that executed in the first embodiment.

<Erase Operation>

Now, the erase operation will be described with reference to FIG. 37. For the erase operation, both BD1 and VPW2 are set to VBB2 on the read operation described above. This allows VBB2 to be applied to all the local word lines WL0 to WL(4m−1) in the selected memory core 11.

As described above, the first embodiment is applicable to the 2Tr flash memory and produces the effects (1) to (3), described in the first embodiment.

Figure 38:
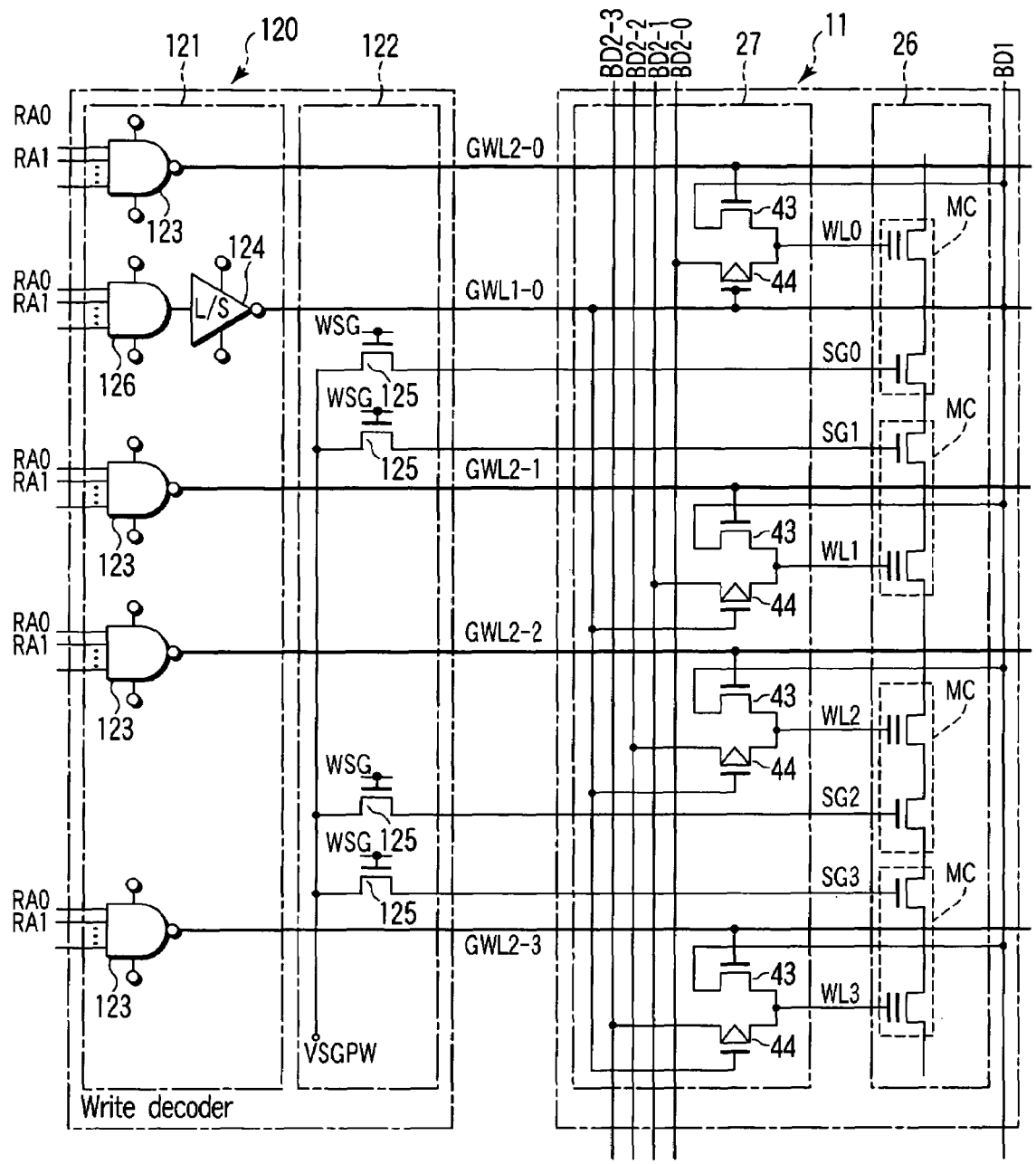
FIG. 38 is a circuit diagram of a write decoder, a local row decoder, and a memory cell array provided in a 2Tr flash memory according to a fourth embodiment of the present invention.

Now, description will be given of a semiconductor device according to a fourth embodiment of the present invention. The present embodiment corresponds to the second embodiment applied to the 2Tr flash memory. FIG. 38 is a circuit diagram of the write decoder 120 and memory core 11 in the 2Tr flash memory according to the present embodiment. The other arrangements of the present embodiment are similar to those of the second and third embodiments and will thus not be described.

As shown in FIG. 38, in the 2Tr flash memory according to the present embodiment, four local word lines share one first global word line as described in the second embodiment. The sources of the four MOS transistors 44 connected to the same global word line GWL1 are connected to the different block decode interconnects BD2-0 to BD2-3.

As described above, the second embodiment is also applicable to the 2Tr flash memory and also produces the effect (4), described in the second embodiment.

Now, description will be given of a semiconductor memory device according to a fifth embodiment of the present invention. The present embodiment corresponds to the first to fourth embodiments that use a 3Tr-NAND type flash memory in place of the NOR type flash memory and 2Tr flash memory.

Figure 39:
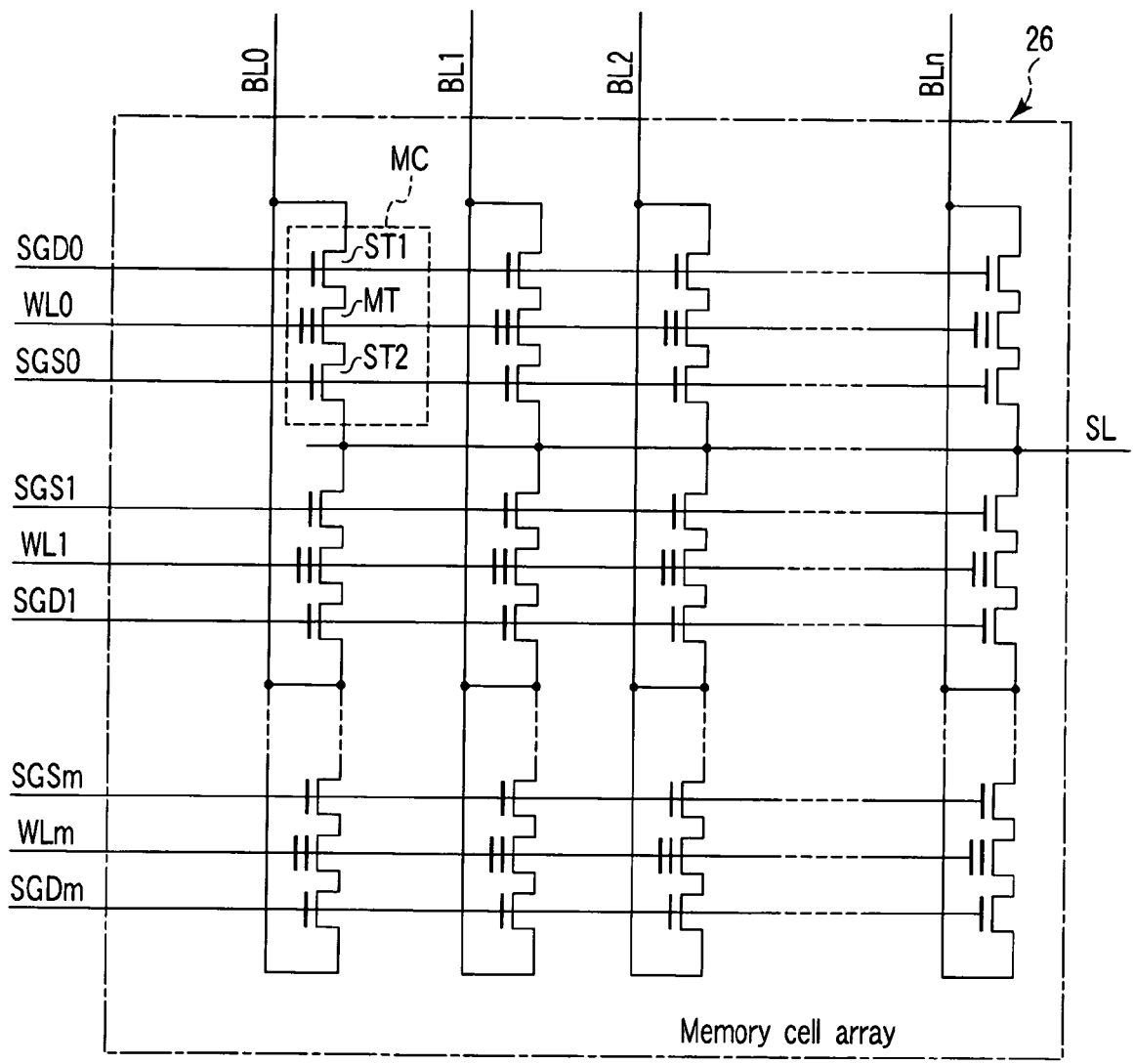
FIG. 39 is a circuit diagram of a memory cell array provided in a 3Tr-NAND type flash memory according to a fifth embodiment of the present invention.

FIG. 39 is a circuit diagram of a memory cell array in the 3Tr-NAND type flash memory according to the present embodiment. As shown in the figure, the memory cell array 26 comprises ((m+1)×(n+1)) memory cells MC arranged in a matrix. Each of the memory cells has a memory cell transistor MT and select transistors ST1 and ST2 which have respective current paths connected in series. The current path in the memory cell transistor MT is connected between the current paths in the select transistors ST1 and ST2. The memory cell transistor MT comprises a stacked gate structure having a floating gate formed on the semiconductor substrate with a gate insulating film interposed therebetween and a control gate formed on the floating gate with an inter-gate insulating film interposed therebetween. Each of the select transistors ST1 and ST2 also has a multilayer gate structure including a first polycrystalline silicon layer formed on the semiconductor substrate with a gate insulating film interposed therebetween and a second polycrystalline silicon layer formed on the first polycrystalline silicon layer with a inter-gate insulating film interposed therebetween. The source region of the select transistor ST1 is connected to the drain region of the memory cell transistor MT. The source region of the memory cell transistor MT is connected to the drain region of the select transistor ST2. Further, the memory cells arranged adjacent to each other across the columns share the drain region of the select transistor ST1 or the source region of the select transistor ST2.

Each of the local word lines WL0 to WLm connects commonly the control gates of the memory cell transistors MT in the same row. Each of the select gate lines SGD0 to SGDm connects commonly the gates of the select transistors ST1 in the same row. Each of the select gate lines SGS0 to SGSm connects commonly the gates of the select transistors ST2 in the same row. Each of the local bit lines BL0 to BLn connects commonly the drain regions of the select transistors ST1 in the same column. The source line SL connects commonly the source regions of the select transistors ST2 and is connected to the source line driver.

The first to fourth embodiments are applicable even to the above 3Tr-NAND type flash memory.

Figure 40:
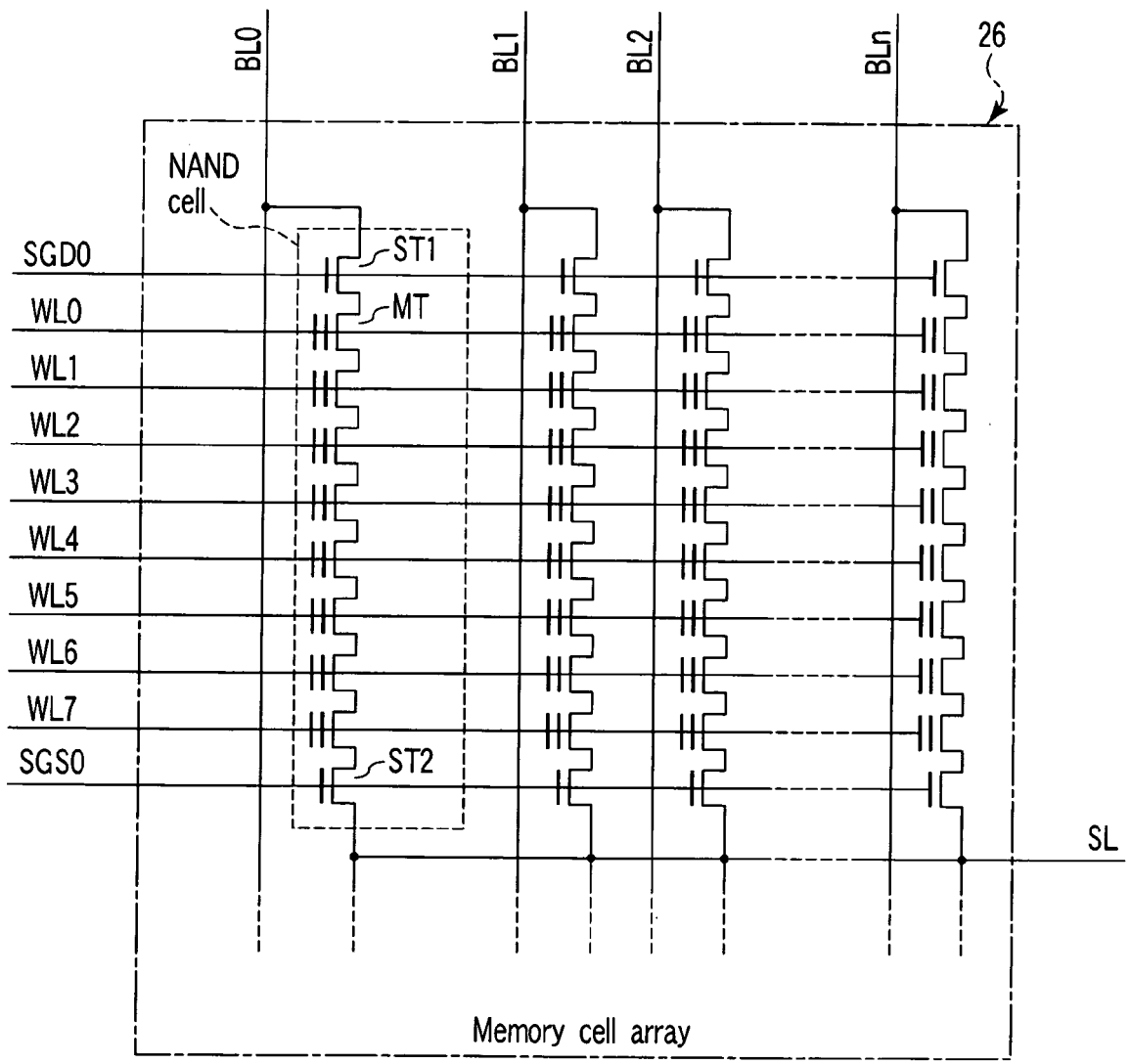
FIG. 40 is a circuit diagram of a memory cell array provided in a NAND type flash memory according to a sixth embodiment of the present invention.

Now, description will be given of a semiconductor memory device according to a sixth embodiment of the present invention. The present embodiment corresponds to the first to fourth embodiments that use a NAND type flash memory in place of the NOR type flash memory and 2Tr flash memory. FIG. 40 is a circuit diagram of a memory cell array provided in the NAND type flash memory.

As shown in the figure, the memory cell array 26 comprises a plurality of NAND cells arranged in a matrix. Each of the NAND cells includes eight memory cell transistors MT and select transistors ST1 and ST2. The memory cell transistor MT comprises a stacked gate structure having a floating gate formed on the semiconductor substrate with a gate insulating film interposed therebetween and a control gate formed on the floating gate with an inter-gate insulating film interposed therebetween. The number of memory cell transistors MT is not limited to eight but may be 16 or 32. The number of memory cell transistor MT is not limited. The adjacent memory cell transistors MT share a source and a drain. Each memory cell transistor MT is placed between the select transistors ST1 and ST2 so that their current paths are connected in series. One end of the memory cell transistor MT, that is, its drain region, is connected to the source region of the select transistor ST1; the memory cell transistor MT is connected in series with the select transistors ST1 and ST2. The other end of the memory cell transistor MT, that is, its source region, is connected to the drain region of the select transistor ST2. That is, the NAND cell corresponds to the memory cell in the 3Tr-NAND type flash memory which has a plurality of memory cell transistors MT.

Each of the local word lines WL0 to WLm connects commonly the control gates of the memory cell transistors MT in the same row. The select gate lines SGD and SGS connect commonly the gates of the select transistors ST1 and ST2, respectively, in the same row. The local word lines WL0 to WLm and select gate lines SGS and SGD are connected to the row decoder. Further, one of the local bit lines BL0 to BLn connects commonly the drain of the select transistors ST1 in the same column in the memory cell array. The sources of the select transistors ST2 are connected to the source line SL and the source line driver. Both the select transistors ST1 and ST2 are not required. Only one of the select transistors ST1 and ST2 may be provided if any of the NAND cells can be selected.

The first to fourth embodiments are applicable even to the above NAND type flash memory.

Figure 41:
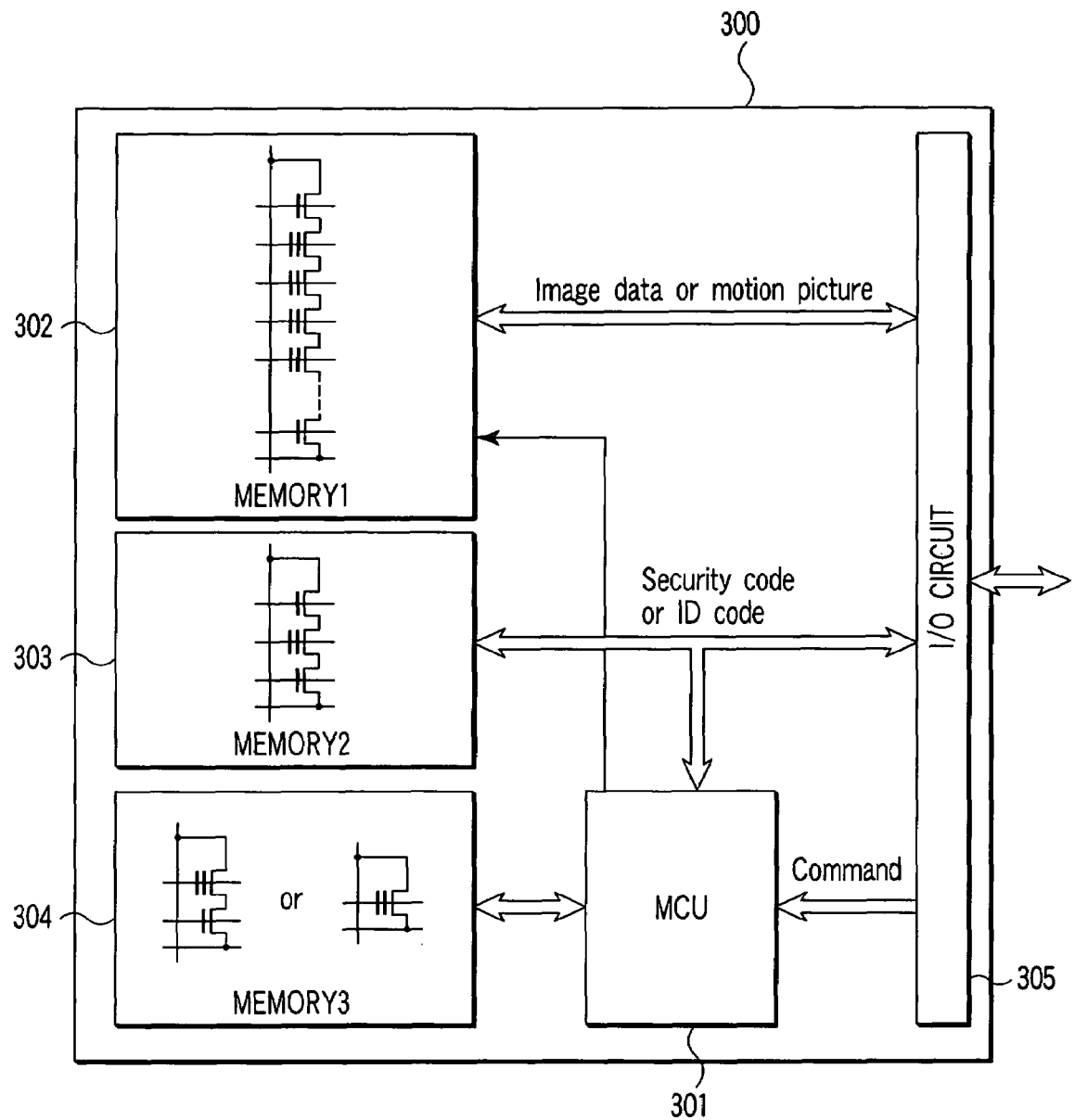
FIG. 41 is a block diagram of LSI according to a seventh embodiment of the present invention.

Now, description will be given of a semiconductor memory device according to a seventh embodiment of the present invention. The present embodiment relates to a system LSI in which the flash memories described in the first to sixth embodiments are embedded to the same chip. FIG. 41 is a block diagram of the system LSI according to the present embodiment.

As shown in the figure, a system LSI 1300 comprises MCU 301, an I/O circuit 305, and a NAND type flash memory 302, a 3Tr-NAND type flash memory 303, and a 2Tr flash memory 304 formed on the same semiconductor substrate. The 2Tr flash memory may be replaced with the NOR type flash memory described in the first and second embodiments. In the example below, the 2Tr flash memory will be described.

The NAND type flash memory 302 is used as a storage memory to which image and video data are saved. The configuration of the NAND type flash memory 302 is as described in the sixth embodiment.

The 3-Tr-NAND type flash memory 303 retains an ID or security code required to access the LSI 300. The configuration of the 3-Tr-NAND type flash memory 303 is as described in the fifth embodiment.

The 2Tr flash memory 304 retains program data required to operate MCU 301. The configuration of the 2Tr flash memory 304 is as described in the third and fourth embodiments.

In response to various externally input commands, MCU 301 executes processes based on programs read from the 2Tr flash memory. On this occasion, MCU 301 directly accesses the 2Tr flash memory 304 without using SRAM (Static Random Access Memory) or the like. Examples of processes executed by MCU 301 include compression and decompression of data input to the NAND type flash memory 304 and control of an external device. Moreover, if the data held in the NAND type flash memory 302 is externally accessed, MCU 301 reads predetermined data from the 3Tr-NAND type flash memory 303. MCU 301 then checks the read data against an externally input ID or security code. If the data matches the ID or security code, MCU 301 permits an access to the NAND type flash memory 302. When the access to the NAND type flash memory 302 is permitted, the data in the NAND type flash memory 302 is externally accessed (by a host). That is, in response to an externally received command, MCU 301 triggers the NAND type flash memory 302 to read (write) data.

The I/O circuit 305 controls the transmission of signals between LSI 300 and an external device.

For the system LSI 300, configured as described above, it is possible to form, during the same step, the memory cell transistors MT and select transistors ST1, ST2, and ST provided in the NAND type flash memory 302, 3Tr-NAND type flash memory 303, and 2Tr flash memory 304. That is, the MOS transistors are formed by the same oxidation step, deposition step, impurity injection step, and photolithography etching step. As a result, the three flash memories 302 to 304 have the same gate insulating films, the same inter-gate insulating films, the same floating and control gates of the memory cell transistors MT, and the same select gates of the select transistors. This manufacturing method enables the memory cell arrays in the three flash memories to be formed using a number of steps required to form one flash memory.

The 2Tr flash memory 302 uses a positive and negative voltages for the read and erase operations. The MOS transistor used for the row decoder provided in the 2Tr flash memory 302 may have a thinner gate insulating film than the MOS transistor used for the row decoder provided in the NAND type flash memory 302 or 3Tr-NAND type flash memory 303. This makes it possible to reduce the size of the row decoder in the 2Tr flash memory, while increasing its operation speed.

The 2Tr flash memory 304 retains program data required to operate MCU 301. As described above, the 2Tr flash memory 304 operates at high speed. Accordingly, MCU 301 can read data directly from the 2Tr flash memory 340 without using RAM or the like. This eliminates the need for RAM or the like, thus simplifying the configuration of the system LSI. The operation speed can also be increased.

The 3Tr-NAND type flash memory 303 retains the ID or security code. The code data does not have a large data volume but is frequently changed or updated. Accordingly, the memory retaining the code data must operate somewhat fast. In this regard, the 3Tr-NAND type flash memory 303 uses a smaller erase unit than the NAND type flash memory 302. The 3Tr-NAND type flash memory 303 enables data to be rewritten page by page. Therefore, the 3Tr-NAND type flash memory 303 is an optimum semiconductor memory for retaining the code data.

An LSI with a NAND type flash memory conventionally requires such a controller as described below in order to prevent a rewrite operation from concentrating on particular blocks. The controller converts an input address into a physical address and performs control such that if any block is defective, this block will no longer be used. However, the present embodiment does not require such a controller. This is because the 2Tr flash memory 304 may retain a firmware program that controls the blocks in the NAND type flash memory 302 so that MCU 301 can perform the above control. MCU 301 may perform this control in the intervals between operations that must intrinsically be performed by it (control of an external device and calculation of data input to the NAND type flash memory). Of course, if the amount of processing that must intrinsically be executed by MCU 301 is large compared to the level of capabilities of MCU 301, a hardware sequencer or the like may be provided to control the NAND flash memory 302.

As described above, according to the first to seventh embodiments, the local row decoder can be formed of two MOS transistors per word line. A negative voltage is transferred from a source that can be controlled by voltage independently of the well region rather than being transferred from the well region via the current path in the MOS transistor. This eliminates the need to apply a negative voltage to the gate of the MOS transistor. Consequently, the size of the level shift circuit can be reduced. It is thus possible to miniaturize the row decoder to effectively reduce the area of the flash memory.

In the description of the above embodiments, one first global word line (that is, one level shifter 41 and one row address decode circuit 45) is provided for every two or four local word lines. However, the number of first global word lines can further be reduced. If the first global word line is provided for every n local word lines, n block decode interconnects BD2-0 to BD2-($n-1$) are provided to perform control such that the local word lines except the selected one are unselected. In this case, the arrangement of the MOS transistors 43 and 44 are as shown in FIG. 19. That is, the MOS transistors 43 and 44 are arranged in a (m×n) matrix. The rows are arranged in association with a pitch of n word lines.

Figure 43:
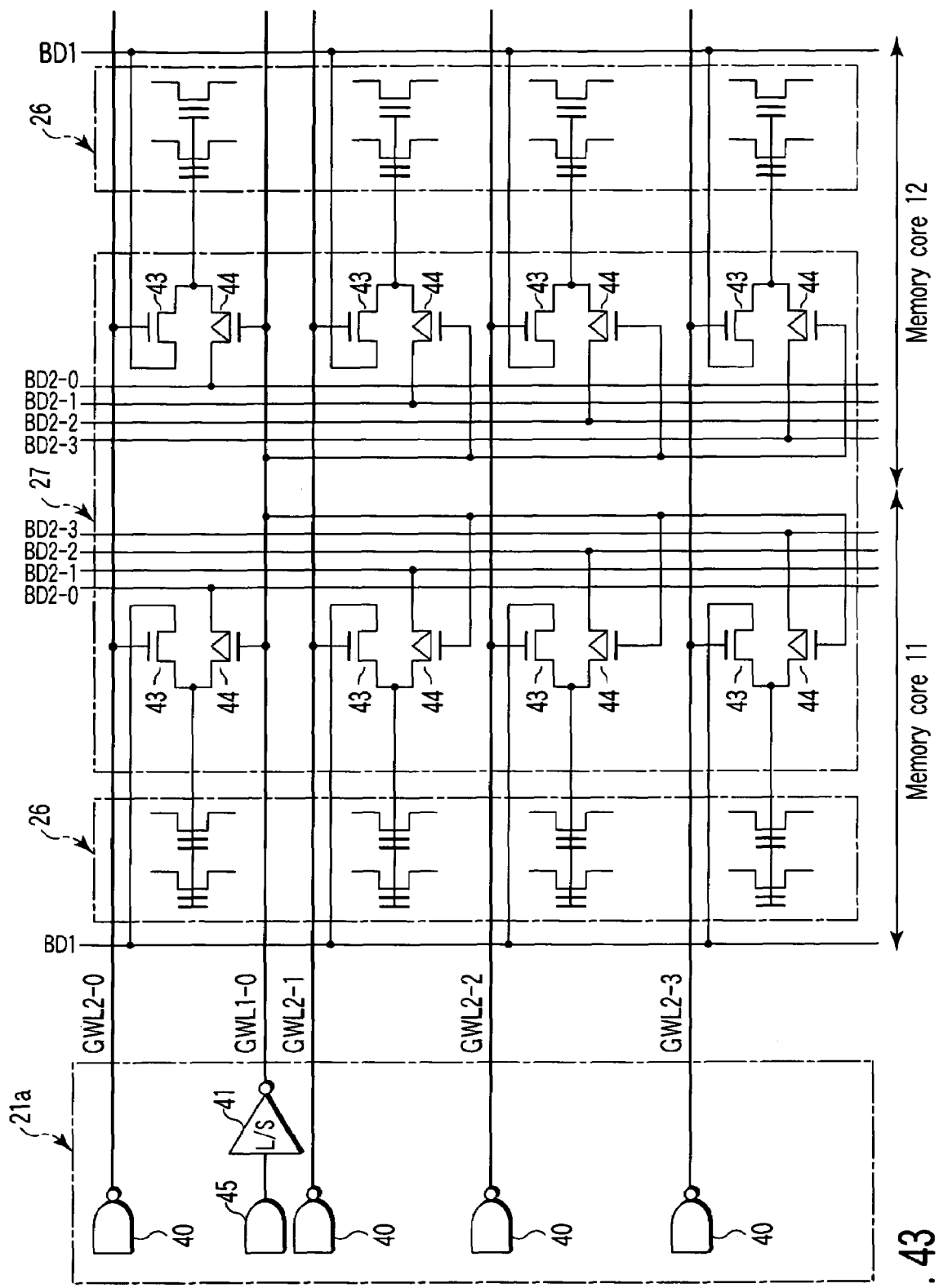
FIG. 43 is a circuit diagram of the global row decoder, local row decoder, and memory cell array provided in the flash memory according to the first modification of the first to sixth embodiments of the present invention.
Figure 44:
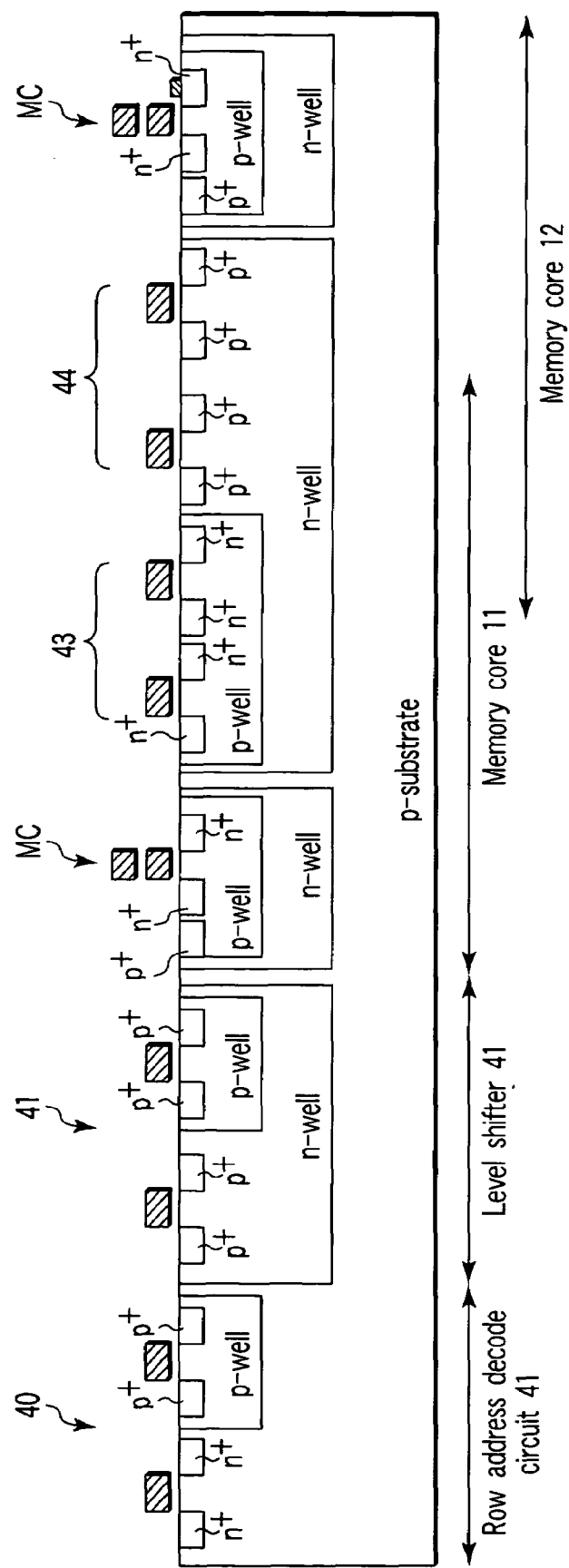
FIG. 44 is a sectional view of the flash memory according to the first modification of the first to sixth embodiments of the present invention.

Alternatively, the local row decoders 27 and memory cell arrays 26 in the adjacent memory cores are arranged as shown in FIGS. 42 and 43. That is, the two memory cores 11 and 12 are arranged so that a plurality of local row decoders 27 are adjacent to one another. In this case, as shown in the sectional view in FIG. 44, two local row decoders 27 can share n- and p-type well regions. This makes it possible to further reduce the area of the memory.

Figure 45:
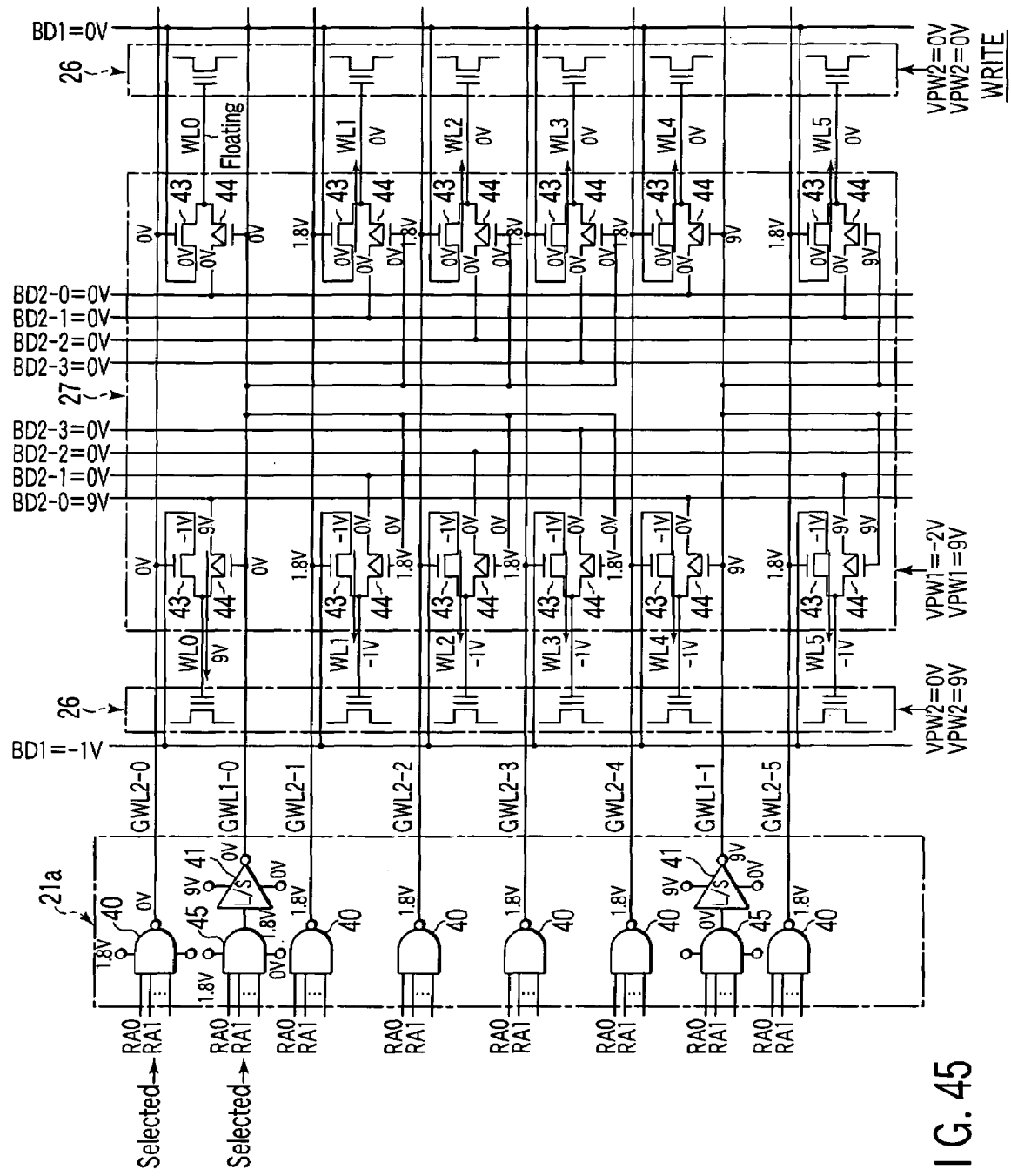
FIG. 45 is a circuit diagram of a global row decoder, a local row decoder, and a memory cell array provided in a flash memory according to a second modification of the first to sixth embodiments of the present invention.

Moreover, when the write operation is performed on the NOR type flash memory, a negative voltage, for example, −1 V may be applied to the block decode interconnect BD1 in the selected memory core as shown in FIG. 45. In this case, the MOS transistor 43 provides −1 V to the unselected word lines.

In the description of the above embodiments, the first and second global word lines are formed of metal interconnect layers of different levels. However, the global word lines may be formed of metal interconnect layers of the same level. For example, both first and second global word lines may be formed of the second metal interconnect layer.

Figure 46:
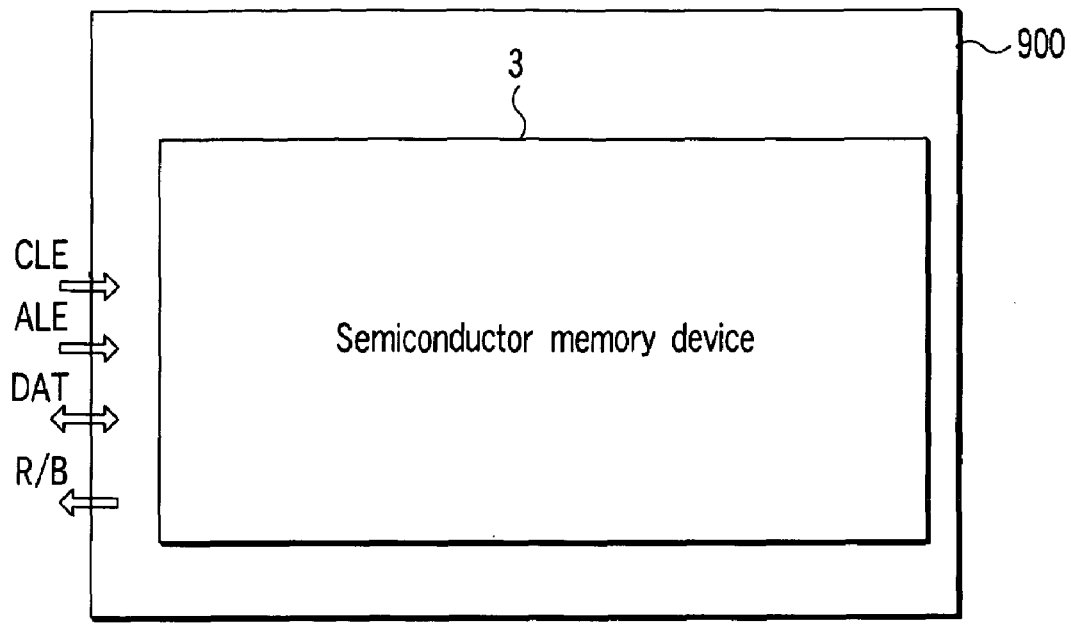
FIG. 46 is a block diagram of a memory card comprising the flash memory according to the first to fifth embodiments.

Next, an application of the flash memory will be explained. FIG. 46 shows an example of a memory card. As shown in FIG. 46, the memory card 900 includes a flash memory 3 (3Tr-NAND flash memory, NAND flash memory, or 2Tr flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 47:
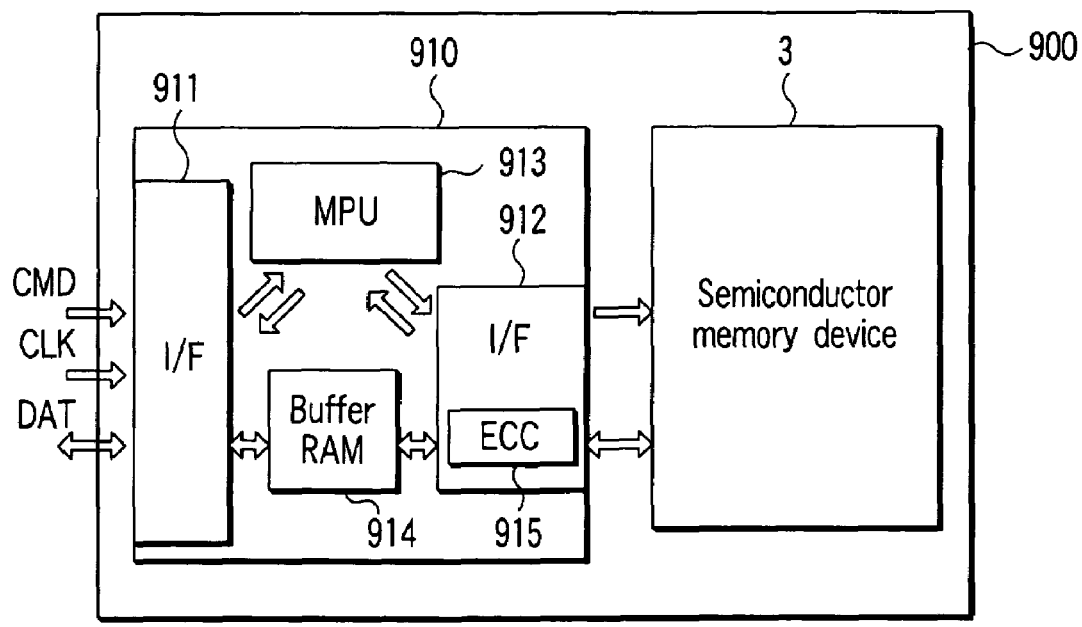
FIG. 47 is a block diagram of the memory card comprising the flash memory according to the first to fifth embodiments.

Another exemplary implementation is shown in FIG. 47. The memory card shown in FIG. 47 differs from the memory card presented in FIG. 46 in that the memory card of FIG. 47 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 48:
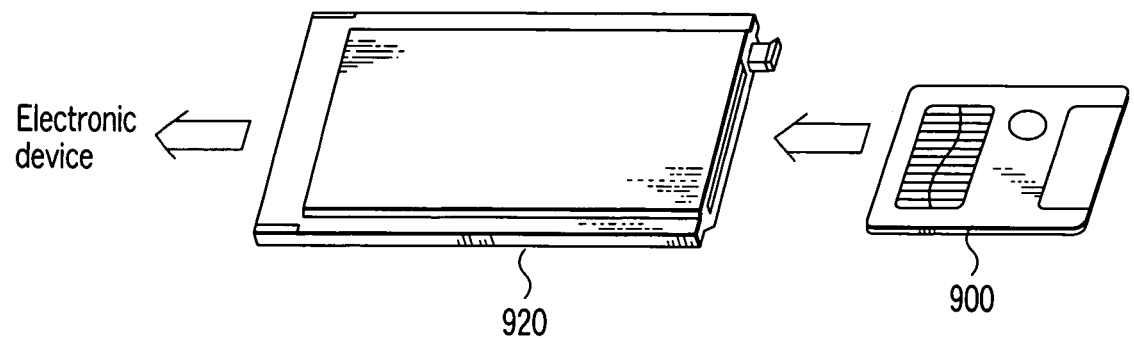
FIG. 48 is a diagram showing the appearance of the memory card comprising the flash memory according to the first to fifth embodiments as well as a card holder.

FIG. 48 shows another application. As shown in FIG. 48, the memory card 900 is inserted into a cardholder 920, which is then connected to electronic equipment (not shown). The cardholder 920 may have a part of the function of the controller 910.

Figure 49:
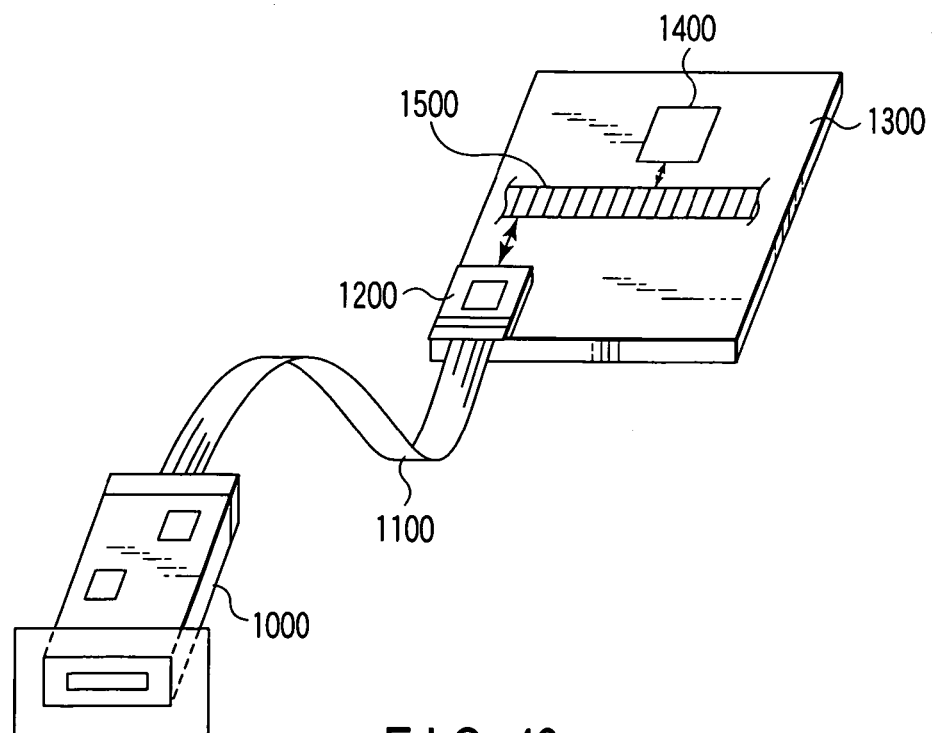
FIG. 49 is a diagram showing the appearance of a connection apparatus to which the memory card comprising the flash memory according to the first to fifth embodiments is connected.

FIG. 49 shows another application. As shown in FIG. 49, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

FIG. 50 shows another application. The memory card 900 or the cardholder 920 in which the memory card 900 has been inserted is inserted into the connection unit 1000. The connection unit 1000 is connected to a personal computer 2000 via the connection cable 1100.

Figure 52:
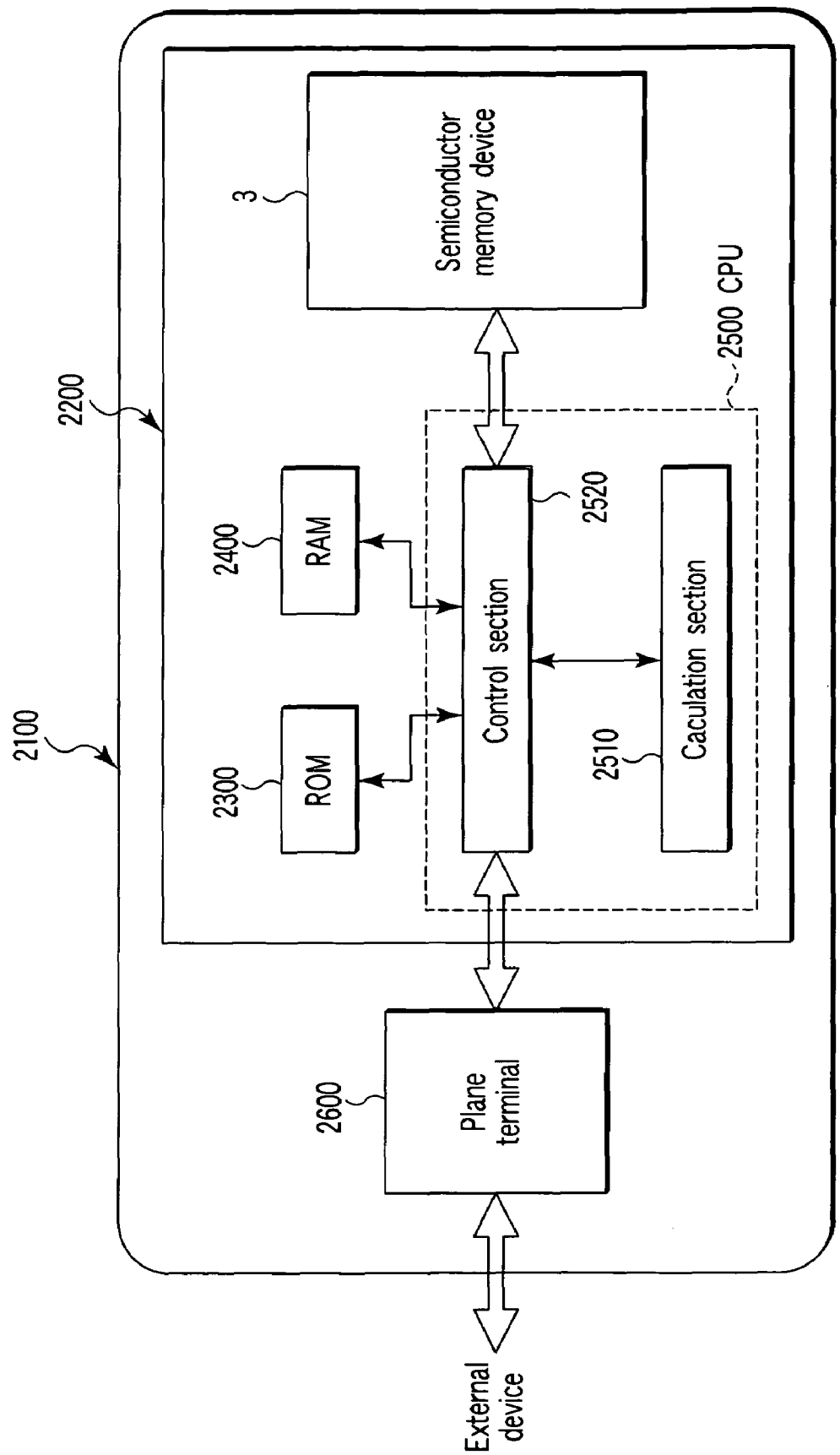
FIG. 52 is a diagram showing the appearance of an IC card comprising the flash memory according to the first to fifth embodiments.

FIGS. 51 and 52 show another application. As shown in FIGS. 51 and 52, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a plurality of memory cells each of which has a MOS transistor including a floating gate and a control gate;
    a memory cell array including the memory cells arranged in a matrix;
    word lines each of which connects commonly the control gates of the MOS transistors in the same row in the memory cell array;
    a row decoder which decodes a row address signal used to select any of the word lines;
    first MOS transistors each provided for a corresponding one of the word lines and which transfer a first voltage to the word line unselected by the row decoder, the first MOS transistor having a drain connected to the word line and a source to which the first voltage is applied; and
    second MOS transistors each provided for a corresponding one of the word lines and which transfer a second voltage to the word line selected by the row decoder, the second MOS transistor having a drain connected to the word line and a source to which the second potential is applied.

2. The device according to claim 1, wherein when an erase operation is performed on the memory cell, the row decoder unselects the word line, and
    the first MOS transistor transfers the first voltage, which is negative, to the word line.

3. The device according to claim 1, wherein when a read operation is performed on the memory cell, the first voltage is negative,
    the first MOS transistor applies the first voltage to the word line unselected by the row decoder,
    the second MOS transistor applies the second voltage to the word line selected by the tow decoder, and
    the first MOS transistor corresponding to the word line selected by the row decoder is turned off by applying the negative voltage to the first MOS transistor as a back gate bias for the first MOS transistor.

4. The device according to claim 3, wherein the back gate bias for the first MOS transistor is a voltage lower than the first voltage.

5. The device according to claim 1, wherein the row decoder includes first row decoder circuits each provided for the corresponding one of the word lines and which decode the row address signal, an output from the first row address decode circuit being 0 V or a positive voltage and being input to a gate of the first MOS transistor;

second row address decode circuits each provided for every plural word lines and which decode the row address signal; and level shift circuits each of which inverts an output from the corresponding second row address decode circuit and shifts a voltage of the output from the corresponding second row address decode circuit, an output from the level shift circuit being 0 V or a positive voltage and being input to a gate of the second MOS transistor.

6. The device according to claim 1, wherein the first and second MOS transistors are arranged adjacent to the memory cell array along the word line direction, and the first MOS transistors are arranged in a (m×n (m and n: natural numbers)) matrix, the second MOS transistors are arranged in a (m×n) matrix, one row of the first MOS transistors are arranged for every n word lines, and one row of the second MOS transistors are arranged for every n word lines.

7. A memory card comprising a semiconductor memory device recited in claim 1.

8. The card according to claim 1, further comprising a control circuit which controls the semiconductor memory device.

9. The device according to claim 1, wherein a back gate bias for the first MOS transistor is controlled independently of a potential at the source of the first MOS transistor.

10. The device according to claim 1, further comprising:
a semiconductor substrate;
a first well region which is formed in a surface region of the semiconductor substrate and on which the memory cell array is formed;
a second well region which is formed in a surface region of the semiconductor substrate and on which the first MOS transistors and the second MOS transistors are formed; and
a shallow trench isolation region which is formed in a semiconductor substrate and electrically isolates the first well region from the second well region.

11. The device according to claim 1, wherein the word lines are formed along a first direction, and gates of the first MOS transistors and the second MOS transistors are formed along a second direction orthogonal to the first direction.

12. The device according to claim 1, further comprising:
a semiconductor substrate on which the memory cell array, the first and second MOS transistors, and the row decoder are formed;
an interlayer insulating film which is formed on the semiconductor substrate and covers the memory cell array, the first and second MOS transistors, and the row decoder; and
a metal interconnect layer which transfers the result of decoding the row address signal by the row decoder to a gate of the first MOS transistor, wherein the metal interconnect layer is an interconnect layer located at the level of a second layer in the interlayer insulating film.

13. The device according to claim 1, wherein when a read operation is performed on the memory cell, a back gate of the first MOS transistor has the same electric potential as the source thereof.

14. The device according to claim 1, further comprising:
a semiconductor substrate;
a first well region which is formed in a surface region of the semiconductor substrate and on which the memory cell array is formed;
a second well region which is formed in a surface region of the semiconductor substrate and on which the row decoder, the first MOS transistors and the second MOS transistors are formed;
a shallow trench isolation region which is formed in a semiconductor substrate and electrically isolates the first well region from the second well region;
an interlayer insulating film which is formed on the semiconductor substrate and covers the memory cell array, the first and second MOS transistors, and the row decoder; and
a metal interconnect layer which transfers the result of decoding the row address signal by the row decoder to a gate of the first MOS transistor, wherein the word lines are formed along a first direction, gates of the first MOS transistors and the second MOS transistors are formed along a second direction orthogonal to the first direction, the metal interconnect layer is an interconnect layer located at the level of the second layer in the interlayer insulating film, and when a read operation is performed on the memory cell, a back gate of the first MOS transistor has the same electric potential as the source thereof.

15. A semiconductor memory device comprising:
a plurality of memory cells each of which has a MOS transistor including a floating gate and a control gate;
a first and second memory cell arrays each including the memory cells arranged in a matrix, the first and second memory cell arrays being formed on different well regions;
word lines each of which connects commonly, in each of the first and second memory cell arrays, the control gates of the MOS transistors in the same row;
switch element groups each provided for the first and second memory cell arrays; and
a row decoder which decodes a row address signal used to select any of the word lines to control the switch element groups,
the switch element group including:
first MOS transistors each provided for a corresponding one of the word lines in each of the first and second memory cell arrays and which transfer a first voltage to the word line unselected by the row decoder, the first MOS transistor having a drain connected to the word line and a source to which the first voltage is applied, a back gate bias for the first MOS transistor being controlled independently of a potential at the source of the first MOS transistor; and
second MOS transistors each provided for a corresponding one of the word lines in each of the first and second memory cell arrays and which transfer a second voltage to the word line selected by the row decoder, the second MOS transistor having a drain connected to the word line and a source to which the second potential is applied.

16. The device according to claim 15, wherein the first and second memory cell arrays comprise the same number of the word lines, and the row decoder includes:

first row address decoder circuits each provided for the corresponding one of the word lines and which decode the row address signal, an output from the first row address decode circuit being 0 V or a positive voltage and being input to a gate of the first MOS transistor;

second row address decode circuits each provided for every plural word lines to decode the row address signal;

level shift circuits each of which inverts an output from the corresponding second row address decode circuit and shifts a voltage of the output from the corresponding second address decode circuit, an output from the level shift circuit being 0 V or a positive voltage and being input to a gate of the second MOS transistor;

first global word lines each of which transfers an output from a corresponding one of the level shift circuits to all the switch element groups corresponding to the level shift circuit; and second global word lines each of which transfers an output from a corresponding one of the first row address decode circuits to all the switch element group corresponding to the first row address decode circuit.

17. The device according to claim 16, wherein when a read operation is performed on the memory cell, one of the first and second memory cell arrays is selected, and a negative voltage is provided to the selected one of the first and second memory cell arrays as the first voltage, while 0 V is provided to the unselected one of the first and second memory cell arrays as the first voltage, the first MOS transistors apply the first voltage to the word lines unselected by the row decoder in the first and second memory cell arrays, in one of the first and second memory cell arrays, the first MOS transistor corresponding to the word line selected by the row decoder applies a second voltage to the word line, and the second MOS transistor corresponding to the word line selected by the row decoder is turned off by applying a negative voltage to the second MOS transistor as a back gate bias, and in the other of the first and second memory cell arrays, both the first and second MOS transistors connected to the first and second global word lines corresponding to the selected word line are turned off.

18. The device according to claim 17, wherein the back gate bias for the first MOS transistor is a voltage lower than the first voltage.

19. The device according to claim 17, wherein when an erase operation is performed on the memory cell, one of the first and second memory cell arrays is selected and the row decoder unselects the word line, the first MOS transistors corresponding to the selected one of the first and second memory cell arrays transfer a negative voltage to the word line as the first voltage, and the first and second MOS transistors corresponding to the other of the first and second memory cell arrays are turned off.

20. The device according to claim 15, wherein the switch element group is placed adjacent to the first and second memory cell arrays along the word line direction, and the first MOS transistors are arranged in a (m×n (m and n: natural numbers)) matrix, the second MOS transistors are arranged in a (m×n) matrix, one row of the first MOS transistors are arranged for every n word lines, and one row of the second MOS transistors are arranged for every n word lines.

21. A semiconductor memory device comprising:

a plurality of memory cells each of which has a MOS transistor including a floating gate and a control gate;

a memory cell array each comprising the memory cells arranged in a matrix;

word lines each of which connects commonly the control gates of the MOS transistors in the same row in the memory cell array;

a row decoder which decodes a row address signal used to select any of the word lines, the row decoder including:

a first decode circuit which decodes the row address signal to obtain a row address decode signal; and second decode circuits each provided for a corresponding one of the word lines and which includes a first and second switch elements only one of which is turned on, the first and second switch elements transferring first and second voltages to the corresponding word lines on the basis of the row address decode signal, the second voltage being higher than the first voltage;

a block decoder which applies a voltage to the row decoder and which controls the second decode circuit such that the second switch element corresponding to the selected word line and the first switch elements corresponding to the unselected word lines are turned on, while the first switch element corresponding to the selected word line and the second switch elements corresponding to the unselected word lines are turned off;

a semiconductor substrate;

a first well region which is formed in a surface region of the semiconductor substrate and on which the memory cell array is formed;

a second well region which is formed in a surface region of the semiconductor substrate and on which the second decode circuits are formed; and a shallow trench isolation region which is formed in a semiconductor substrate and electrically isolates the first well region from the second well region.

22. The device according to claim 21, wherein the first switch element is an n-channel MOS transistor which has a drain connected to the word line, a source to which the first voltage is applied, and a gate to which the row address decode signal is input, and the second switch element is a p-channel MOS transistor which has a drain connected to the word line, a source to which the second voltage is applied, and a gate which is controlled on the basis of the row address decode signal.

23. The device according to claim 22, wherein when an erase operation is performed on the memory cell, the row decoder unselects the word line, the block decoder supplies the first voltage which is negative; and the n-channel MOS transistor transfers the first voltage to the word line.

24. The device according to claim 22, wherein the block decoder controls the back gate bias for the n-channel MOS transistor and the first voltage.

25. The device according to claim 22, wherein the word lines are formed along a first direction, and the gates of the n-channel MOS transistor and the p-channel MOS transistor are formed along a second direction orthogonal to the first direction.

26. The device according to claim 22, further comprising:
an interlayer insulating film which is formed on the semiconductor substrate and covers the memory cell array and the row decoder; and
a metal interconnect layer which transfers the row address decode signal to the gate of the n-channel MOS transistors,
wherein the metal interconnect layer is an interconnect layer located at the level of the second layer in the interlayer insulating film.

27. The device according to claim 22, wherein when a read operation is performed on the memory cell, a back gate of the n-channel MOS transistor has the same electric potential as the source thereof.

28. The device according to claim 22, further comprising:
an interlayer insulating film which is formed on the semiconductor substrate and covers the memory cell array and the row decoder; and
a metal interconnect layer which transfers the row address decode signal to the gate of the n-channel MOS transistor,
wherein the word lines are formed along a first direction,
the gates of the n-channel MOS transistor and the p-channel MOS transistor are formed along a second direction orthogonal to the first direction,
the metal interconnect layer is an interconnect layer located at the level of the second layer in the interlayer insulating film, and
when a read operation is performed on the memory cell, a back gate of the n-channel MOS transistor has the same electric potential as the source thereof.

29. A semiconductor memory device comprising:
a plurality of memory cells each of which has a MOS transistor including a floating gate and a control gate;
a memory cell array including the memory cells arranged in a matrix;
word lines each of which connects commonly the control gates of the MOS transistors in same row in the memory cell array;
a row decoder which decodes a row address signal used to select any of the word lines;
n-channel MOS transistors each provided for a corresponding one of the word lines and which transfer a first voltage to the word line unselected by the row decoder, the n-channel MOS transistor having a drain connected to the word line and a source to which the first voltage is applied;
p-channel MOS transistors each provided for a corresponding one of the word lines and which transfer a second voltage to the word line selected by the row decoder, the p-channel MOS transistor having a drain connected to the word line and a source to which the second potential is applied; and
a block decoder which supplies the first and second voltages and a back gate bias for the n-channel MOS transistor and which independently controls the back gate bias for the first MOS transistor and the first voltage, the first voltage being equal to or higher than the back gate bias.

30. The device according to claim 29, wherein when an erase operation is performed on the memory cell, the row decoder unselects the word lines,
the block decoder supplies the first voltage which is negative; and
the n-channel MOS transistor transfers the first voltage to the word line.

* * * * *